United States Patent
Saito et al.

(10) Patent No.: US 10,703,070 B2
(45) Date of Patent: Jul. 7, 2020

(54) RESIN COMPOSITE FILM INCLUDING CELLULOSE MICROFIBER LAYER

(71) Applicant: Asahi Kasei Kabushiki Kaisha, Tokyo (JP)

(72) Inventors: Yamato Saito, Tokyo (JP); Masayuki Nakatani, Tokyo (JP); Hiroko Kawaji, Tokyo (JP); Yoko Fujimoto, Tokyo (JP); Hirofumi Ono, Tokyo (JP); Kazufumi Kawahara, Tokyo (JP)

(73) Assignee: Asahi Kasei Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/089,508

(22) PCT Filed: Mar. 29, 2017

(86) PCT No.: PCT/JP2017/013086
§ 371 (c)(1),
(2) Date: Sep. 28, 2018

(87) PCT Pub. No.: WO2017/170781
PCT Pub. Date: Oct. 5, 2017

(65) Prior Publication Data
US 2019/0118508 A1  Apr. 25, 2019

(30) Foreign Application Priority Data

Mar. 30, 2016 (JP) ................. 2016-069806
Mar. 30, 2016 (JP) ................. 2016-069807
Mar. 30, 2016 (JP) ................. 2016-069808
Mar. 30, 2016 (JP) ................. 2016-069810

(51) Int. Cl.
| B32B 5/28 | (2006.01) |
| C08J 5/24 | (2006.01) |
| H04R 7/02 | (2006.01) |
| H05K 1/03 | (2006.01) |
| B32B 27/00 | (2006.01) |
| C08K 7/02 | (2006.01) |
| C08L 1/02 | (2006.01) |

(52) U.S. Cl.
CPC ............... *B32B 5/28* (2013.01); *B32B 27/00* (2013.01); *C08J 5/24* (2013.01); *H04R 7/02* (2013.01); *H05K 1/03* (2013.01); *H05K 1/036* (2013.01); *C08K 7/02* (2013.01); *C08L 1/02* (2013.01)

(58) Field of Classification Search
None
See application file for complete search history.

(56) References Cited

U.S. PATENT DOCUMENTS

| 2009/0054552 A1 | 2/2009 | Yano et al. |
| 2013/0025920 A1* | 1/2013 | Shimizu ................. C08J 3/09 |
| | | 174/258 |
| 2017/0283565 A1 | 10/2017 | Ono et al. |

FOREIGN PATENT DOCUMENTS

| JP | S60-083826 A | 5/1985 |
| JP | H02-127593 A | 5/1990 |
| JP | H02-0276624 A | 11/1990 |
| JP | 2006-316253 A | 11/2006 |
| JP | 2012-025833 A | 2/2012 |
| JP | 2012-119470 | 6/2012 |
| JP | 2015-017184 A | 1/2015 |
| WO | 2006/082803 A1 | 8/2006 |
| WO | 2016/047764 A1 | 3/2016 |

OTHER PUBLICATIONS

Saito et al., "Homogeneous Suspensions of Individualized Microfibrils from TEMPO-Catalyzed Oxidation of Native Cellulose," Biomacromolecule, 7: 1687-1691 (2006).
Brandrup ed., Polymer Handbook, 3: V-153-V-155 (1989).
Shimada, "Extracellular polysaccharides which *Enterobacter* sp. produces under anaerobic condition," Vivaorigino, 23: 52-53 (1995) (see partial translation).
International Search Report issued in corresponding International Patent Application No. PCT/JP2017/013086 dated Jul. 4, 2017.
International Preliminary Report on Patentability and Written Opinion issued in corresponding International Patent Application No. PCT/JP2017/013086 dated Oct. 2, 2018.
Supplemental European Search Report issued in corresponding European Patent Application No. 17775315.9 dated Mar. 29, 2019.

* cited by examiner

*Primary Examiner* — Dale R Miller
(74) *Attorney, Agent, or Firm* — Morgan, Lewis & Bockius LLP

(57) ABSTRACT

A resin composite film comprising a cellulose microfiber sheet and a resin, the resin composite film satisfying the following: (1) in a modulus mapping obtained by an examination of a cross-section with an AFM along the thickness direction, the fibers constituting the cellulose microfiber sheet have an average fiber diameter and a maximum fiber diameter, both calculated through image analysis, of 0.01-2.0 μm and 15 μm or smaller, respectively; and (2) at least one surface of the resin composite film has an overcoat resin layer having an average thickness, determined from the modulus mapping, of 0.3-100 μm.

16 Claims, 2 Drawing Sheets

RESIN COMPOSITE FILM INCLUDING CELLULOSE MICROFIBER LAYER

FIELD

The present invention relates to a resin composite film including a cellulose microfiber sheet and a resin, as well as a resin laminate film, a resin composite film-laminated sheet, a multilayer printed circuit board, a semiconductor package board and a communication terminal that employ the same.

BACKGROUND

Fiber-reinforced plastics (FRP) have been attracting interest in recent years as lightweight, high-strength materials for various industrial fields. Fiber-reinforced composite materials comprising reinforcing fibers such as glass fibers, carbon fibers and aramid fibers in a matrix resin have lighter weights than rival metals, while also exhibiting excellent dynamic properties such as strength and elastic modulus, and they are therefore being employed in numerous fields such as aircraft members, spacecraft members, automobile members, ship members, civil engineering construction materials, and sports goods. In particular, carbon fibers, which have excellent specific strength and specific elastic modulus, are commonly used as reinforcing fibers for purposes in which high performance is required. Thermosetting resins such as unsaturated polyester resins, vinyl ester resins, epoxy resins, phenol resins, cyanate ester resins and bismaleimide resins are widely used as matrix resins, among them epoxy resins are commonly used because of their excellent adhesion with carbon fibers. Recently, a vacuum impregnation molding method (Vacuum assist Resin Transfer Molding: VaRTM) in which fiber-reinforced plastics are molded under reduced pressure conditions with vacuum suction, is being employed for low-cost production of relatively large fiber-reinforced plastic molded articles (see PTL 1 listed below, for example).

Such techniques are suitable for increasing the heat resistance and strength of resins, but the application of such techniques has been difficult because, for instance, it has not been possible to reduce the fiber diameters of the fibers themselves in order to achieve the size and thickness reduction of electronic materials needed to conform to recent trends toward increased functionality in the field of electronic devices. Moreover, electronic components must exhibit properties such as excellent low thermal expansion and low warping properties, in order to adapt to the reduced rigidity of substrates that is a consequence of their smaller thicknesses, and low dimensional deformation or warping when parts are connected to metal-clad laminates or printed circuit boards by solder reflow.

In addition, the mounting of such electronic components in vehicles is accelerating, and there is a demand for circuit boards with superior properties that can withstand use in extreme weather and high-humidity environments. PTL 2 describes an effect allowing provision of a circuit board that is lightweight and resistant to cracking, with minimal generation of CAF (Conductive Anodic Filaments) and smearing during the via hole-forming step, as well as a low filler filling factor and low linear expansion. It is a goal to ensure an excellent embedding property with greater moisture proofness, and to maintain embedded flatness and increase thermal shock resistance, when electrodes are embedded in resin composite films, to a level exceeding that of conventional electronic components as described in PTL 2, in particular with suitability for on-vehicle purposes.

CITATION LIST

Patent Literature

[PTL 1] Japanese Unexamined Patent Publication No. 1985(S60)-83826
[PTL 2] Japanese Unexamined Patent Publication No. 2012-119470

SUMMARY

Technical Problem

In light of the circumstances described above, it is an object of the present invention to provide a resin composite film that is excellent in terms of its electrode embedding property, flatness during embedding of electrodes, and thermal shock resistance.

Solution to Problem

The present inventors have completed this invention upon finding that the problem described above can be solved by controlling, based on AFM measurement of a resin composite film including a cellulose microfiber sheet and a resin, the fiber diameters of the fibers composing the cellulose microfiber sheet, the thickness of the overcoat resin layer, and the coefficient of linear thermal expansion.

Specifically, the present invention provides the following.

[1]
A resin composite film comprising a cellulose microfiber sheet and a resin, wherein the resin composite film satisfies the following conditions:
(1) in modulus mapping obtained by AFM measurement of a cross-section in the thickness direction, the fibers constituting the cellulose microfiber sheet have an average fiber diameter of 0.01 μm to 2.0 μm and a maximum fiber diameter of 15 μm or smaller, as calculated from image analysis; and
(2) the average thickness of an overcoat resin layer on at least one side of the resin composite film, as observed by modulus mapping, is 0.3 μm to 100 μm.

[2]
The resin composite film according to [1], wherein the average thickness of the overcoat resin layer on at least one side of the resin composite film is 0.3 μm to 10 μm.

[3]
The resin composite film according to [1], which further satisfies the following conditions:
(2) the average thickness of the overcoat resin layer on at least one side of the resin composite film, as calculated by modulus mapping, is 0.8 μm to 30 μm; and
(3) the surface roughness of the resin composite film is 0.1 μm to 2.0 μm.

[4]
The resin composite film according to [3], wherein the surface roughness is 0.3 μm to 1.2

[5]
The resin composite film according to [1], which further satisfies the following conditions:
(2) the average thickness of the overcoat resin layer on at least one side of the resin composite film, as calculated by modulus mapping, is 0.3 μm to 30 μm;

(3) the coefficient of linear thermal expansion on the X-Y plane at 200° C. (CTE200) is 100 ppm/° C. or smaller; and (4) the absolute value of the difference between the coefficient of linear thermal expansion on the X-Y plane at 150° C. (CTE150) and the coefficient of linear thermal expansion on the X-Y plane at 200° C. (CTE200) is 40 or smaller.

[6]

The resin composite film according to [5], wherein the (CTE200) is 60 ppm/° C. or smaller.

[7]

The resin composite film according to any one of [1] to [6], wherein in image analysis of the modulus mapping, the fibers constituting the cellulose microfiber sheet occupy an area ratio of 5% to 60% of the entire cross-section of the resin composite film.

[8]

The resin composite film according to any one of [1] to [7], which includes an inorganic filler.

[9]

The resin composite film according to [8], wherein in SEM observation of a cross-section in the thickness direction, the inorganic filler occupies an area ratio of 5% to 50% of the entire cross-section of the resin composite film.

[10]

The resin composite film according to [8] or [9], wherein in image analysis of the modulus mapping, the inorganic filler occupies an area ratio of 5% to 50% of the entire cross-section of the resin composite film.

[11]

The resin composite film according to any one of [8] to [10], wherein in image analysis of the modulus mapping, no more than 20% of the inorganic filler is included in the cellulose microfiber layer.

[12]

The resin composite film according to any one of [1] to [11], wherein the total light transmittance is 80% or higher.

[13]

The resin composite film according to any one of [1] to [12], wherein the cellulose microfiber sheet includes microfibers composed of an organic polymer other than cellulose, at less than 70 weight %.

[14]

The resin composite film according to [13], wherein the microfibers composed of an organic polymer other than cellulose are aramid microfibers and/or polyacrylonitrile microfibers.

[15]

The resin composite film according to [14], which also has an average fiber diameter of 0.01 μm to 2.0 μm and a maximum fiber diameter of 15 μm or smaller, as calculated from image analysis of the modulus mapping.

[16]

The resin composite film according to any one of [1] to [15], which has a thickness of 5 μm to 1500 μm.

[17]

The resin composite film according to any one of [1] to [16], which has a moisture absorption ratio of 2% or lower.

[18]

The resin composite film according to any one of [1] to [17], which has a dielectric constant of 4.5 or lower.

[19]

The resin composite film according to any one of [1] to [18], wherein the resin in the resin composite film is thermosetting or photocurable.

[20]

A resin laminate film, wherein a resin composite film according to any one of [1] to [19] is laminated on a substrate.

[21]

A resin composite film-laminated sheet, wherein a plurality of resin composite films according to any one of [1] to [19] are laminated.

[22]

A multilayer printed circuit board that includes a resin composite film-laminated sheet according to [21].

[23]

A semiconductor package board that includes a multilayer printed circuit board according to [22].

[24]

A communication terminal that includes a semiconductor package board according to [23].

[25]

A resin composite film-laminated sheet in which a plurality of resin composite films comprising a cellulose microfiber sheet and a resin are laminated, wherein the resin composite film-laminated sheet satisfies the following conditions:

(1) in modulus mapping obtained by AFM measurement of a cross-section of the resin composite film-laminated sheet in the thickness direction, the fibers constituting the cellulose microfiber sheet have an average fiber diameter of 0.01 μm to 2.0 μm and a maximum fiber diameter of 15 μm or smaller, as calculated from image analysis;

(2) the average thickness of an overcoat resin layer on at least one side of the resin composite film, as calculated by the modulus mapping, is 0.8 μm to 30 μm, and (3) the surface roughness of the resin composite film-laminated sheet is 0.1 μm to 2.0 μm.

[26]

The resin composite film-laminated sheet according to [25], wherein the surface roughness is 0.2 μm to 1.2 μm.

[27]

A multilayer printed circuit board that includes a resin composite film-laminated sheet according to [26].

[28]

A semiconductor package board that includes a multilayer printed circuit board according to [27].

[29]

A communication terminal including a semiconductor package board according to [28].

[30]

A resin composite film comprising cellulose microfibers in a matrix resin, wherein the resin composite film satisfies the following conditions:

(1) in modulus mapping obtained by atomic force microscope (AFM) measurement of a cross-section of the resin composite film in the thickness direction, the cellulose microfibers have an average fiber diameter of 0.01 μm to 2.0 μm and a maximum fiber diameter of 15 μm or smaller, as calculated from image analysis;

(2) the resin composite film either has a glass transition temperature (Tg) of 80° C. or higher, or has none;

(3) the storage elastic modulus of the resin composite film at 200° C. (E'200) is 0.5 GPa or greater; and (4) the ratio (E'150/E'200) of the storage elastic modulus of the resin composite film at 150° C. (E'150) with respect to the storage elastic modulus at 200° C. (E'200) is 1 to 4.5.

[31]

The resin composite film according to [30], wherein the storage elastic modulus at 200° C. (E'200) is 0.7 GPa or greater.

[32]
The resin composite film according to [30] or [31], wherein the area ratio of the cellulose microfibers with respect to the entire cross-section of the resin composite film is 5% to 60%, as calculated from image analysis in the modulus mapping.

[33]
The resin composite film according to any one of [30] to [32], which further satisfies the following conditions:
(5) the coefficient of linear thermal expansion on the X-Y plane at 200° C. (CTE200) is 100 ppm/° C. or smaller; and
(6) the absolute value of the difference between the coefficient of linear thermal expansion on the X-Y plane at 150° C. (CTE150) and the coefficient of linear thermal expansion on the X-Y plane at 200° C. (CTE200) is 40 or smaller.

[34]
The resin composite film according to any one of [30] to [33], wherein the average thickness of the overcoat resin layer of the resin composite film on at least one side of the resin composite film is 0.3 μm to 30 μm, as calculated by the modulus mapping.

[35]
The resin composite film according to [34], which further includes an inorganic filler.

[36]
The resin composite film according to [35], wherein in scanning electron microscope (SEM) observation of a cross-section of the resin composite film in the thickness direction, the area ratio of the inorganic filler with respect to the entire cross-section of the resin composite film is 5% to 50%.

[37]
The resin composite film according to [35] or [36], wherein in image analysis of the modulus mapping, no more than 20% of the inorganic filler is included in the cellulose microfiber layer.

[38]
The resin composite film according to any one of [30] to [37], wherein the total light transmittance is 80% or higher.

[39]
The resin composite film according to any one of [30] to [38], which further includes microfibers composed of an organic polymer other than cellulose, at less than 70 wt %.

[40]
The resin composite film according to [39], wherein the microfibers composed of an organic polymer are aramid microfibers and/or polyacrylonitrile microfibers.

[41]
The resin composite film according to any one of [30] to [40], wherein the matrix resin is thermosetting or photocurable.

[42]
The resin composite film according to any one of [30] to [41], which has a thickness of 5 μm to 1500 μm.

[43]
The resin composite film according to [42], which has a thickness of 5 μm to 200 μm.

[44]
The resin composite film according to any one of [30] to [43], which has a moisture absorption ratio of 2% or lower.

[45]
The resin composite film according to any one of [30] to [44], which has a dielectric constant of 4.5 or lower.

[46]
A resin laminate film, wherein a resin composite film according to any one of [30] to [45] is laminated on a substrate.

[47]
A laminated sheet, wherein a plurality of resin composite films according to any one of [30] to [45] are laminated.

[48]
A multilayer printed circuit board that includes a laminated sheet according to [47].

[49]
A semiconductor package board comprising a semiconductor mounted on a multilayer printed circuit board according to [48].

[50]
A communication terminal that includes a semiconductor package board according to [49].

[51]
A speaker diaphragm that includes a resin composite film according to any one of [30] to [45].

Advantageous Effects of Invention

With the resin composite film of the invention, it is possible to provide a resin composite film that can ensure embeddability in regions where electrodes are to be embedded in the resin composite film, and that can maintain embedded flatness while increasing thermal shock resistance.

DESCRIPTION OF EMBODIMENTS

Figure 1:
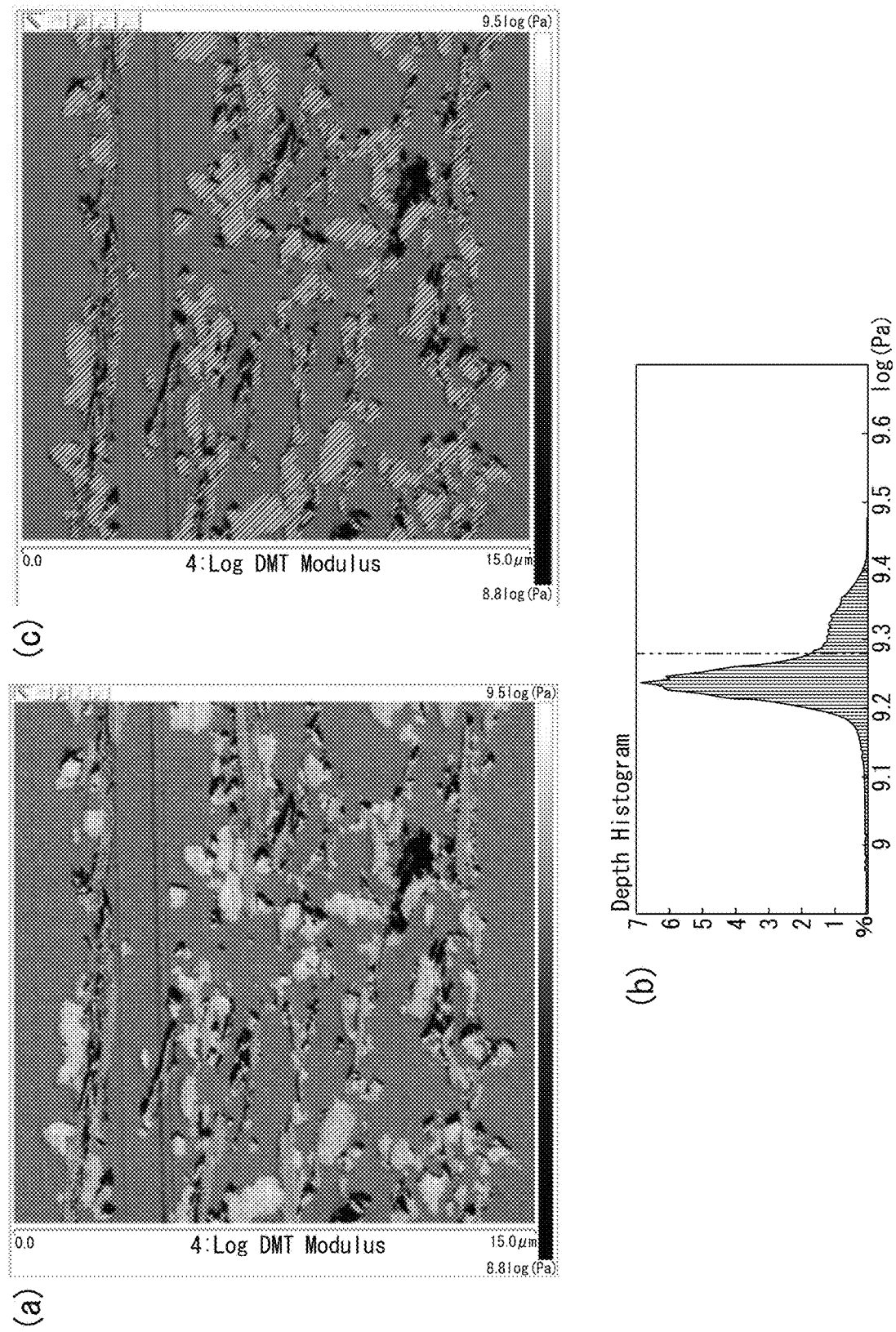
FIG. 1(a) is an AFM modulus mapping image of the resin composite film obtained in Example 1 for embodiments I to IV.
FIG. 1(b) is an elastic modulus histogram of the AFM modulus mapping image of FIG. 1(a)
FIG. 1(c) is a binarized image of the AFM modulus mapping image of FIG. 1(a).

An embodiment for carrying out the invention (hereunder referred to as "this embodiment") will now be explained in detail. It is to be understood, incidentally, that the invention is not limited to the embodiment described below and may incorporate various modifications within the scope of the gist thereof.

<<Resin Composite Film>>

The resin composite film of this embodiment is a resin composite film including a cellulose microfiber sheet and a resin, and satisfying the following conditions:
(1) in modulus mapping obtained by AFM measurement of a cross-section in the thickness direction, the fibers constituting the cellulose microfiber sheet have an average fiber diameter of 0.01 μm to 2.0 μm and a maximum fiber diameter of 15 μm or smaller, as calculated from image analysis; and
(2) the average thickness of an overcoat resin layer on at least one side of the resin composite film, as observed by modulus mapping, is 0.3 μm to 100 μm.

With the resin composite film of this embodiment, having excellent low linear thermal expansion by including a cellulose microfiber sheet and a resin, and comprising a resin layer of 0.3 μm to 100 μm on at least one side of the resin composite film (referred to herein as "overcoat resin layer"), it is possible to provide a resin composite film that can ensure embeddability in regions where electrodes are to be embedded in the resin composite film, and that can maintain embedded flatness while increasing thermal shock resistance.

<Cellulose Microfiber Sheet>

The cellulose microfiber sheet used for this embodiment (hereunder also referred to simply as "fiber sheet") is composed of cellulose microfibers. Optionally, the fiber sheet may also include microfibers made of an organic polymer other than cellulose.

The cellulose may be natural cellulose or regenerated cellulose.

Natural cellulose that is used may be either wood pulp such as conifer pulp or broadleaf tree pulp or nonwood pulp, and this includes wood pulp obtained from broadleaf tree or conifer, refined linter, or refined pulp from various plant varieties (bamboo, hemp fiber, bagasse, kenaf, linter and the like). Nonwood pulp may be cotton pulp containing cotton linter pulp, hemp pulp, bagasse pulp, kenaf pulp, bamboo pulp or straw pulp. Cotton pulp, hemp pulp, bagasse pulp, kenaf pulp, bamboo pulp and straw pulp are the refined pulp obtained from the respective starting materials of cotton lint, cotton linter, hemp abaca (usually from Ecuador or the Philippines), sisal, bagasse, kenaf, bamboo and straw, by refining steps such as delignification by digestion treatment, or bleaching steps. Refined products from sea weed cellulose or sea squirt cellulose may be used as well. Microfiber aggregates that have never been dried, such as bacterial cellulose (BC) produced by cellulose-producing bacteria, may also be mentioned.

Regenerated cellulose is a substance obtained by regenerating natural cellulose by dissolution or crystal swelling (mercerizing) treatment, and it refers to β-1,4 bonded glucan (glucose polymer) having a molecular arrangement that yields a crystal diffraction pattern (type II cellulose crystal) with apices at diffraction angles corresponding to lattice spacings of 0.73 nm, 0.44 nm and 0.40 nm, in particle beam diffraction. Regenerated cellulose also means that, in an X-ray diffraction pattern, the X-ray diffraction pattern with a 2θ range of 0° to 30° has one peak at 10°≤2θ<19° and two peaks at 19°≤2θ≤30°, which may be regenerated cellulose fibers such as rayon, cupra or Tencel®, for example. From the viewpoint of easier micronization, it is preferred to use micronized fibers prepared from a starting material of cupra or Tencel® having high molecular orientation in the fiber axis direction. Cut filaments of regenerated cellulose fibers or cut filaments of cellulose derivative fibers may also be used.

The number-average fiber diameter of the cellulose microfibers is preferably 0.01 μm to 2.0 μm, more preferably 0.02 μm to 1.5 μm and even more preferably 0.02 μm to 1.0 μm. It is preferred if the number-average fiber diameter of the cellulose microfibers is 0.01 μm or greater, because the fiber sheet will have pores with suitably large diameters, the resin will be easily impregnated, and the thermal stability of the resin composite film will be increased.

If the number-average fiber diameter of the cellulose microfibers is no larger than 2.0 μm, the number of cellulose microfibers per unit weight of the cellulose microfiber sheet will be extremely large, the number of confounded points between the microfibers will increase, and a hydrogen bonded network will be easily formed between the microfibers. This is preferred because, during compositing with the resin, the effect will maintain confounding of the microfibers and the hydrogen bonded network between the microfibers even in the resin and will contribute to thermal stabilization. If the number-average fiber diameter is no larger than 2.0 μm, irregularities in the fiber sheet surface will be minimized, and the pore size distribution will be lower. In other words, since dispersion of pores with large diameters can be minimized, it is possible to provide a thin sheet with excellent homogeneity.

The maximum fiber diameter of the cellulose microfibers is preferably 15 μm or smaller, more preferably 10 μm or smaller, even more preferably 5 μm or smaller and most preferably 3 μm or smaller. It is preferred if the maximum fiber diameter of 15 μm or smaller, because the thickness of the fiber sheet can be reduced, and the homogeneity of diameter can be easily ensured when producing a thin resin composite film.

If the number-average fiber diameter of the cellulose microfibers is within the range specified above, it will be possible to provide a fiber sheet with a uniform thickness distribution.

In addition, by controlling the number-average fiber diameter of the cellulose microfiber sheet to 0.10 μm or smaller, the design may be to a total light transmittance of 80% or higher when it is used as a resin composite film. The method of control is not particularly restricted, but it may be a method using a TEMPO oxidation catalyst as described below, or a method of adjustment by fibrillation treatment or micronization treatment. Design to a total light transmittance of 80% or higher is useful for a clear film, while design to a total light transmittance of 90% or higher is more preferred. The method of measuring the total light transmittance may be measurement by an optical transparency test based on ASTM D1003, using an NDH7000SP CU2II (product name) haze meter (Nippon Denshoku Industries Co., Ltd.).

The number-average fiber diameter will now be explained. First, 10 random locations on the surface of a structure composed of cellulose microfibers are observed with a scanning electron microscope (SEM) at a magnification corresponding to 1,000× to 100,000×, according to the fiber diameters of the microfibers. A line is drawn on the obtained SEM image in the direction perpendicular to the horizontal direction of the image plane, the diameters of fibers intersecting the line are measured from the magnified image, and the number of intersecting fibers and the diameters of the fibers are counted. The number-average fiber diameter is calculated using these measurement results with a horizontal/vertical system in each image. The number-average fiber diameter is calculated in the same manner for two more extracted SEM images, and the results for a total of 10 images are averaged to obtain the average fiber diameter for the sample being measured. A multilayer structure obtained by layering onto a nonwoven fabric or the like is observed by SEM from the cellulose microfiber sheet side.

The number-average fiber diameter and maximum fiber diameter of the cellulose microfibers are measured by the method described in the Examples below.

A maximum fiber thickness of 15 μm or smaller means that, in electron microscope (SEM) observation at a magnification corresponding to 1,000× to 100,000× at 10 arbitrary locations on the fiber sheet surface during measurement of the number-average fiber diameter mentioned above, the fiber diameters of all intertwining fibers in the obtained image are 15 μm or smaller. However, fibers (bundles) that can be clearly confirmed in the image to have fiber diameters of 15 μm or larger by bundling of numerous fibers are not considered to be fibers having fiber diameters of 15 μm and larger.

When it can be clearly confirmed in the image that the fiber diameters of 15 μm or larger are those by bundling of numerous fibers, these are not considered to be fibers having fiber diameters of 15 μm and larger.

Moreover, cellulose fibers having maximum fiber diameters of larger than 2 μm and 15 μm or smaller may be blended with the cellulose microfibers, or cellulose fibers having maximum fiber diameters of larger than 2 μm and 15 μm or smaller may be residually present after micronization. The content of cellulose fibers with maximum fiber diameters of larger than 2 μm and 15 μm or smaller is preferably greater than 0% and no greater than 30%, and more preferably no greater than 20%. If the content is greater than 0% and no greater than 30%, the surface area and confounded points of the cellulose microfibers will be relatively increased and a hydrogen bonded network will be formed between the cellulose microfibers, which is effective for the coefficient of linear thermal expansion.

The method for reducing the maximum fiber diameter is not restricted, and the means adopted may be increasing the treatment time or frequency of the fibrillation treatment or micronization treatment described below.

The content of the maximum fiber diameter is an area ratio calculated by the following steps (1) to (5).

(1) A CNF sheet with a basis weight of 10 g/m$^2$ and 20 cm-square is subjected to calendering treatment (model: H2TEM300 by Yuri Roll Machine Co., Ltd.) at 3 t/30 cm and a speed of 2 m/min.

(2) Optical microscope observation: Nine arbitrary points in the fiber sheet are observed with an optical microscope at 100× magnification.

(3) Thick fiber amount evaluation: From the results of the 100× optical microscope observation of 9 points, a 2 mm-square frame line is drawn as the actual dimensions onto the image of each of the 9 points.

(4) The area of cellulose fibers with fiber diameters of 3 μm to 15 μm, confirmed within the frame line, is calculated using image analysis software (imageJ).

(5) The area/4 mm$^2$ is calculated.

The content of cellulose microfibers in the fiber sheet is not particularly restricted but is preferably 30 wt % or greater. It is more preferably 40 wt % and even more preferably 50 wt % or greater. By including cellulose microfibers at 30 wt % or greater, the number of confounded points of the cellulose microfibers will be greater than in a common fiber sheet, thus allowing the thermal stability (coefficient of linear thermal expansion) to be increased when compositing with a resin.

The fiber sheet can be obtained by working the cellulose microfibers into a sheet, as explained above, and from the viewpoint of processability and functionality, the thickness after working into a sheet is preferably 2 μm to 1000 μm. For measurement of the thickness, a surface contact-type film thickness meter such as a film thickness meter (Model ID-C112XB) by Mitutoyo Co. is used, cutting out a 10.0 cm×10.0 cm square piece from the fiber sheet, and recording the average value for 5 measured points at different locations as the thickness T (μm). Also, the basis weight $W_0$ (g/m$^2$) of the film can be calculated using the following formula:

$$W_0 = 100 \times W$$

from the thickness T (μm) of the 10.0 cm×10.0 cm square piece cut out for measurement of the thickness, and the weight W (g).

The thickness of the fiber sheet is more preferably 2 μm to 1000 μm, even more preferably 5 μm to 500 μm and most preferably 5 μm to 100 μm. If the film thickness is within this range it will be possible to minimize the thickness during fabrication of a resin composite film, which is effective in terms of lightweightness and compactness.

The basis weight of the fiber sheet is 1 g/m$^2$ to 200 g/m$^2$, preferably 3 g/m$^2$ to 150 g/m$^2$ and more preferably 4 g/m$^2$ to 100 g/m$^2$. A basis weight of 1 g/m$^2$ or greater is preferred from the viewpoint of handling during the steps of assembly to various devices. The basis weight is also preferably no greater than 200 g/m$^2$ from the viewpoint of film thickness control.

The basis weight of the cellulose microfibers is preferably 1 g/m$^2$ to 50 g/m$^2$, more preferably 3 g/m$^2$ to 40 g/m$^2$ and even more preferably 4 g/m$^2$ to 30 g/m$^2$. A basis weight of 1 g/m$^2$ or greater is preferred from the viewpoint of handling during the steps of assembly to various devices. The basis weight is also preferably no greater than 50 g/m$^2$ from the viewpoint of film thickness control.

The void percentage of the fiber sheet is preferably 35% to 95% and more preferably 40% to 90%. The upper limit is even more preferably 80% and most preferably no greater than 50%. A void percentage of 35% or higher is preferred because it will facilitate impregnation of the resin. A void percentage of no greater than 95% is preferred from the viewpoint of handleability of the sheet, and increased heat resistance of the composite film comprising the fiber sheet and resin.

The air permeability resistance of the fiber sheet is preferably 1 sec/100 ml or greater and no greater than 400,000 sec/100 ml, more preferably no greater than 100,000 sec/100 ml and even more preferably no greater than 20,000 sec/100 ml. The air permeability resistance is the numerical value measured based on the Gurley tester method of JIS P 8117. The air permeability resistance is in the range of more preferably 2 sec/100 ml or greater and even more preferably 5 sec/100 ml or greater. In a fiber sheet having an air permeability resistance of 1 sec/100 ml or greater, it will be possible to produce a homogeneous fiber sheet composed of microfibers and having fewer defects, which is preferred from the viewpoint of strength when the fiber sheet is used as a resin composite film. It is preferred if the air permeability resistance is no greater than 400,000 sec/100 ml, because the void percentage will be maintained, and therefore the resin impregnability will be satisfactory, and the thermal stability will be excellent, when the fiber sheet is used as a resin composite film.

(Microfibers Comprising Organic Polymer Other than Cellulose)

The fiber sheet may also include microfibers made of an organic polymer other than cellulose, in addition to the cellulose microfibers. If the fiber sheet includes an organic polymer other than cellulose, then when a sheet is formed by a paper-making method using a cellulose microfiber slurry, or by a coating method, it will be possible to minimize contraction of the fiber sheet during drying and to maintain the pores and their diameters in the fiber sheet. Therefore, impregnation of the resin and compositing will be facilitated, during compositing of the fiber sheet and resin. The content of microfibers made of an organic polymer other than cellulose in the fiber sheet is preferably less than 70 wt %, more preferably less than 60 wt % and even more preferably less than 50 wt %. The organic polymer may be any organic polymer that can produce microfibers, examples of which include aromatic and aliphatic polyesters, nylon, polyacrylonitrile, cellulose acetate, polyurethane, polyethylene, polypropylene, polyketone, aromatic polyamides, polyimides, and natural organic polymers other than cellulose such as silk and wool. The microfibers made of an organic polymer include, but are not limited to, microfibers that are organic fibers that have been highly fibrillated or micronized by micronization treatment by beating or a high-pressure homogenizer, microfibers obtained by electrospinning using different polymers as starting materials, and microfibers obtained by melt-blown methods using different polymers as starting materials. Particularly preferred among these are polyacrylonitrile microfibers, and aramid microfibers that are aramid (total aromatic polyamide) fibers micronized with a high-pressure homogenizer, because they have high heat resistance and high chemical stability. The maximum fiber diameter of such organic polymers is preferably 15 μm or smaller. It is preferred if the maximum fiber diameter is 15 μm or smaller, because the thickness of the fiber sheet can be reduced, and the homogeneity of diameter can be easily ensured when producing a thin resin composite film.

Aramid microfibers may be obtained using aramid staple fibers as the starting material. The aramid used for this embodiment may be a linear polymer compound wherein 60% or more of the amide bonds are directly bonded to an aromatic ring. Examples of such aramids include polymetaphenyleneisophthalamide and its copolymers, polyparaphenyleneterephthalamide and its copolymers and copolyparaphenylene-3,4'-diphenyl ether terephthalamide.

Aramid staple fibers may be obtained by cutting fibers prepared using aramid as the starting material, to prescribed lengths, examples of such fibers including, but not being limited to, those available under the trade names of "TEIJINCONEX®" and "TECHNORA®" by Teijin Techno Products Co., Ltd., "Nomex®" and "Kevlar®" by DuPont Corp., and "TWARON®" by Teijin Aramid. The lengths of the aramid staple fibers will generally be at least 1 mm and less than 50 mm, and are preferably selected in the range of 2-10 mm.

The cellulose microfiber sheet of this embodiment may be a laminated multilayer structure (also known as "layered sheet") on a sheet made of an organic polymer (hereunder referred to as "organic polymer sheet"). When the cellulose microfiber sheet is laminated on an organic polymer sheet, the tensile strength will be reinforced producing greater toughness, and the handleability as a sheet will be improved.

The structure of the organic polymer sheet in a multilayer structure is not particularly specified. From the viewpoint of filtering cellulose microfibers in production by a paper-making method and impregnation of the resin, the organic polymer sheet is more preferably a porous sheet. Examples of porous sheets include woven fabrics, knitted fabrics, nets, long fiber nonwoven fabrics and short fiber nonwoven fabrics made of organic polymer fibers, or polymer microporous films or other films produced by resin phase separation or stretching.

The organic polymer sheet is preferably hydrophilic in order to improve the paper-making properties and improve adhesion with the cellulose microfiber sheet, and it may be surface-modified on the sheet surface by corona discharge treatment or plasma treatment, to render it hydrophilic.

The composition of the organic polymer forming the organic polymer sheet is not particularly specified, and examples include polyethylene, polypropylene, ethylene-propylene copolymer, polyvinyl chloride, polyvinylidene chloride, polyvinyl acetate, ethylene-vinyl acetate copolymer, polyvinyl alcohol, polyacetal, fluorine resins such as polyvinylidene fluoride, polyethylene terephthalate, polybutylene terephthalate, polyethylene naphthalate, polystyrene, polyacrylonitrile, styrene-acrylonitrile copolymer, ABS resin, polyphenylene ether (PPE) resin, polyimide, polyamideimide, polymethacrylic acid, polyacrylic acids, polycarbonate, polyphenylene sulfide, polysulfone, polyethersulfone, polyethernitrile, polyetherketone, polyketone, liquid crystal polymers, silicone resins, ionomers, cellulose (natural cellulose fibers such as wood pulp or cotton, and regenerated cellulose such as viscose rayon, cuprammonium rayon or Tencel®), cellulose derivatives, cellulose acetate, nitrocellulose, styrene-butadiene or styrene-isoprene block copolymers, styrene-based thermoplastic elastomers, olefin-based thermoplastic elastomers, vinyl chloride-based thermoplastic elastomers, polyester-based thermoplastic elastomers, polyurethane-based thermoplastic elastomers, polyamide-based thermoplastic elastomers, epoxy resins, polyimide resins, phenol resins, unsaturated polyester resins, diallyl phthalate resins, silicone resins, polyurethane resins, polyimide-silicone resins, thermosetting polyphenylene ether resins, modified PPE resins, natural rubber, butadiene rubber, isoprene rubber, styrene-butadiene copolymer rubber, nitrile rubber, chloroprene rubber, ethylene-propylene rubber, chlorinated polyethylene, chlorosulfonated polyethylene, butyl rubber, halogenated butyl rubber, fluorine rubber, urethane rubber and silicone rubber, any of which may be used alone or in combinations of two or more.

Natural cellulose microfibers that are used may be cellulosic microfibers that have been chemically treated on the surface, or cellulosic microfibers that have the 6-position hydroxyl group oxidized to a carboxyl group (including acid and salt types) by a TEMPO oxidation catalyst. In the former case, any of various types of surface chemical treatments are carried out according to the purpose, and for example, it is possible to use, with appropriate modifications, fibers wherein some or most of the hydroxyl groups present on the surfaces of the cellulose microfibers are esterified as acetic acid esters, nitric acid esters or sulfuric acid esters, or are etherified as alkyl ethers such as methyl ethers, carboxy ethers such as carboxymethyl ethers, or cyanoethyl ethers. Cellulose that has been chemically modified with hydrophobic substituents is most preferably used as the sheet starting material, since it will be easier to control to a high void percentage. In addition, cellulose that has been chemically modified with hydrophobic substituents is preferred from the viewpoint of obtaining a highly transparent resin sheet when the resin is impregnated.

Also, in preparation of cellulose microfibers having the 6-position hydroxyl group oxidized by a TEMPO oxidation catalyst, it is not always necessary to use a micronizing device that requires high energy such as a high-pressure homogenizer, to obtain a cellulose microdispersion. For example, as described in the literature (A. Isogai et al., Biomacromolecules, 7, 1687-1691(2006)), a TEMPO catalyst such as 2,2,6,6-tetramethylpiperidinooxy radical may be added to a natural cellulose aqueous dispersion together with an alkyl halide, and an oxidizing agent such as hypochlorous acid then added to the mixture, allowing the reaction to proceed for a fixed period of time, and this may be followed by purifying treatment by water rinsing or the like and then common mixer treatment, to very easily obtain a dispersion of cellulose microfibers.

For this embodiment, it is also effective if prescribed amounts of two or more different types of regenerated cellulose or natural cellulosic microfibers with different starting materials described above, or natural cellulose microfibers with different degrees of fibrillation, natural cellulose microfibers that have been chemically treated on the surfaces, or organic polymer microfibers, are mixed to form the cellulose microfiber layer.

(Fiber Sheet Crosslinking Agent)

According to this embodiment, the cellulose microfibers may have chemical crosslinking between the cellulose microfibers using a fiber sheet crosslinking agent, for strength reinforcement, water resistance and solvent resistance. The fiber sheet crosslinking agent is present at no greater than 30 wt % and preferably no greater than 20 wt % of the weight of the cellulose microfibers. The fiber sheet crosslinking agent is not restricted so long as it forms chemical crosslinking between the cellulose microfibers, but it is preferred to use a resin produced by addition reaction of a polyisocyanate with two or more isocyanate groups, and an active hydrogen-containing compound. Polyisocyanates with two or more isocyanate groups include aromatic polyisocyanates, alicyclic polyisocyanates and aliphatic polyisocyanates. Active hydrogen-containing compounds include monohydric to hexahydric hydroxyl-containing compounds such as polyester polyols and polyether polyols, amino group-containing compounds, thiol group-containing compounds and carboxyl group-containing compounds. They also include water and carbon dioxide, which are present in the air or the reaction site.

When a fiber sheet crosslinking agent is included at no greater than 30 wt %, the strength of the fiber sheet increases, and a resin composite film is obtained that has highly satisfactory resin impregnation and handleability for assembly of devices. Furthermore, in a multilayer structure, the cellulose microfibers and the fibers composing the organic polymer sheet can be chemically crosslinked together with a fiber sheet crosslinking agent. The cellulose microfiber layer and the organic polymer sheet are preferably crosslinked in order to help prevent peeling during resin impregnation.

(Method for Producing Fiber Sheet)

An example of a method for producing a fiber sheet for this embodiment will now be described, with the understanding that there is no particular limitation to this method.

The method for producing a fiber sheet according to this embodiment is production by either a paper-making method or a coating method. In the case of a paper-making method, it comprises (1) a step of producing cellulose microfibers by micronization of cellulose fibers, (2) a step of preparing a paper-making slurry of the cellulose microfibers, (3) a paper-making step, in which the paper-making slurry is filtered on a porous base material to form a wet web, and (4) a drying step, in which the wet web is dried to obtain a dry sheet.

In addition, the dry sheet may be subjected to either or both (A) a smoothing step, in which the dry sheet is hot pressed for homogenization or thickness reduction of the sheet, and (B) a heat treatment step, in which heat treatment is carried out to accelerate formation of chemical bonds with a fiber sheet crosslinking agent. In the case of a coating method, a coating slurry, prepared by the same steps (1) and (2) above, is coated onto an organic polymer sheet and dried to form a film. It may also be subjected to the (A) smoothing step and (B) heat treatment step. The method of coating, in the case of a coating method, may be selected from among various coating methods such as spray coating, gravure coating and dip coating.

The fiber sheet is preferably subjected to a pretreatment step, a beating treatment step and a micronization step, using the cellulose fibers mentioned above. For a pretreatment step of natural cellulose fibers, it is effective for the starting pulp to be subjected to autoclave treatment or enzyme treatment, or a combination thereof, while immersed in water at a temperature of 100 to 150° C., for conversion to a state that is easily micronized in the subsequent steps. During the pretreatment step, it will sometimes be effective to add an inorganic acid (hydrochloric acid, sulfuric acid, phosphoric acid, boric acid or the like) or an organic acid (acetic acid, citric acid or the like) at a concentration of no greater than 1 wt %, and to carry out autoclave treatment. Such pretreatment has the effect of not only reducing the load for the micronization treatment, but also of causing impurity components such as lignin and hemicellulose, which are present on the surface and in the gaps of the microfibrils forming the cellulose fibers, to be discharged into the aqueous phase, increasing the α-cellulose purity of the micronized fibers as a result, and it is therefore highly effective for increasing the heat resistance of the cellulose microfiber nonwoven fabric. Rinsing with a surfactant may be carried out in the pretreatment step to remove oil agents, in the case of regenerated cellulose fibers.

In the beating treatment step, the starting pulp is dispersed in water to a solid concentration of 0.5 wt % to 4 wt %, preferably 0.8 wt % to 3 wt % and more preferably 1.0 wt % to 2.5 wt %, and fibrillation is thoroughly promoted using a beating apparatus such as a beater or disc refiner (double disc refiner). When a disc refiner is used, an extremely high level of beating (fibrillation) will be promoted if the clearance between the discs is set to be as narrow as possible (for example, mm) for treatment. Therefore, the conditions for micronization treatment with a high-pressure homogenizer or the like, as described below, can be relaxed, which may be effective in some cases.

The extent of beating treatment is determined in the following manner. Based on investigation by the present inventors, the CSF value (which indicates the extent of beating of the cellulose and is evaluated by the Canadian Standard Freeness test method for pulp, as defined by JIS P 8121), decreases with time as beating treatment is carried out, and it has been confirmed that once having approached zero, it tends to increase again with any further beating treatment. For production of cellulose microfibers, the CSF value in the beating treatment is preferably at least zero, and more preferably a CSF of 30 ml. A slurry with such a degree of beating is advantageous in terms of increased uniformity, and production efficiency such as reduced clogging in subsequent micronization treatment with a high-pressure homogenizer or the like.

The fiber sheet is preferably subjected to micronization treatment with a high-pressure homogenizer, ultrahigh-pressure homogenizer or grinder after the beating step described above. During this time, the solid concentration of the slurry is 0.5 wt % to 4 wt %, preferably 0.8 wt % to 3 wt % and more preferably 1.0 wt % to 2.5 wt %, as in the beating treatment described above. A solid concentration in this range will avoid clogging and will allow efficient micronization treatment to be completed.

The high-pressure homogenizer used may be, for example, a Model NS high-pressure homogenizer by Niro Soavi, a Ranier-type (R model) pressure homogenizer by SMT Corp. or a high-pressure homogenizer by Sanwa Machinery Trading Co., Ltd., or it may be another apparatus so long as it accomplishes micronization by a similar mechanism as these. An ultrahigh-pressure homogenizer is a high-pressure impact micronization treatment machine such as a Microfluidizer by Mizuho Industrial Co., Ltd., a Nanomizer by Yoshida Kikai Co. Ltd. or an Ultimizer by Sugino Machine, Ltd., or it may be another apparatus so long as it accomplishes micronization by a similar mechanism as these. A grinder micronization machine may be a mill stone grinding type such as a pure fine mill by Kurita Machinery Mfg. Co. Ltd. or a super mass colloider by Masuko Sangyo Co., Ltd., or it may be another apparatus so long as it accomplishes micronization by a similar mechanism as these.

The fiber diameter of the cellulose microfibers can be controlled by the conditions for the micronization treatment by the high-pressure homogenizer (selection of the apparatus, the operating pressure and the number of passes) or the conditions for pretreatment before micronization treatment (for example, autoclave treatment, enzyme treatment and beating treatment).

When aramid fibers are used, micronization of the aramid fibers is preferably by the same pretreatment step, beating treatment step and micronization step as for cellulose microfibers. In the pretreatment step, rinsing is carried out using a surfactant to remove the oil agent. In the beating treatment step, the rinsed fibers are dispersed in water to a solid concentration of 0.5 wt % to 4 wt %, preferably 0.8 wt % to 3 wt % and more preferably 1.0 wt % to 2.5 wt %, and fibrillation is thoroughly promoted using a beating apparatus such as a beater or disc refiner (double disc refiner). When a disc refiner is used, an extremely high level of beating (fibrillation) will be promoted if the clearance between the discs is set to be as narrow as possible (for example, 0.1 mm) for treatment, and therefore the conditions for micronization treatment with a high-pressure homogenizer or the like can be relaxed, which may be effective in some cases. The extent of the beating treatment may be to the same CSF value used for production of the cellulose microfibers.

For production of aramid microfibers, micronization treatment is preferably carried out with a high-pressure homogenizer, ultrahigh-pressure homogenizer or grinder after the beating step described above. During this time, the solid concentration in the aqueous dispersion is 0.5 wt % to 4 wt %, preferably 0.8 wt % to 3 wt % and more preferably 1.0 wt % to 2.5 wt %, as in the beating treatment described above. A solid concentration in this range will avoid clogging and will allow efficient micronization treatment to be completed. The high-pressure homogenizer used may be, but is not limited to, at least the apparatuses mentioned for production of cellulose microfibers.

The fiber diameters of the aramid microfibers can be controlled by the conditions for micronization treatment with a high-pressure homogenizer or the like (selection of the apparatus, the operating pressure and the number of passes) or the conditions for pretreatment before micronization treatment (for example, beating treatment).

For this embodiment, a slurry comprising a mixture of two or more types of cellulose microfibers with different starting materials mentioned above, or cellulose microfibers with different degrees of fibrillation, or cellulose microfibers that have been chemically treated on the surfaces, or organic polymer microfibers such as aramid microfibers, in any desired proportion, may be used for the paper-making and drying treatment described below, to produce a fiber sheet composed of two or more different types of cellulose microfibers, or cellulose microfibers and aramid microfibers.

A fiber sheet composed of two or more different types of microfibers preferably has each of the microfibers uniformly dispersed in the fiber sheet without aggregation. If the microfibers are each dispersed in the slurry in an uneven state, the resulting fiber sheet will not exhibit satisfactory uniformity of film quality. It is therefore necessary to achieve a suitable level of uniform dispersion in the slurry. The dispersion method for the slurry containing two or more microfiber components may be one using a Disper mixer type blade-mounted high-speed disperser (for example, a T.K. homomixer by PRIMX Corp.) or a disc refiner (including double disc refiners), a high-pressure homogenizer, an ultrahigh-pressure homogenizer or a grinder.

In the step of producing the cellulose microfibers, it will sometimes be effective to mix the aramid microfiber starting material in order to allow simultaneous micronization of the cellulose and aramid while simultaneously achieving high dispersibility.

Various additives (such as an oil-based compound, water-dispersible blocked isocyanate or functionalizing agent) may also be added to the cellulose microfiber slurry to prepare a paper-making slurry. The paper-making slurry preferably has a cellulose microfiber concentration of 0.01 wt % to 0.5 wt %. The concentration is preferably 0.08 wt % to 0.35 wt % to more satisfactorily carry out stable paper-making. It is not preferred for the cellulose microfiber concentration in the slurry to be lower than 0.01 wt %, because the drainage time will be extremely lengthened, and productivity will be markedly reduced, while the uniformity of film quality will also be significantly impaired. It is also not preferred for the cellulose microfiber concentration to be higher than 0.5 wt %, because the viscosity of the dispersion will excessively increase, thus making it difficult to achieve homogeneous film formation.

For production of a porous fiber sheet, the paper-making slurry may also include an emulsified oil-based compound as described in PTL 1 (Japanese Unexamined Patent Publication No. 2012-46843) by the present inventors, referred to above.

Specifically, it is preferred for an oil-based compound having a boiling point range of 50° C. to 200° C. at atmospheric pressure to be dispersed in the paper-making slurry that is in emulsion form, at a concentration of 0.15 wt % to 10 wt %. The concentration of the oil-based compound in the paper-making slurry is preferably 0.15 wt % to 10 wt %, more preferably 0.3 wt % to 5 wt % and even more preferably 0.5 wt % to 3 wt %. Although a porous sheet of cellulose microfibers can be obtained even if the concentration of the oil-based compound is greater than 10 wt %, this is not preferred as it will increase the amount of oil-based compound used in the production process, resulting in the need for safety measures and introducing cost constraints. Moreover, an oil-based compound concentration of lower than 0.15 wt % is also not preferred, as it will only be possible to obtain a sheet having an air permeability resistance higher than the prescribed air permeability resistance range.

The oil-based compound is preferably removed during drying. According to this embodiment, therefore, the oil-based compound included as an emulsion in the paper-making slurry preferably has a specified boiling point range. Specifically, the boiling point is preferred to be 50° C. to 200° C. at atmospheric pressure. It is more preferably 60° C. to 190° C., as this will facilitate handling of the paper-making slurry in an industrial production process and will allow more efficient heat removal. If the boiling point of the oil-based compound is below 50° C. at atmospheric pressure, this is undesirable in terms of efficiency as it will require management with low temperature control for stable management of the paper-making slurry. If the boiling point of the oil-based compound is higher than 200° C. at atmospheric pressure, this is also undesirable because a large amount of energy will be necessary for heat removal of the oil-based compound in the drying step.

The solubility of the oil-based compound in water at 25° C. is preferably no greater than 5 wt %, more preferably no greater than 2 wt % and even more preferably no greater than 1 wt %, from the viewpoint of efficiently contributing to formation of the necessary structure for the oil-based compound.

Examples of oil-based compounds include hydrocarbons, linear saturated hydrocarbons, cyclic hydrocarbons, linear or cyclic unsaturated hydrocarbons and aromatic hydrocarbons with carbon numbers of 6 to 14, and monohydric and primary alcohols with carbon numbers in the range of 5 to 9. In particular, using at least one compound selected from among 1-pentanol, 1-hexanol and 1-heptanol will allow particularly satisfactory production of a cellulose microfiber porous sheet. Since this will result in an extremely small oil droplet size for the emulsion (1 μm or smaller under ordinary emulsifying conditions), it is considered to be suitable for production of a nonwoven fabric having a high void percentage and a fine porous structure.

Such oil-based compounds may be added alone, or a mixture of more than one may be added. In order to control the emulsion property to a suitable state, a water-soluble compound may be dissolved in the paper-making slurry.

As the water-soluble compound there may be added one or more water-soluble compounds selected from the group consisting of, specifically, sugars, water-soluble polysaccharides, water-soluble polysaccharide derivatives, polyhydric alcohols, alcohol derivatives and water-soluble polymers. A water-soluble polysaccharide is any polysaccharide that is water-soluble, and a variety of natural compounds exist. Examples include starch, solubilized starch and amylose. Water-soluble polysaccharide derivatives include derivatives of the aforementioned water-soluble polysaccharides, such as alkylated products, hydroxyalkylated products and acetylated products that are water-soluble. Alternatively, even polysaccharides that are insoluble in water before derivatization, such as cellulose and starch, are included among the water-soluble polysaccharide derivatives, if they are rendered soluble in water by derivatization such as hydroxyalkylation, alkylation or carboxyalkylation. Water-soluble polysaccharide derivatives that have been derivatized by two or more functional groups are also included. However, the water-soluble compounds that may be used are not limited to the compounds mentioned above.

The amount of water-soluble compound to be mixed is preferably no greater than 25 wt % with respect to the oil-based compound. Addition in a greater amount is undesirable as the ability of the oil-based compound to form an emulsion will be reduced. The water-soluble compound is also preferably dissolved in the aqueous phase in the paper-making slurry. The concentration of the water-soluble compound is an amount of preferably 0.003 wt % to 0.3 wt %, more preferably 0.005 wt % to 0.08 wt % and even more preferably 0.006 wt % to 0.07 wt %, such a range being preferred because the porous fiber sheet will be easy to obtain while the state of the paper-making slurry will usually be stabilized.

For the purpose of stabilizing the emulsion, a surfactant other than the water-soluble compound may be included in the paper-making slurry, in a total amount with the specific water-soluble polymer that is in the concentration range specified above.

Surfactants include anionic surfactants such as alkylsulfuric acid ester salts, polyoxyethylene alkylsulfuric acid ester salts, alkylbenzene sulfonic acid salts and α-olefinsulfonic acid salts, cationic surfactants such as alkyltrimethylammonium chlorides, dialkyldimethylammonium chlorides and benzalkonium chlorides, amphoteric surfactants such as betaine alkyldimethylaminoacetates, betaine alkylamidedimethylaminoacetates, and nonionic surfactants such as alkylpolyoxyethylene ethers and fatty acid glycerol esters, with no limitation to these.

Various additives may also be added to the paper-making slurry, according to the purpose. For example, water-dispersible blocked polyisocyanates, water-soluble polymers, thermoplastic resins, thermosetting resins, photocurable resins, inorganic particulate compounds such as silica particles, alumina particles, titanium oxide particles or calcium carbonate particles, resin fine particles, various salts, organic solvents that do not inhibit the stability of the paper-making slurry, antifoaming agents and the like, may be added in ranges (selection of type and selection of composition) that do not adversely affect production of the sheet structure.

Water-dispersible blocked polyisocyanates are compounds that can act as fiber sheet crosslinking agents with heating. Their specific features are (1) having a polyisocyanate compound such as a polyisocyanate or polyisocyanate derivative as the basic backbone, (2) having the isocyanate groups blocked by a blocking agent, (3) not reacting with functional groups with active hydrogens, at ordinary temperature, (4) upon heat treatment at above the dissociation temperature, the blocking groups dissociate, regenerating active isocyanate groups, and react with functional groups that have active hydrogens to form bonds, and (5) being dispersed in water in the form of an emulsion.

Such water-dispersible blocked polyisocyanates are thought to exhibit the following behavior during production of a fiber sheet.

(1) Adsorption onto the cellulose microfibers in the paper-making slurry.

(2) Formation of a wet web containing the water-dispersible blocked polyisocyanate.

(3) As the wet web dries, drying of the water-dispersible blocked polyisocyanate and formation of a blocked polyisocyanate coating film on the cellulose microfibers.

(4) Progressive dissociation and crosslinking reaction of blocking groups by heat curing.

The water-dispersible blocked polyisocyanate may be either a compound obtained by directly bonding a hydrophilic compound to a blocked polyisocyanate and emulsifying (self-emulsifiable type), or a compound obtained by forced emulsification with a surfactant or the like (forced-emulsified type).

The mean particle diameter of the aqueous dispersion may be 1 to 1000 nm and is preferably 10 to 500 nm and more preferably 10 to 200 nm. If it is greater than 1000 nm, it will be too large with respect to the fiber diameters of the cellulose microfibers, and uniform adsorption will become difficult. This is therefore undesirable from the viewpoint of increasing the sheet strength, since more cellulose microfibers will be present that are not crosslinked with the fiber sheet crosslinking agent.

Anionic, nonionic or cationic hydrophilic groups are exposed on the emulsion surface, but they are preferably cationic. The reason for this is that, at the stage of producing the paper-making slurry, electrostatic interaction will be effective in terms of effectively adsorbing the water-dispersible blocked polyisocyanate (0.0001 to 0.5 wt %) onto the cellulose microfibers in a dilute cellulose microfiber slurry (0.01 to 0.5 wt %). Common cellulose fiber surfaces are known to be anionic (zeta potential of −30 to −20 mV in distilled water) (see J. Brandrup (editor) and E. H. Immergut (editor), "Polymer Handbook 3rd edition" V-153-V-155). If the aqueous dispersion surface is cationic, therefore, adsorption onto the cellulose microfibers will be facilitated. Even if it is nonionic, however, sufficient adsorption onto the cellulose microfibers will be possible depending on the polymer chain lengths and rigidity of the hydrophilic groups of the emulsion. Furthermore, even if adsorption is more difficult due to electrostatic repulsion in the case of anionicity, adsorption onto the cellulose microfibers can still be achieved using a commonly known cationic adsorption aid or cationic polymer.

The water-dispersible blocked polyisocyanate is not particularly restricted so long as it is a polyisocyanate or polyisocyanate derivative containing at least two or more isocyanate groups. Polyisocyanates include aromatic polyisocyanates, alicyclic polyisocyanates and aliphatic polyisocyanates.

Examples of polyisocyanate derivatives include multimers (for example, dimers, trimers, pentamers or heptamers) of the aforementioned polyisocyanates, as well as compounds obtained by reacting active hydrogen-containing compounds with one or more different types. Such compounds include modified allophanates (for example, modified allophanates produced by reacting polyisocyanates with alcohols), modified polyols (for example, modified polyols produced by reacting polyisocyanates with alcohols (alcohol adduct products)), modified biurets (for example, modified biurets produced by reacting polyisocyanates with water or amines), modified ureas (for example, modified ureas produced by reacting polyisocyanates with diamines), modified oxadiazinetriones (for example, oxadiazinetriones produced by reacting polyisocyanates with carbon dioxide gas, modified carbodiimides (modified carbodiimides produced by decarboxylation condensation reaction of polyisocyanates), modified urethodiones and modified uretonimines.

Examples of active hydrogen-containing compounds include monohydric to hexahydric hydroxyl-containing compounds including polyester polyols and polyether polyols, amino group-containing compounds, thiol group-containing compounds and carboxyl group-containing compounds. They also include water and carbon dioxide, which are present in the air or the reaction site.

A blocking agent is an agent that is added to and blocks the isocyanate groups of a polyisocyanate compound. The blocking groups are stable at room temperature, but when heated to the heat treatment temperature (usually about 100° C. to about 200° C.), the blocking agent dissociates, regenerating free isocyanate groups. Blocking agents satisfying this condition include alcohol-based compounds, alkylphenol-based compounds, phenol-based compounds, active methylene-based compounds, mercaptane-based compounds, acid amide-based compounds, acid imide-based compounds, imidazole-based compounds, urea-based compounds, oxime-based compounds and amine-based compounds, and these blocking agents may be used either alone or in combinations of two or more.

A self-emulsifiable blocked polyisocyanate is one having an active hydrogen group-containing compound with an anionic, nonionic or cationic group bonded to a blocked polyisocyanate backbone.

Active hydrogen group-containing compounds with anionic groups are not particularly restricted, and for example, they include compounds having one anionic group and two or more active hydrogen groups. The anionic groups may be carboxyl groups, sulfonate groups, phosphate groups or the like.

Active hydrogen group-containing compounds with nonionic groups are not particularly restricted, and for example, polyalkylene ether polyols containing common alkoxy groups as nonionic groups may be used.

Active hydrogen group-containing compounds with cationic groups are also not particularly restricted but are preferably aliphatic compounds having an active hydrogen-containing group such as a hydroxyl group or primary amino group, and a tertiary amino group, among which polyhydroxy compounds having a tertiary amino group, and two or more active hydrogens that are reactive with isocyanate groups, are preferred.

Cationic groups can be neutralized by compounds with anionic groups, to facilitate dispersion in water in the form of a salt. The anionic groups may be, for example, carboxylate groups, sulfonate groups or phosphate groups. Introduced tertiary amino groups may be quaternized with dimethyl sulfate or diethyl sulfate.

A forced-emulsified blocked polyisocyanate is a blocked polyisocyanate compound that has been emulsified and dispersed with a commonly known anionic surfactant, nonionic surfactant, cationic surfactant, amphoteric surfactant, polymeric surfactant or reactive surfactant.

The water-dispersible blocked polyisocyanate, whether self-emulsifiable or forced-emulsified, may include 20 wt % of a solvent other than water. The solvent is not particularly restricted, and examples include ethyleneglycol monomethyl ether, diethyleneglycol monomethyl ether, ethylene glycol, diethylene glycol and triethylene glycol. These solvents may be used alone, or two or more may be used in combination.

The water-soluble polymer may be cationic, anionic, amphoteric or nonionic.

A cationic polymer is a polymer having primary amino groups, secondary amino groups, tertiary amino groups, quaternary ammonium salt groups, pyridinium, imidazolium or quaternized pyrrolidone, examples of which include water-soluble cationic polymers such as cationized starch, cationic polyacrylamide, polyvinylamine, polydiallyldimethylammonium chloride, polyamideamine epichlorohydrin, polyethyleneimine and chitosan.

Anionic polymers are polymers having anionic groups such as carboxyl groups, sulfone groups and phosphate groups, and examples include carboxymethyl cellulose, polyacrylic acid, anionic, polyacrylamide, urea phosphorylated starch, succinic acid-modified starch and sodium polystyrenesulfonate.

Amphoteric polymers include amphoteric water-soluble polymers having both an anionic monomer unit and a cationic monomer unit in the molecular chain backbone. Examples include diallylamine hydrochloride-maleic acid copolymer, and amphoteric polyacrylamide.

Examples of nonionic polymers include polyethylene glycol, hydroxypropyl methyl cellulose and polyvinyl alcohol.

Examples of thermoplastic resins that may be added to the slurry include styrene-based resins, acrylic-based resins, aromatic polycarbonate-based resins, aliphatic polycarbonate resins, aromatic polyester-based resins, aliphatic polyester-based resins, aliphatic polyolefin-based resins, cyclic olefin-based resins, polyamide-based resins, polyphenylene ether-based resins, thermoplastic polyimide-based resins, polyacetal-based resins, polysulfone-based resins and amorphous fluorine-based resins. The number-average molecular weight of such a thermoplastic resin will generally be 1000 or greater and is preferably from 5000 to 5,000,000 and more preferably from 10,000 to 1,000,000. These thermoplastic resins may be used alone or in combinations of two or more. Preferably, two or more thermoplastic resins are included because this will allow the refractive index of the resin to be adjusted by the content ratio. For example, if polymethyl methacrylate (refractive index: ca. 1.49) and acrylonitrile-styrene (acrylonitrile content: ca. 21%, refractive index: ca. 1.57) are included at 50:50, a resin with a refractive index of about 1.53 can be obtained.

Thermosetting resins that may be added to the slurry are not particularly restricted, and specific examples are epoxy resins, thermosetting modified polyphenylene ether resins, thermosetting polyimide resins, urea resins, acrylic resins, silicon resins, benzoxazine resins, phenol resins, unsaturated polyester resins, bismaleimidetriazine resins, alkyd resins, furan resins, melamine resins, polyurethane resins and aniline resins, as well as industrially supplied resins and resins obtained by mixing two or more of these resins. Among these, epoxy resins, acrylic resins, unsaturated polyester resins, vinyl ester resins and thermosetting polyimide resins are transparent and are therefore preferred for use as optical materials.

Examples of photocurable resins that may be added to the slurry include epoxy resins that contain latent photocationic polymerization initiators. These thermosetting resins and photocurable resins may be added alone or in combinations of two or more.

Incidentally, a thermosetting resin or photocurable resin is a relatively low-molecular-weight substance that is liquid, semi-solid or solid at ordinary temperature and exhibits a flowability either at ordinary temperature or under heating. These can undergo curing reaction or crosslinking reaction by the action of a curing agent, catalyst, heating or light, increasing in molecular weight while forming a mesh-like three-dimensional structure, thus being converted to insoluble, infusible resins. A cured resin is a resin obtained by curing a thermosetting resin or photocurable resin.

Curing agents and curing catalysts that may be added to the slurry are not particularly restricted so long as they are used for curing of thermosetting resins or photocurable resins. Specific examples of curing agents include polyfunctional amines, polyamides, acid anhydrides and phenol resins, and specific examples of curing catalysts include imidazoles, which may be added to the slurry either alone or as mixtures of two or more.

The thermoplastic resins, thermosetting resins and photocurable resins that may be added to the slurry will usually be hydrophobic, and when added to a paper-making slurry it is difficult to uniformly disperse them in the slurry. They are preferably in the form of an emulsion. An emulsion consists of fine macromolecular particles with particle diameters of about 0.001 to 10 μm, and it is obtained by stirring a hydrophobic compound and an emulsifying agent in water. For a thermosetting resin or photocurable resin, including a curing agent and curing catalyst in the emulsion will allow curing to take place in the sheet by exposing the cellulose microfiber sheet containing the emulsion to heat and photoirradiation.

The emulsifying agent to be used in the emulsion of the thermoplastic resin, thermosetting resin or photocurable resin that may be added to the slurry may be a commonly known anionic surfactant, nonionic surfactant, cationic surfactant, amphoteric surfactant, polymeric surfactant or reactive surfactant.

The emulsion of the thermoplastic resin, thermosetting resin or photocurable resin that may be added to the slurry preferably has a larger particle diameter in consideration of yield and dewaterability, but since the uniformity or optical properties of the sheet may be reduced if it is too large, it is preferably a size of 0.001 to 10 μm, which is suitable for the purpose. The surface charge of the emulsion may be cationic, nonionic or anionic, but considering the fact that the cellulose microfiber slurry is to be mixed with the resin compound emulsion, a cationic charge is advantageous in terms of dispersion stability or yield. Even if it is nonionic, however, sufficient adsorption onto the cellulose microfibers will be possible depending on the polymer chain lengths and rigidity of the hydrophilic groups of the emulsion. Furthermore, even if adsorption is more difficult due to electrostatic repulsion in the case of anionicity, adsorption onto the cellulose microfibers can still be achieved using a commonly known cationic adsorption aid or cationic polymer.

The method of preparing the paper-making or coating slurry may be a method in which, for example, (1) a preliminarily prepared compound including the additives is mixed with the cellulose microfiber slurry and dispersed in it to prepare a paper-making slurry, or (2) the cellulose microfiber slurry is stirred while separately adding the additives one by one. When several types of additives are to be added, the dispersed state or zeta potential of the paper-making slurry can potentially vary depending on the order of their addition, if the system is one in which the additives aggregate together (for example, a system in which a cationic polymer and an anionic polymer form an ion complex). However, there are no particular limitations on the order and amount of addition, and the addition is preferably by a method that allows the desired dispersion state of the paper-making slurry and sheet properties to be obtained.

The stirrer for homogeneous mixing and dispersion of the additives may be a disperser of a type that rotates a blade with a cutting function at high speed, such as an agitator, homomixer, pipeline mixer or blender, or a high-pressure homogenizer, with no limitation to these. For stirring, the dispersed mean diameter of the slurry is preferably 1 μm to 300 μm. However, excessive stirring produces excessive shearing stress with emulsion-type additives such as water-dispersible blocked polyisocyanates, which may potentially result in disruption of the emulsion structure. Consequently, the use of a high-pressure homogenizer or a grinder micronization machine or mill stone grinding machine may not be desirable, depending on the slurry composition.

The paper-making step in which a wet web is formed by filtration of a paper-making slurry on a porous base material will now be explained.

The paper-making step may be carried out using any apparatus in which the procedure which basically employs a filter or filter cloth (also known as a "wire" in the field of paper making) with which water is removed from the paper-making slurry while the cellulose microfibers remain on it.

If the paper machine used is an apparatus such as an inclined wire paper machine, Fourdrinier paper machine or circular mesh paper machine, a fiber sheet can be satisfactorily obtained in the form of a sheet with few defects. The paper machine may be a continuous or batch type, used as appropriate for the purpose. In order to increase the uniformity of film quality, it will sometimes be effective to use one or more paper machines (for example, an inclined wire paper machine for base layer paper-making and a round mesh paper machine for top layer paper-making), or to carry out the paper-making in multiple stages. Paper-making in multiple stages is a technique in which, for example, paper-making is carried out at a basis weight of 5 g/m² in the first stage, and paper-making is carried out on the obtained wet web at 5 g/m² in the second stage, to obtain a fiber sheet with a total basis weight of 10 g/m². In multistage paper-making, a monolayer fiber sheet results when the upper layer and lower layer are formed from the same dispersion, but by using fibrillated fibers as the lower layer in the first stage to form a fine-mesh wet web layer and carrying out paper-making over it using the aforementioned dispersion in the second stage, the wet web of the lower layer can be made to function as a filter, as described below.

In the paper-making step, the mesh size of the wire or filter cloth is important for filtration of the soft aggregates such as cellulose microfibers dispersed in the paper-making slurry. For this embodiment, any wire or filter cloth may be used that can produce paper such that the yield ratio of the water-insoluble component containing the cellulose microfibers in the paper-making slurry is 70 wt % or greater, preferably 95 wt % or greater and more preferably 99 wt % or greater.

Even with a yield ratio of 70 wt % or greater, however, if the drainage property is not high, more time will be necessary for paper-making and the production efficiency will be very poor. Therefore, the water permeation of the wire or filter cloth under atmospheric pressure at 25° C. is preferably 0.005 ml/(cm²·sec) or greater and more preferably 0.01 ml/(cm²·sec) or greater, from the viewpoint of productivity. On the other hand, a yield ratio of lower than 70 wt % will not only markedly reduce the productivity but clogging of the water-insoluble components such as cellulose microfibers will also occur in the wire or filter cloth that is used, thus notably impairing the releasability of the cellulose microfiber sheet after film formation.

The water permeation of the wire or filter cloth under atmospheric pressure is evaluated in the following manner. In a batch paper machine (for example, an automatic square sheet machine by Kumagai Riki Kogyo Co., Ltd.) there are set an 80 to 120 mesh metal mesh (with essentially no drainage resistance), and the wire or filter cloth over it. Next, a sufficient amount of water (denoted as y (ml)) is poured into a paper machine with a paper-making area of x (cm²), and the drainage time is measured under atmospheric pressure. The water permeation at a drainage time of z (sec) is defined as $y/(x \cdot z)$ (ml/(cm²·s)).

Examples of wires or filter cloths that may be used for this embodiment include TETEXMONO DLW07-8435-SK010 (made of PET) by Sefar Co., NT20 (PET/nylon mixed spun) by Shikishima Canvas Co., Ltd. and plastic wire LTT-9FE by Nippon Filcon Co., Ltd., as well as the multilayer wire described in Japanese Unexamined Patent Publication No. 2011-42903, with no limitation to these.

In dewatering in the paper-making step, a wet web with an increasingly high solid content is obtained. The wet web may be further subjected to press treatment to remove the dispersing medium such as water with high efficiency, and to increase the solid content in the obtained wet film. The solid content of the wet web can be controlled by the suction pressure (wet suction or dry suction) or the pressing conditions for paper-making, and preferably it is adjusted to a range of a solid concentration of 6 wt % to 30 wt % and more preferably a solid concentration of 8 wt % to 25 wt %. If the solid content of the wet web is lower than 6 wt %, the strength of the wet web will be lowered, making the web fail to be self-supporting and tending to result in problems during the process. Also, dewatering to a concentration where the wet web solid content is higher than 30 wt % will result in loss of homogeneity of the sheet thickness.

For a multilayer structure, a multilayered sheet composed of a multilayer structure with at least two layers can be produced by paper-making with the organic polymer sheet set on a wire or filter cloth. For production of a multilayered sheet with 3 or more layers, a substrate with a multilayer structure of 2 or more layers may be used. Multistage paper-making for a fiber sheet with 2 or more layers on a substrate may also be carried out to obtain a multilayer sheet with 3 or more layers. During the process, it is sufficient if the wire or filter cloth of the paper machine is combined with an organic polymer sheet materials that can satisfy the conditions associated with yield ratio or water permeation. Incidentally, the organic polymer sheet may be hydrophilicized on the sheet surface by corona discharge treatment or plasma treatment before paper-making, in order to improve the paper-making properties and improve adhesion with the cellulose microfiber sheet.

In order to form pores in the fiber sheet, the method used may be carrying out paper-making on a filter cloth, exchanging the water in the obtained wet web with an organic solvent in an organic solvent exchange step, and drying. The details regarding this method refer to those one described in the pamphlet of International Patent Publication No. 2006/004012 by the present inventors. Specifically, using an organic solvent having a certain degree of solubility for water, during drying after exchange with an organic solvent or the like, will allow a nonwoven fabric with a high void percentage to be obtained by exchange in a single step. Such solvents include, but are not limited to, methyl ethyl ketone, isopropyl alcohol, tert-butyl alcohol and isobutyl alcohol. Using a solvent with higher hydrophobicity will facilitate formation of a nonwoven fabric with a higher void percentage. When exchange is with an organic solvent that does not dissolve in water, such as cyclohexane or toluene, it is effective to use a 2-stage exchange method in which, for example, exchange is first carried out with an organic solvent that dissolves in water, such as acetone, methyl ethyl ketone, isopropyl alcohol or isobutyl alcohol, and then exchange is carried out with a solvent that is water-insoluble, such as cyclohexane or toluene. The solvent used for the method may be a mixed solvent with water, or a mixed solvent with another organic solvent. If the organic solvent-exchanged sheet is subsequently subjected to a drying step, a sheet with a void percentage of 60% to 90% can be obtained.

The drying step will now be explained. The wet web obtained by the paper-making step has a portion of the water evaporated off by heating in a drying step, to form a fiber sheet. From the viewpoint of performing uniform heat treatment and minimizing shrink of the sheet by heating, a fixed-length dry-type dryer such as a drum dryer or pin tenter is preferred. The drying temperature may be appropriately selected according to the conditions, but if it is in the range of preferably 45° C. to 180° C. and more preferably 60° C. to 150° C., it will be possible to produce a homogeneous fiber sheet. A drying temperature of below 45° C. is not preferred because in most cases the water evaporation rate will be slow, making it impossible to guarantee productivity. On the other hand, a drying temperature of higher than 180° C. is also not preferred because the drying speed inside the sheet will vary, wrinkles will form in the sheet, and the energy efficiency will also be poor. Incidentally, multistage drying, in which low-temperature drying at 100° C. or below is followed by high-temperature drying at 100° C. or higher, is effective for obtaining a fiber sheet with high homogeneity.

In the film formation process described above, the filter cloth or plastic wire for paper-making that is used may be one with an endless specification to carry out the entire process with a single wire, or it may be picked up and delivered or transferred midway onto an endless filter or endless felt cloth in a subsequent step, or some or all of the steps of continuous film formation may be roll-to-roll steps using a filter cloth. Naturally, the method of producing the fiber sheet for this embodiment is not limited to these methods.

The smoothing step will now be explained. In the smoothing step that may also be provided, the fiber sheet obtained by the drying step described above is subjected to smoothing treatment with a calender apparatus. By passing through a smoothing step, the fiber sheet can be surface-smoothed and reduced in thickness. The air permeability and strength can also be adjusted at the same time. For example, a fiber sheet with a film thickness of 20 µm or smaller (with a lower limit of about 2 µm), with a basis weight set to 10 g/m² or lower, can be easily produced. The calender apparatus used may be a common calender apparatus with a single press roll, or a supercalender apparatus having a construction in which such rolls are installed in a multistage system. By selecting such an apparatus, and the material (material hardness) of both rolls and the linear pressure during the calendering treatment, according to the purpose, it is possible to obtain a fiber sheet with balance between different properties.

The heat curing step will now be explained. By performing heat treatment on the sheet obtained by the drying step or smoothing step described above, chemical bonds are formed between the blocked polyisocyanate and cellulose microfibers in the sheet. Also proceeding simultaneously are crosslinking between the organic polymer sheet and cellulose microfibers of the multilayer structure, and immobilization of the other additives in the fiber sheet.

From the viewpoint of performing uniform heat treatment and minimizing shrink of the sheet by heating, the heat curing step preferably employs a fixed-length dry-type heat setting machine, of a type that heats while the width is fixed, such as a drum dryer or pin tenter.

As mentioned above, a blocked polyisocyanate is stable at ordinary temperature, but heat treatment at above the dissociation temperature of the blocking agent causes the blocking group to dissociate, regenerating the isocyanate groups, and allowing formation of chemical bonds with the functional groups that have active hydrogens. The heating temperature will differ depending on the blocking agent used, but heating is in the range of preferably 80° C. to 220° C. and more preferably 100° C. to 180° C., at above the dissociation temperature of the blocking groups. If it is below the dissociation temperature of the blocking groups, the isocyanate groups will not regenerate, and crosslinking will not take place. Heating at 220° C. or higher, on the other hand, is not preferred as it may result in heat degradation of the cellulose microfibers or fiber sheet crosslinking agent, and coloration.

The heating time is preferably 15 seconds to 10 minutes and more preferably 30 seconds to 2 minutes. If the heating temperature is sufficiently higher than the dissociation temperature of the blocking groups, it will be possible to further shorten the heating time. Also, with a heating temperature of 130° C. or higher, heating for 2 minutes or longer is not preferred as it will drastically reduce the moisture content of the sheet, causing the sheet to become fragile immediately after heating and sometimes rendering it more difficult to handle.

This heat curing step may be carried out simultaneously with the smoothing treatment described above.

<Resin>

Resins that may be impregnated in the fiber sheet include thermosetting resins and photocurable resins, and such resins that have been thermoset or photocured, as well as thermoplastic resins.

(Thermosetting Resin)

Examples of thermosetting resins that may be impregnated into the fiber sheet include epoxy-based resins, acrylic-based resins, oxetane-based resins, unsaturated polyester-based resins, alkyd-based resins, novolac-based resins, resol-based resins, urea-based resins, melamine-based resins and polyimide-based resins, any of which may be used alone or in combinations of two or more.

For the purpose of providing a thermosetting resin composition with excellent properties, including a higher refractive index, increased curability, increased adhesiveness, increased flexibility of the cured molded article and improved handleability due to a lower viscosity of the thermosetting resin composition, preferably a thermosetting compound suited for the purpose is added to the thermosetting resin. Particularly from the viewpoint of increased adhesiveness, the use of an epoxy-based resin, oxetane-based resin, novolac-based resin or polyimide-based resin, which can chemically bond with the hydroxyl groups on the fiber sheet surface, is preferred as this may be expected to produce an effect of even higher adhesiveness. Their use may be either alone or in mixtures of two or more. The amount of thermosetting compound added is preferably 10 to 1000 parts by weight and more preferably 50 to 500 parts by weight with respect to 100 parts by weight of the fiber sheet. An addition amount of 10 parts by weight or greater is effective for exhibiting thermal stability (having a lower coefficient of linear thermal expansion and retaining elasticity at high temperature), while an addition amount of no greater than 1,000 parts by weight can maintain the high permeability and high heat resistance of the thermosetting resin composition and cured molded article.

Examples of thermosetting resins include epoxy resins that contain aromatic groups with thermal stability at high temperature. Examples of epoxy resins include bifunctional or greater glycidyl ether-type epoxy resins. Examples of glycidyl ether-type epoxy resins include glycidyl ether-type epoxy resins obtained by reaction with bisphenol A, bisphenol F, bisphenol AD, bisphenol S, tetrabromobisphenol A, phenol-novolac, cresol-novolac, hydroquinone, resorcinol, 4,4'-dihydroxy-3,3',5,5'-tetramethylbiphenyl, 1,6-dihydroxynaphthalene, 9,9-bis(4-hydroxyphenyl)fluorene, tris(p-hydroxyphenyl)methane, tetrakis(p-hydroxyphenyl)ethane and epichlorohydrin. Epoxy compounds include epoxy resins with a dicyclopentadiene backbone, epoxy resins with a biphenylaralkyl backbone, and triglycidyl isocyanurate. An aliphatic epoxy resin or alicyclic epoxy resin may also be used, in a range that does not drastically lower the Tg.

A liquid aromatic diamine curing agent may also be added as a curing agent to the thermosetting resin. Here, "liquid" refers to a liquid under conditions of 25° C., 0.1 MPa. An aromatic diamine curing agent means a compound having two amine nitrogen atoms directly bonded to the aromatic ring in the molecule, and multiple active hydrogens. The term "active hydrogen" refers to a hydrogen bonded to an amine nitrogen atom. A liquid aromatic diamine, being liquid, can ensure impregnation into the reinforcing fibers, and being an aromatic diamine, can yield a cured product with a high Tg. Examples of liquid aromatic diamine curing agents include 4,4'-methylenebis(2-ethylaniline), 4,4'-methylenebis(2-isopropylaniline), 4,4'-methylenebis(N-methylaniline), 4,4'-methylenebis(N-ethylaniline), 4,4'-methylenebis(N-sec-butylaniline), N,N'-dimethyl-p-phenylenediamine, N,N'-diethyl-p-phenylenediamine, N,N'-di-sec-butyl-p-phenylenediamine, 2,4-diethyl-1,3-phenylenediamine, 4,6-diethyl-1,3-phenylenediamine, 2,4-diethyl-6-methyl-1,3-phenylenediamine and 4,6-diethyl-2- methyl-1,3-phenylenediamine. These liquid aromatic diamine curing agents may be used alone, or several ones may be used in admixture.

A latent curing agent may also be added as a curing agent to the thermosetting resin. A latent curing agent is a compound that is solid and insoluble in epoxy resins at room temperature, and when heated solubilizes and functions as a curing accelerator, and it may be a solid imidazole compound at ordinary temperature, or a solid dispersed amine adduct-based latent curing accelerator, such as the reaction product of an amine compound with an epoxy compound (amine-epoxy adduct-based) or the reaction product of an amine compound with an isocyanate compound or urea compound (urea-type adduct-based).

Examples of imidazole compounds that are solid at ordinary temperature include 2-heptadecylimidazole, 2-phenyl-4,5-dihydroxymethylimidazole, 2-undecylimidazole, 2-phenyl-4-methyl-5-hydroxymethylimidazole, 2-phenyl-4-benzyl-5-hydroxymethylimidazole, 2,4-diamino-6-(2-methylimidazolyl-(1))-ethyl-S-triazine, 2,4-diamino-6-(2'-methylimidazolyl-(1)')-ethyl-S-triazine.isocyanuric acid addition product, 2-methylimidazole, 2-phenylimidazole, 2-phenyl-4-methylimidazole, 1-cyanoethyl-2-phenylimidazole, 1-cyanoethyl-2-methylimidazole-trimellitate, 1-cyanoethyl-2-phenylimidazole-trimellitate, N-(2-methylimidazolyl-1-ethyl)-urea and N,N'-(2-methylimidazolyl-(1)-ethyl)-adipoyldiamide, with no limitation to these.

Examples of epoxy compounds that may be used as one of the production starting materials for a solid dispersed amine adduct-based latent curing accelerator (amine-epoxy adduct-based) include polyglycidyl ethers obtained by reacting polyhydric phenols such as bisphenol A, bisphenol F, catechol or resorcinol, glycerin, or polyhydric alcohols such as polyethylene glycol, with epichlorhydrin; glycidyl ether esters obtained by reacting hydroxycarboxylic acids such as p-hydroxybenzoic acid or β-hydroxynaphthoic acid with epichlorhydrin; polyglycidyl esters obtained by reacting polycarboxylic acids such as phthalic acid or terephthalic acid with epichlorhydrin; glycidylamine compounds obtained by reacting 4,4'-diaminodiphenylmethane or m-aminophenol with epichlorhydrin; and polyfunctional epoxy compounds such as epoxidated phenol-novolac resins, epoxidated cresol-novolac resins and epoxidated polyolefins, and monofunctional epoxy compounds such as butyl glycidyl ether, phenyl glycidyl ether and glycidyl methacrylate; with no limitation to these.

The amine compound used as one of the production starting materials for a solid dispersed amine adduct-based latent curing accelerator may be one that has in the molecule one or more active hydrogens that can participate in addition reaction with epoxy groups, and that has in the molecule at least one functional group selected from among primary amino groups, secondary amino groups and tertiary amino groups. Examples of such amine compounds include, but are not limited to, the following. Specifically, the examples are aliphatic amines such as diethylenetriamine, triethylenetetramine, n-propylamine, 2-hydroxyethylaminopropylamine, cyclohexylamine and 4,4'-diamino-dicyclohexylmethane; aromatic amine compounds such as 4,4'-diaminodiphenylmethane and 2-methylaniline; and nitrogen-containing heterocyclic compounds such as 2-ethyl-4-methylimidazole, 2-ethyl-4-methylimidazoline, 2,4-dimethylimidazoline, piperidine and piperazine.

A photoacid generator may also be added to the thermosetting resin. The photoacid generator used is one that generates a cationic polymerizable acid under ultraviolet irradiation. Examples of such photoacid generators include onium salts composed of an anion component such as $SbF_6^-$, $PF_6^-$, $BF_4^-$, $AsF_6^-$, $(C_6F_5)_4^-$ or $PF_4(CF_2CF_3)_2^-$, and a cation component (diazonium salts, sulfonium salts, iodonium salts, selenium salts, pyridinium salts, ferrocenium salts and phosphonium salts). These may be used alone or in combinations of two or more. Specifically, aromatic sulfonium salts, aromatic iodonium salts, aromatic phosphonium salts, aromatic sulfoxonium salts and the like may be used. Of these, photoacid generators with hexafluorophosphorate or hexafluoroantimonate as the anion component are preferred from the viewpoint of photocurability and transparency.

The content of the photoacid generator is preferably in the range of 0.5 to 2.0 parts by weight with respect to 100 parts by weight of the epoxy compound. It is more preferably in the range of 0.5 to 1.5 parts by weight. If the content of the photoacid generator is too low, the curability may be impaired, and the heat resistance lowered, while if the content is too high, the curability will be improved but the transparency will be compromised.

If necessary, other additives may be appropriately added to the thermosetting resin, in addition to the components mentioned above. For example, a photosensitizer such as anthracene or an acid amplifier may be added if necessary for the purpose of increasing the curability. For purposes in which a cured product is to be formed on a substrate such as glass, a silane-based or titanium-based coupling agent may be added to increase adhesion with the substrate. In addition, an antioxidant, antifoaming agent or the like may be added as appropriate. They may be used alone or in combinations of two or more. These other additives are preferably used in ranges of no greater than 5 wt % of the total curable resin composition, from the viewpoint of not interfering with the function and effect of the invention.

Polyimide-based resins may be mentioned as examples of thermosetting resins from the viewpoint of mechanical properties such as electrical insulation reliability and bending resistance, and of heat resistance and chemical resistance. A polyimide-based resin is a polyimide formed by imidation, and it refers not only to polyamic acid alone, but also to one wherein part of the polyamic acid is imidized.

The polyimide precursor that is to form the polyimide may be obtained, for example, by reacting a tetracarboxylic dianhydride and diamine. There are no restrictions on the tetracarboxylic dianhydride used, and a tetracarboxylic dianhydride known in the prior art may be used. An aromatic tetracarboxylic acid or an aliphatic tetracarboxylic dianhydride may be employed as the tetracarboxylic dianhydride. There are also no restrictions on the diamine used, and a diamine that is known in the prior art may be used.

Tetracarboxylic dianhydrides include biphenyl-3,3',4,4'-tetracarboxylic dianhydride (hereunder abbreviated as "BPDA"), benzophenone-3,3',4,4'-tetracarboxylic dianhydride (hereunder abbreviated as "BTDA", oxydiphthalic dianhydride (hereunder abbreviated as "ODPA"), diphenylsulfone-3,3',4,4'-tetracarboxylic dianhydride, ethyleneglycol bis(trimellitic acid monoester acid anhydride) (hereunder abbreviated as "TMEG"), p-phenylenebis(trimellitic acid monoester acid anhydride), p-biphenylenebis(trimellitic acid monoester acid anhydride), m-phenylenebis(trimellitic acid monoester acid anhydride), o-phenylenebis(trimellitic acid monoester acid anhydride), pentanediolbis(trimellitic acid monoester acid anhydride) (hereunder abbreviated as "5-BTA"), decanediolbis(trimellitic acid monoester acid anhydride), pyromellitic anhydride, bis(3,4-dicarboxyphenyl)ether dianhydride, 4,4'-(2,2-hexafluoroisopropylidene)diphthalic dianhydride, meta-terphenyl-3,3',4,4'-tetracarboxylic dianhydride, 1,2,4,5- cyclohexanetetracarboxylic dianhydride, bicyclo[2,2,2]oct-7-ene-2,3,5,6-tetracarboxylic dianhydride, cyclobutane-1,2,3,4-tetracarboxylic dianhydride, 1-carboxymethyl-2,3,5-cyclopenta-2 tricarboxylate, 6:3,5-dianhydride, 4-(2,5-dioxotetrahydrofuran-3-yl)-1,2,3,4-tetrahydronaphthalene-1,2-dicarboxylic anhydride and 5-(2,5-dioxotetrahydrofuryl)-3-methyl-3-cyclohexene-1,2-dicarboxylic anhydride. These tetracarboxylic dianhydrides may be used alone or in mixtures of two or more. From the viewpoint of the developability of the polyimide precursor, BPDA, ODPA, BTDA, TMEG, 5-BTA and decanediolbis (trimellitic acid monoester acid anhydride) are more preferred.

Diamines include 1,3-bis(4-aminophenoxy)alkane, 1,4-bis(4-aminophenoxy)alkane, 1,5-bis(4-aminophenoxy)alkane, 1,4-diaminobenzene, 1,3-diaminobenzene, 2,4-diaminotoluene, 4,4'-diaminodiphenylmethane, 4,4'-diaminodiphenyl ether, 3,4'-diaminodiphenyl ether, 3,3'-dimethyl-4,4'-diaminobiphenyl, 2,2'-dimethyl-4,4'-diaminobiphenyl, 2,2'-bis(trifluoromethyl)-4,4'-diaminobiphenyl, 3,7-diamino-dimethyldibenzothiophene-5,5-dioxide, 4,4'-diaminobenzophenone, 3,3'-diaminobenzophenone, 4,4'-bis(4-aminophenyl)sulfide, 4,4'-diaminobenzanilide, 1,3-bis(4-aminophenoxy)-2,2-dimethylpropane, 1,2-bis[2-(4-aminophenoxy)ethoxy]ethane, 9,9-bis(4-aminophenyl)fluorene, 5-amino-1-(4-aminomethyl)-1,3,3-trimethylindane, 1,4-bis(4-aminophenoxy)benzene, 1,3-bis(4-aminophenoxy)benzene, 1,3-bis(3-aminophenoxy)benzene (hereunder abbreviated as "APB"), 4,4'-bis(4-aminophenoxy)biphenyl, 4,4'-bis(3-aminophenoxy)biphenyl, 2,2-bis(4-aminophenoxyphenyl)propane (hereunder abbreviated as "BAPP"), trimethylene-bis(4-aminobenzoate) (hereunder abbreviated as "TMAB"), 4-aminophenyl-4-aminobenzoate, 2-methyl-4-aminophenyl-4-aminobenzoate, bis[4-(4-aminophenoxy)phenyl]sulfone, bis[4-(3-aminophenoxy)phenyl]sulfone, 2,2-bis[4-(4-aminophenoxy)phenyl]hexafluoropropane, 1-amino-3-aminomethyl-3,5,5-trimethylcyclohexane, 3,3'-dicarboxy-4,4'-diaminodiphenylmethane, 3,5-diaminobenzoic acid, 3,3'-dihydroxy-4,4'-diaminobiphenyl and 1,3-bis(4-aminophenoxybenzene). Of these, APB, BAPP and TMAB are preferred from the viewpoint of lowering the glass transition point (Tg) of the polyimide precursor and improving the developability. These diamines may also be used as diamine components to be used for synthesis of polyimide structures in the polyimide precursors mentioned below.

The main chain ends of the polyimide precursor are not particularly restricted so long as the structure does not affect the performance. It may be an end structure derived from the acid dianhydride or diamine used to produce the polyimide precursor, or it may be a structure having the ends sealed with another acid anhydride or an amine compound.

(Photocurable Resin)

Photocurable resins that may be impregnated into the fiber sheet include compounds having one or more (meth)acryloyl groups in each molecule.

It is preferred to add to the photocurable resin a compound having one or more (meth)acryloyl groups in each molecule, as suitable for the purpose, in order to provide a photosensitive resin composition having excellent properties including a higher refractive index, improved curability, increased adhesiveness, increased flexibility for cured molded articles, and improved handleability due to lower viscosity of the photosensitive resin composition. Their use may be either alone or in mixtures of two or more. The amount of addition of the compound having one or more (meth)acryloyl groups in each molecule is preferably 10 to 1,000 parts by weight and more preferably 50 to 500 parts by weight, with respect to 100 parts by weight of the fiber sheet. An addition amount of 10 parts by weight or greater is effective for exhibiting thermal stability (a lower coefficient of linear thermal expansion and retaining elasticity at high temperature), while an addition amount of no greater than 1,000 parts by weight can maintain the high permeability and high heat resistance of the photosensitive resin composition and cured molded article.

Examples of photocurable resins include (meth)acrylate compounds containing aromatic groups with thermal stability at high temperature. Preferred examples of (meth)acrylate compounds include phenoxyethyl acrylate, paraphenylphenoxyethyl acrylate (ARONIX TO-1463 by Toagosei Co., Ltd.), paraphenylphenyl acrylate (ARONIX TO-2344 by Toagosei Co., Ltd.), phenyl glycidyl ether acrylate (hereunder also referred to as "PGEA"), benzyl (meth)acrylate, phenoxydiethylene glycol (meth)acrylate, phenol (meth)acrylate modified with 3 to 15 moles of ethylene oxide, cresol (meth)acrylate modified with 1 to 15 moles of ethylene oxide, nonylphenol (meth)acrylate modified with 1 to 20 moles of ethylene oxide, nonylphenol (meth)acrylate modified with 1 to 15 moles of propylene oxide, bisphenol A di(meth)acrylate modified with 1 to 30 moles of ethylene oxide, bisphenol A di(meth)acrylate modified with 1 to 30 moles of propylene oxide, bisphenol F di(meth)acrylate modified with 1 to 30 moles of ethylene oxide, and bisphenol F di(meth)acrylate modified with 1 to 30 moles of propylene oxide. A (meth)acrylate compound may be used alone, or two or more may be used in admixture.

The photocurable resin preferably includes a photopolymerization initiator for photosensitive pattern formation.

The following photopolymerization initiators (1) to (10) may be mentioned for the photopolymerization initiator (C):

(1) Benzophenone derivatives: For example, benzophenone, methyl o-benzoylbenzoate, 4-benzoyl-4'-methyldiphenyl ketone, dibenzyl ketone and fluorenone, (2) Acetophenone derivatives: For example, 2,2'-diethoxyacetophenone, 2-hydroxy-2-methylpropiophenone, 2,2-dimethoxy-1,2-diphenylethan-1-one (IRGACURE651 by BASF), 1-hydroxycyclohexylphenyl ketone (IRGACURE184 by BASF), 2-methyl-1-[4-(methylthio)phenyl]-2-morpholinopropan-1-one (IRGACURE907 by BASF)2-hydroxy-1-{4-[4-(2-hydroxy-2-methylpropionyl)-benzyl]-phenyl}-2-methylpropan-1-one (IRGACURE127 by BASF) and phenylmethyl glyoxylate, (3) Thioxanthone derivatives: For example, thioxanthone, 2-methylthioxanthone, 2-isopropylthioxanthone and diethylthioxanthone, (4) Benzyl derivatives: For example, benzyl, benzyldimethylketal and benzyl-β-methoxyethylacetal, (5) Benzoin derivatives: For example, benzoin, benzoinmethyl ether and 2-hydroxy-2-methyl-1phenylpropan-1-one (DAROCURE1173 by BASF), (6) Oxime-based compounds: For example, 1-phenyl-1,2-butanedione-2-(O-methoxycarbonyl)oxime, 1-phenyl-1,2-propanedione-2-(O-methoxycarbonyl)oxime, 1-phenyl-1,2-propanedione-2-(O-ethoxycarbonyl)oxime, 1-phenyl-1,2-propanedione-2-(O-benzoyl)oxime, 1,3-diphenylpropanetrione-2-(O-ethoxycarbonyl)oxime, 1-phenyl-3-ethoxypropanetrione-2-(O-benzoyl)oxime, 1,2-octanedione, 1-[4-(phenylthio)-2-(O-benzoyloxime)] (IRGACURE OXE01 by BASF), ethanone and 1-[9-ethyl-6-(2-methylbenzoyl)-9H-carbazol-3-yl]-,1-(O-acetyloxime) (IRGACURE OXE02 by BASF), (7) α-Hydroxyketone-based compounds: For example, 2-hydroxy-2-methyl-1-phenylpropan-1-one, 1-[4-(2-hydroxyethoxy)phenyl]-2-hydroxy-2-methyl-1-propan-1-one and 2-hydroxy-1-{4-[4-(2-hydroxy-2-methylpropionyl)-benzyl]phenyl}-2-methylpropane, (8) α-Aminoalkylphenone-based compounds: For example, 2-benzyl-2-dimethylamino-1-(4-morpholinophenyl)-butanone-1 (IRGACURE369 by BASF) and 2-dimethylamino-2-(4-methylbenzyl)-1-(4-morpholin-4-yl-phenyl)butan-1-one (IRGACURE379 by BASF), (9) Phosphine oxide-based compounds: For example, bis(2,4,6-trimethylbenzoyl)-phenylphosphine oxide (IRGACURE819 by BASF) and bis(2,6-dimethoxybenzoyl)-2,4,4-trimethyl-pentylphosphine oxide, 2,4,6-trimethylbenzoyl-diphenyl-phosphine oxide (LUCIRIN TPO by BASF), and

(10) Titanocene compounds: For example, bis(η5-2,4-cyclopentadien-1-yl)-bis(2,6-difluoro-3-(1H-pyrrol-1-yl)phenyl)titanium (IRGACURE784 by BASF).

The photopolymerization initiators of (1) to (10) above may each be used alone, or two or more may be used in combination.

The content of the photopolymerization initiator, based on the weight of all of the components other than the solvent in the photosensitive resin composition, is preferably 0.01 weight % or greater and more preferably 0.1 weight %, from the viewpoint of obtaining adequate sensitivity, and also preferably no greater than 15 weight % and more preferably no greater than 10 weight %, from the viewpoint of adequately curing the bottom portion of the photosensitive resin layer.

A sensitizing agent may be added to the photocurable resin for improved photosensitivity, as desired. Examples of such sensitizing agents include Michler's ketone, 4,4'-bis(diethylamino)benzophenone, 2,5-bis(4'-diethylaminobenzylidene)cyclopentanone, 2,6-bis(4'-diethylaminobenzylidene)cyclohexanone, 2,6-bis(4'-dimethylaminobenzylidene)-4-methylcyclohexanone, 2,6-bis(4'-diethylaminobenzylidene)-4-methylcyclohexanone, 4,4'-bis(dimethylamino)chalcone, 4,4'-bis(diethylamino)chalcone, 2-(4'-dimethylaminocinnamylidene)indanone, 2-(4'-dimethylaminobenzylidene)indanone, 2-(p-4'-dimethylaminobiphenyl)benzothiazole, 1,3-bis(4-dimethylaminobenzylidene)acetone, 1,3-bis(4-diethylaminobenzylidene)acetone, 3,3'-carbonyl-bis(7-diethylaminocoumarin), 3-acetyl-7-dimethylaminocoumarin, 3-ethoxycarbonyl-7-dimethylaminocoumarin, 3-benzyloxycarbonyl-7-dimethylaminocoumarin, 3-methoxycarbonyl-7-diethylaminocoumarin, 3-ethoxycarbonyl-7-diethylaminocoumarin, N-phenyl-N-ethylethanolamine, N-phenyldiethanolamine, N-p-tolyldiethanolamine, N-phenylethanolamine, N,N-bis(2-hydroxyethyl)aniline, 4-morpholinobenzophenone, isoamyl 4-dimethylaminobenzoate, isoamyl 4-diethylaminobenzoate, benztriazole, 2-mercaptobenzimidazole, 1-phenyl-5-mercapto-1,2,3,4-tetrazole, 1-cyclohexyl-5-mercapto-1,2,3,4-tetrazole, 1-(tert-butyl)-5-mercapto-1,2,3,4-tetrazole, 2-mercaptobenzothiazole, 2-(p-dimethylaminostyryl)benzoxazole, 2-(p-dimethylaminostyryl)benzthiazole, 2-(p-dimethylaminostyryl)naphtho(1,2-p)thiazole and 2-(p-dimethylaminobenzoyl)styrene. Their use may be either alone or in mixtures of two or more.

A polymerization inhibitor may be added to the photosensitive resin composition to increase the viscosity during storage or the photosensitivity stability, as desired. Examples of such polymerization inhibitors that may be used include hydroquinone, N-nitrosodiphenylamine, p-tert-butylcatechol, phenothiazine, N-phenylnaphthylamine, ethylenediaminetetraacetic acid, 1,2-cyclohexanediaminetetraacetic acid, glycol etherdiaminetetraacetic acid, 2,6-di-tert-butyl-p-methylphenol, 5-nitroso-8-hydroxyquinoline, 1-nitroso-2-naphthol, 2-nitroso-1-naphthol, 2-nitroso-5-(N-ethyl-N-sulfopropylamino)phenol, N-nitroso-N-phenylhydroxyamine ammonium salt, N-nitroso-N-phenylhydroxylamine ammonium salt, N-nitroso-N-(1-naphthyl)hydroxylamine ammonium salt and bis(4-hydroxy-3,5-di-tert-butyl)phenylmethane.

Various other additives may be added to the photosensitive resin composition of the invention as appropriate, in addition to those mentioned above, including ultraviolet absorbers and coating film smoothing agents as necessary, so long as they do not interfere with the properties of the photosensitive resin composition.

(Thermoplastic Resin)

The resin that can be impregnated into the fiber sheet may also be a thermosetting resin or photocurable resin, but it is preferred to use a thermoplastic resin from the standpoint of impregnating the resin in a short period of time by injection molding into a sheet-like substrate, for mass molding of products, and from the standpoint of being more easily adaptable to various cast shapes. There are no particular restrictions on the thermoplastic resin used, and examples include commodity plastics, such as polyolefins (polyethylene, polypropylene), ABS, polyamide (nylon 6, nylon 6,6), polyesters, polyphenylene ethers, polyacetals, polycarbonates, polyphenylene sulfides, polyimides, polyetherimides, polyether sulfones, polyketones, polyether ether ketones and polystyrenes, of which combinations may also be used.

(Solvent)

A solvent may be added if necessary during resin impregnation into the fiber sheet, to adjust the viscosity. Suitable solvents include N,N-dimethylformamide, N-methyl-2-pyrrolidone, N-ethyl-2-pyrrolidone, tetrahydrofuran, N,N-dimethylacetamide, dimethyl sulfoxide, hexamethylphosphoramide, pyridine, cyclopentanone, γ-butyrolactone, α-acetyl-γ-butyrolactone, tetramethylurea, 1,3-dimethyl-2-imidazolinone, N-cyclohexyl-2-pyrrolidone, propyleneglycol monomethyl ether, propyleneglycol monomethyl ether acetate, methyl ethyl ketone, methyl isobutyl ketone, anisole, ethyl acetate, ethyl lactate and butyl lactate, which may be used alone or in combinations of two or more. Particularly preferred among these are N-methyl-2-pyrrolidone, γ-butyrolactone and propyleneglycol monomethyl ether acetate. These solvents may be added as appropriate during resin impregnation into the fiber sheet, depending on the coated film thickness and viscosity.

<Inorganic Filler>

The resin composite film of this embodiment preferably further includes an inorganic filler. The inorganic filler may be included in the resin that is to be impregnated into the fiber sheet. An inorganic filler may be added from the viewpoint of lowering the coefficient of linear thermal expansion in the thickness direction of the resin composite film, and from the viewpoint of reducing the difference in the coefficients of linear thermal expansion in the plane (XY direction) and the thickness direction. If the resin composite film contains an inorganic filler, the thermal stability of the resin (coefficient of linear thermal expansion and elasticity retention at high temperature) can be increased.

Examples of inorganic fillers include alumina, magnesia, titania, zirconia, silica (quartz, fumed silica, sedimentary silica, silicic anhydride, molten silica, crystalline silica or ultrafine powdered amorphous silica) and aluminum hydroxide, which have excellent heat resistance; boron nitride, aluminum nitride, aluminium oxide, titanium oxide, magnesium oxide, zinc oxide and silicon oxide, which have excellent thermal conductivity; metal fillers and/or metal-coated fillers using simple metals or alloys (for example, iron, copper, magnesium, aluminum, gold, silver, platinum, zinc, manganese or stainless-steel), which have excellent conductivity; minerals such as mica, clay, kaolin, talc, zeolite, wollastonite or smectite, or potassium titanate, magnesium sulfate, sepiolite, zonolite, aluminum borate, calcium oxide, titanium oxide, barium sulfate, zinc oxide and magnesium hydroxide, which have excellent barrier properties; barium titanate, zirconia oxide and titanium oxide, which have high refractive indexes; photocatalytic metals such as titanium, cerium, zinc, copper, aluminum, tin, indium, phosphorus, carbon, sulfur, tellurium, nickel, iron, cobalt, silver, molybdenum, strontium, chromium, barium or lead, and complexes of these metals, and their oxides, which exhibit photocatalytic properties; metals such as silica, alumina, zirconia or magnesium, and their complexes and oxides, which have excellent abrasion resistance; metals such as silver or copper, and tin oxide and indium oxide, which have excellent conductivity; silica, which has excellent insulating properties; and titanium oxide and zinc oxide, which have excellent ultraviolet shielding properties. These inorganic fillers may be selected as appropriate for the purpose of use and may be used alone or in combinations of different types. In addition, since the aforementioned inorganic fillers have various properties in addition to those mentioned as examples, they may be selected as appropriate for the purpose.

For example, when silica is to be used as the inorganic filler, publicly known silica fine particles such as powdered silica or colloidal silica may be used, without any particular restrictions. Examples of commercially available powdered silica fine particles include AEROSIL 50 and 200 by Nippon Aerosil Co., Ltd., SHIELDEX H31, H32, H51, H52, H121 and H122 by Asahi Glass Co., Ltd., E220A and E220 by Nippon Silica Industries Co., Ltd., SYLYSIA470 by Fuji Silysia Chemical, Ltd. and SG FLAKES by Nippon Sheet Glass Co., Ltd. Examples of commercially available colloidal silica include methanol silica sol, IPA-ST, PGM-ST, NBA-ST, XBA-ST, DMAC-ST, ST-UP, ST-OUP, ST-20, ST-40, ST-C, ST-N, ST-O, ST-50 and ST-OL by Nissan Chemical Industries, Ltd.

Surface-modified silica fine particles may also be used, and for example, the silica fine particles may be surface-treated with a reactive silane coupling agent having a hydrophobic group or modified with a compound having a (meth)acryloyl group. Commercially available powdered silica products modified with a compound having a (meth)acryloyl group include AEROSIL RM50, R7200 and R711 by Nippon Aerosil Co., Ltd., commercially available colloidal silica products modified with a compound having a (meth)acryloyl group include MIBK-SD and MEK-SD by Nissan Chemical Industries, Ltd., and colloidal silica products surface-treated with a reactive silane coupling agent having a hydrophobic group include MIBK-ST and MEK-ST by Nissan Chemical Industries, Ltd.

The form of the silica fine particles is not particularly restricted, and spherical, hollow, porous, rod-shaped, lamellar, filamentous or amorphous forms may be used. For example, SILINAX® by Nittetsu Mining Co., Ltd. may be used as commercially available hollow silica fine particles.

The primary particle diameter of the inorganic filler is preferably in the range of 5 to 2,000 nm. If it is 5 nm or greater, dispersion of the inorganic filler in the dispersion will be satisfactory, and if the size is within 2,000 nm, the strength of the cured product will be satisfactory. It is more preferably 10 nm to 1,000 nm. The "particle diameter" referred to here is measured using a scanning electron microscope (SEM). If the overcoat layer is to be controlled to as thin as 30 μm or smaller, the primary particle diameter of the inorganic filler is preferably no greater than 2,000 nm from the viewpoint of film thickness control.

The inorganic filler is preferably included so as to occupy a proportion of 5 to 50% of the area ratio in scanning electron microscope (SEM) observation of a cross-section of the resin composite film in the thickness direction. In the case of a heat-resistant material, for example, the inorganic filler percentage is preferably 10 to 45%, in order to obtain both a low linear expansion coefficient and high strength for the cured product.

Based on image analysis of modulus mapping, described below, it is possible to calculate the area ratio of the entire cross-section of the resin composite film that is occupied by the inorganic filler.

In image analysis of the modulus mapping, the area ratio of the entire cross-section of the resin composite film occupied by the inorganic filler is preferably 5% to 50% and more preferably 10% to 45%. If the inorganic filler occupies 5% or more of the entire cross-section of the resin composite film, the coefficient of linear thermal expansion in the thickness direction of the resin composite film will be lower and the difference between the coefficients of linear thermal expansion in the planar direction and the thickness direction will also be reduced, thus minimizing warping at high temperature. If the inorganic filler occupies no more than 45% of the entire cross-section of the resin composite film, then the impregnated resin will maintain the strength of the composite film and the bending stress will be higher, resulting in excellent handleability.

If the resin composite film includes the aforementioned inorganic filler, it may include the inorganic filler in the cellulose microfiber layer of the resin composite film, as defined by the method described in the Examples below. When the cellulose microfiber layer includes the inorganic filler, preferably no more than 20% and more preferably no more than 10% of the inorganic filler is included in the cellulose microfiber layer. If no more than 20% of the inorganic filler is included in the cellulose microfiber layer, the inorganic filler will function as a reinforcing material in the cellulose microfiber layer, and when the remaining inorganic filler is relatively unevenly distributed in the overcoat layer, a circuit embedding property and thermal shock resistance will be more satisfactorily obtained, the impact resistance and flexibility will be more excellent, and a laminate more resistant to breakage can be provided when it is mounted in an on-vehicle electronic component, a smartphone or electronic paper, without any limitation to these.

<Modulus Mapping>

The features of the fiber sheet and resin (and inorganic filler) in the resin composite film (fiber diameter and content, void percentage (void volume), etc.) can be determined using an atomic force microscope (AFM), as a type of scanning probe microscope (SPM), contacting the probe at the tip of the cantilever with a cross-section of the resin composite film, measuring the elastic modulus with a pressing force of 0.4 N/m as the spring constant, drawing the obtained modulus mapping, and performing calculation from image analysis of the modulus mapping.

The elastic modulus is determined at different points of the sample, setting the upper and lower limits for the distance between the probe at the cantilever tip of the AFM and the sample, while moving a fixed point vertically, and determining the value based on the amount of deflection read off from the relationship between the distance between the probe and the sample and the working force on the cantilever (i.e., the degree of deflection of the cantilever), and on the spring constant of the cantilever, according to Hooke's law.

Measurement of the elastic modulus with an atomic force microscope shows the degree of deformation of a cross-section of the resin composite film by pressing force, and therefore allows components with different elastic moduli (the fiber sheet, resin and inorganic filler) to be observed. Image analysis of the obtained modulus mapping allows calculation of the average fiber diameter and maximum fiber diameter of the fibers composing the fiber sheet, the thickness of the overcoat resin layer and the area ratio of each component.

<Area Ratio of Fibers Composing Fiber Sheet>

In image analysis of the modulus mapping, the area ratio of fibers composing the fiber sheet occupying the entire cross-section of the resin composite film is preferably 5% to 60%, more preferably 5% to 55% and even more preferably 10% to 55%. If the cellulose microfibers occupy at least 5% of the entire cross-section of the resin composite film, then the cellulose microfibers will more easily adopt a nano network structure due to hydrogen bonding, thermal expansion of the resin composite film at high temperature will be inhibited, warping of the resin composite film will be reduced and the thermal stability will be increased. If the cellulose microfibers occupy no more than 60% of the entire cross-section of the resin composite film, then the impregnated resin will maintain the strength of the composite film and the bending stress will be higher, resulting in excellent handleability.

<Void Percentage of Fiber Sheet in Resin Composite Film>

The percentage of voids of the fiber sheet inside the resin, when the resin composite film has been formed, can be calculated from the ratio between the area of the fibers composing the fiber sheet, as calculated from image analysis of the modulus mapping, and the area of the resin between the fibers composing the fiber sheet, as calculated in the same manner.

The percentage of voids of the fiber sheet inside the resin is preferably 35% to 95%, more preferably 35% to 80% and most preferably 35% to 50%. A void percentage of 35% or higher is preferred because it will facilitate impregnation of the resin. A void percentage of no greater than 95% is preferred from the viewpoint of increased heat resistance of the resin composite film.

By lowering the void percentage and increasing the fiber sheet content, it is possible to contribute to preventing warping or peeling and increasing the thermal shock resistance at low temperatures in an electronic device when the sheet is used as an electronic material, under harsh conditions of 150° C. or higher and under high-humidity conditions.

<Average Fiber Diameter of Fibers Composing Fiber Sheet>

The average fiber diameter of the fibers composing the fiber sheet in the resin composite film, is 0.01 µm to 2.0 µm, as calculated from image analysis of the modulus mapping. The average fiber diameter of the fibers composing the fiber sheet is preferably 0.02 µm to 1.5 µm and more preferably 0.02 µm to 1.0 µm.

The average fiber diameter of the fibers composing the fiber sheet is calculated by the following formula (1), using the total area $\Sigma Sf$ and total circumference $\Sigma Lf$ of the fiber component in the resin composite film, as calculated from image analysis of the modulus mapping.

$$\text{Average fiber diameter of fibers composing the fiber sheet} = 4 \times \Sigma Sf / \Sigma Lf \quad (1)$$

Here, the total area $\Sigma Sf$ may also serve as a parameter indicating the filling factor of the microfibers per unit area. The total circumference $\Sigma Lf$ may also serve as a parameter indicating the degree of dispersion of the microfibers. It is preferred if the total area $\Sigma Sf$ is at least a given value and the total circumference $\Sigma Lf$ is at least a given value, as it indicates a state in which the microfibers have high density and are uniformly dispersed.

<Maximum Fiber Diameter of Fibers Composing Fiber Sheet>

The maximum fiber diameter of the fibers composing the fiber sheet is calculated as the particle diameter where the cellulose microfiber diameters are considered to be perfect circles, from image analysis of the modulus mapping, with the largest particle diameter being used as the maximum fiber diameter of the fibers composing the fiber sheet.

The maximum fiber diameter of the fibers composing the fiber sheet in the resin composite film is 15 µm or smaller, as calculated from image analysis of the modulus mapping. The maximum fiber diameter of the fibers composing the fiber sheet is preferably 10 µm or smaller, more preferably 5 µm or smaller and even more preferably 3 µm or smaller. It is preferred if the maximum fiber diameter of 15 µm or smaller, because the thickness of the fiber sheet can be reduced, and the homogeneity of diameter can be easily ensured when producing a thin resin composite film. The method for calculating the maximum fiber diameter of the fibers composing the fiber sheet from image analysis of the modulus mapping is explained below under "Examples".

<Voids>

In image analysis of the modulus mapping, the void percentage (void volume) occupying the entire cross-section of the resin composite film is preferably no greater than 10%, more preferably no greater than 5%, even more preferably no greater than 3% and most preferably no greater than 2%. If the void percentage (void volume) occupies no greater than 10% of the entire cross-section of the resin composite film, then the strength of the resin film will be increased and the moisture proofness will also be excellent.

<Overcoat Resin Layer>

The resin composite film of this embodiment has a resin layer (overcoat resin layer) of fixed thickness on the surface layer. The overcoat resin layer is a layer of a resin formed on the surface layer of the resin composite film, and it is the section not including the fiber sheet. The overcoat resin layer may be formed on only one side or on both sides of the resin composite film.

The average thickness of the overcoat resin layer is 0.3 µm to 100 µm, preferably 0.3 µm to 30 µm, more preferably 0.3 µm to 20 µm and even more preferably 0.3 µm to 10 µm on at least one side of the resin composite film, from the viewpoint of moisture proofness or water resistance, acid resistance and alkali resistance of the fiber sheet, and from the viewpoint of containing the fiber layer inside the overcoat resin layer, uniformly filling the fiber layer and stabilizing the coefficient of linear thermal expansion. If the thickness of the overcoat resin layer is at least 0.3 µm on at least one side of the resin composite film, then it will be possible to ensure the laminating property of the resin composite film as an insulating layer onto an inner layer circuit board, adhesiveness with the inner layer circuit, and embeddability. If the thickness of the overcoat resin layer is 100 µm or smaller, then the heat resistance and thermal impact strength of the resin composite film can be ensured. The average thickness of the overcoat resin layer is measured by the method described below in the Examples.

<Surface Roughness>

The resin composite film of this embodiment has excellent bonding strength (peel strength) with electrodes, by control of the surface roughness of the resin layer serving as the surface layer. The surface roughness of the resin composite film is preferably 0.1 µm to 2.0 µm, more preferably 0.2 µm to 1.5 µm and even more preferably 0.3 µm to 1.2 µm, from the viewpoint of adhesion with electrodes.

When surface roughness is provided, it is preferably of smaller size than the thickness of the overcoat resin layer.

In particular, if the average thickness of the overcoat resin layer of the resin composite film, calculated by the modulus mapping, is 0.8 µm to 30 µm on at least one side of the resin composite film and the surface roughness of the resin composite film is 0.1 µm to 2.0 µm, then the resin composite film will have excellent moisture proofness, bonding strength with electrodes and heat resistance (low warping during heating), and especially it can increase electronic device reliability when applied in an on-vehicle electronic device.

The means for controlling the surface roughness is not particularly restricted so long as it is a method of roughening a resin, and it may be plasma treatment, or treatment with an etching solution or desmear solution comprising an aqueous acid/alkali solution.

The surface roughness of the resin composite film is measured by the method described below in the Examples.

The apparatus used for measurement of the surface roughness may be an "OPTELICS S130" laser microscope by Lasertec Corp., a "VK-X250/260" laser microscope by Keyence Corp., an "OLS3000" laser microscope by Olympus Corp., or the like.

<Interface Fractal Dimension>

In addition to specifying the range of the fine rough shape on the surface of the resin composite film of this embodiment by the surface roughness value, the fine rough shape of the surface can also be quantified by the interface fractal dimension. The interface structure between the insulating layer and the metal surface roughened layer, which appears when the resin composite film is cleaved in the normal direction, is a fractal shape, and the fractal dimension of the interface structure is preferably 1.05 to 1.50 and more preferably 1.1 to 1.4, as calculated by applying the box count method with the box size set to 50 nm to 5 µm and the pixel size set to 1/100 or smaller. By satisfying this condition, the metal layer laminate of the invention obtained by the production method of the invention will have surface smoothness that does not affect functions of a wiring which is affected by the macro surface irregularities of the metal layer, while having a complex surface texture on the micro level, and it will therefore be useful for formation of wirings for multilayer boards and the like. Moreover, when a resin layer is formed on the surface of the metal layer laminate of the invention, both will exhibit excellent adhesiveness.

<Surface Maximum Cross-Section Height (Rt) of Resin Composite Film>

The maximum cross-section height (Rt) of the surface of the resin composite film of this embodiment is the difference between maximum height and minimum height of the irregularities on the surface of the resin composite film, when the resin composite film has been laminated on a circuit board comprising electrodes and the like. The surface of the laminated resin composite film has corrugations corresponding to surface irregularities arising from the electrode wiring of the inner layer circuit board, and it tends to be difficult to obtain an insulating layer with a smooth surface.

From the viewpoint of fine wiring pattern formability on the resin composite film surface, the maximum cross-section height (Rt) is preferably smaller than 3 µm and more preferably 2.5 µm or smaller. The lower limit for the maximum cross-section height (Rt) is not particularly restricted but will usually be 0.1 µm or larger. The maximum cross-section height (Rt) of the insulating layer surface can be measured using a non-contact surface roughness meter, on the exposed surface of the insulating layer after the carrier film has been released.

<Coefficient of Linear Thermal Expansion CTE200>

The coefficient of linear thermal expansion on the X-Y plane at 200° C. (CTE200) of the resin composite film is preferably 100 ppm/° C. or smaller, more preferably 80 ppm/° C. or smaller and even more preferably 60 ppm/° C. or smaller, from the viewpoint of preventing warping and peeling in electronic devices when the film is used as an electronic material. The X-Y plane referred to here is the plane defined by two components in the lengthwise direction and widthwise direction of the resin composite film. The coefficient of linear thermal expansion is measured according to the method described below in the Examples.

The value of |CTE150-CTE200|, which is the difference (absolute value) between the coefficient of linear thermal expansion on the X-Y plane at 150° C. (CTE150) and the coefficient of linear thermal expansion on the X-Y plane at 200° C. (CTE200), is preferably 40 ppm/° C. or smaller, more preferably 30 ppm/° C. or smaller and even more preferably 20 ppm/° C. or smaller, from the viewpoint of preventing warping and peeling in electronic devices when the film is used as an electronic material. The reason for being specified as an absolute value is in order to include cases where the CTE does not necessarily increase as the temperature rises.

If the difference between the coefficients of linear thermal expansion of the X-Y plane (absolute value) |CTE150-CTE200| can be controlled to the range of 40 ppm/° C. or smaller and the number-average fiber diameter of the cellulose microfibers is 0.01 µm to 2.0 µm, then the voids will be maintained, while the number of cellulose microfibers per unit weight of the cellulose microfiber sheet will be extremely large, causing the number of confounded points between the microfibers to increase, and allowing a hydrogen bonded network to be easily formed between the microfibers. This is preferred because, during compositing with the resin, the effect will maintain intertwining of the microfibers and the hydrogen bonded network between the microfibers even in the resin and will contribute to stabilization of the coefficient of linear thermal expansion at high temperature.

In particular, if the average thickness of the overcoat resin layer of the resin composite film calculated from modulus mapping is 0.3 µm to 30 µm on at least one side of the resin composite film, the coefficient of linear thermal expansion on the X-Y plane at 200° C. (CTE200) is 100 ppm/° C. or smaller and the absolute value of the difference between the coefficient of linear thermal expansion on the X-Y plane at 150° C. (CTE150) and the coefficient of linear thermal expansion on the X-Y plane at 200° C. (CTE200) is 40 or smaller, then a resin composite film will be provided that can be stably used in highly integrated, high density circuits, even with use in unprecedentedly unsuitable high-temperature environments, and more specifically, it will be possible to provide a resin composite film that, when used as an electronic material, can prevent warping or peeling in electronic devices under harsh conditions of 150° C. or higher.

<Thickness>

The shape of the resin composite film is not particularly restricted and may be lamellar, a shape with non-uniform thickness (having steps or corrugations), a shape with a curved surface or a shape with holes.

The average thickness of the resin composite film is preferably 5 μm to 1500 μm, more preferably 6 μm to 1000 μm and even more preferably 7 μm to 500 μm.

<Moisture Absorption Ratio>

The moisture absorption ratio of the resin composite film is preferably no greater than 2%, more preferably no greater than 1.6% and even more preferably no greater than 1.1% with respect to the weight of the resin composite film, from the viewpoint of preventing warping or peeling in electronic devices and maintaining insulating properties, when it is used as an electronic material, and from the viewpoint of retaining its dimensions in low humidity, high-humidity environments when it is used as a fiber-reinforced plastic.

<Dielectric Constant and Dielectric Loss Tangent>

The dielectric constant of the resin composite film is preferably no greater than 4.5, more preferably no greater than 4.3 and even more preferably no greater than 4.1, from the viewpoint of its properties when used as an interlayer dielectric film. The dielectric loss tangent of the resin composite film is preferably no greater than 0.02, more preferably no greater than 0.018 and even more preferably no greater than 0.016, from the viewpoint of its properties when used as an interlayer dielectric film.

<Total Light Transmittance>

The resin composite film of this embodiment can have a total light transmittance of 80% or higher. By controlling the number-average fiber diameter to 0.10 μm or smaller it is possible to form a fiber sheet having a total light transmittance of 80% or higher. The controlling method is not particularly restricted, but it may be a method using a TEMPO oxidation catalyst as described above, or a method of adjustment by fibrillation treatment or micronization treatment. Design to a total light transmittance of 80% or higher is useful for a clear film, while design to a total light transmittance of 90% or higher is more preferred. The method of measuring the total light transmittance may be measurement by an optical transparency test based on ASTM D1003, using an NDH7000SP CU2II (product name) haze meter (Nippon Denshoku Industries Co., Ltd.).

<Glass Transition Temperature (Tg) of Resin Composite Film>

For this embodiment, the resin composite film either has no glass transition temperature (Tg), or it is 80° C. or higher, from the viewpoint of further increasing the thermal shock resistance, thermal stability or durability of the resin composite film including cellulose microfibers in a resin. The Tg is more preferably 120° C. or higher, even more preferably 150° C. or higher and most preferably 180° C. or higher. It is undesirable for the Tg to be below 80° C., because the resin will soften in environments in which it is commonly used, thus lowering the strength of the resin itself.

The resin may be controlled to either have a glass transition temperature (Tg) of 80° C. or higher or to have none, by changing the type and/or mixing ratio of the thermosetting resin or photocurable resin, and the type or content of the curing agent.

For the purpose of the present specification, the glass transition temperature (Tg) of the resin is determined from viscoelasticity measurement of the cured resin or differential scanning calorimetry of the resin, or it may be calculated by the Fox method, from the published Tg values for homopolymers constituted by each of the monomers used for production of the resin (for example, the Tg values listed in "Polymer Handbook" (A Wiley-Interscience Publication) and the mixing proportion of the monomer.

The specific manner of determining the glass transition temperature (Tg) of the resin composite film is the intersection of the tangent line at the inflection point of the original baseline (the point where the upward convex curve changes to a lower convex curve). When the tangent line is difficult to discern, the transition midpoint is used.

Incidentally, the glass transition temperature (Tg) of the resin composite film will be a value close to the glass transition temperature (Tg) of the resin that can be impregnated into the fiber sheet.

<Storage Elastic Modulus>

The resin composite film of this embodiment has a storage elastic modulus at 200° C. (E'200) of 0.5 GPa or greater, preferably 0.7 GPa or greater and more preferably 1.0 GPa or greater, from the viewpoint of thermal shock resistance and reducing warping.

From the viewpoint of thermal shock resistance, the resin composite film of this embodiment has a ratio (E'150/E'200) of the storage elastic modulus at 150° C. (E'150) to the storage elastic modulus at 200° C. (E'200), of 1 to 4.5, 1 to 3.5 or 1.0 to 2.0. For this embodiment, an E'150/E'200 in the range of 1 to 4.5 specifies a resin composite film with minimal thermal change in the storage elastic modulus under relatively low-temperature and relatively high-temperature storage conditions.

One factor allowing the ratio (E'150/E'200) of the storage elastic modulus at 150° C. (E'150) to the storage elastic modulus at 200° C. (E'200) to be controlled to within a range of 1 to 4.5, is that when the number-average fiber diameter of the cellulose microfibers is 0.01 μm to 2.0 μm, the voids are maintained, while the number of cellulose microfibers per unit weight of the cellulose microfiber sheet is extremely large, causing the number of confounded points between the microfibers to increase, and allowing a hydrogen bonded network to be easily formed between the microfibers. This is preferred because, during compositing with the resin, the effect will maintain intertwining of the microfibers and the hydrogen bonded network between the microfibers even in the resin and will contribute to stabilization of the storage elastic modulus even at high temperature.

In particular, if the resin composite film has a glass transition temperature (Tg) of 80° C. or higher, or has none, while the storage elastic modulus of the resin composite film at 200° C. (E'200) is 0.5 GPa or greater and the ratio (E'150/E'200) of the storage elastic modulus of the resin composite film at 150° C. (E'150) to the storage elastic modulus at 200° C. (E'200) is 1 to 4.5, then the resin composite film will have high durability and will be able to impart thermal shock resistance to the device even when mounted as a thin substrate in a device such as a cellular phone, thus being less likely to crack and helping to prevent damage to an interlayer insulating film in the device.

The storage elastic modulus of the resin composite film is measured by the method and under the conditions described in the Examples.

<<Method for Producing Resin Composite Film>>

The method for producing the resin composite film for this embodiment is not particularly restricted, and it may be produced by a prepreg laminate molding method in which a prepreg having the thermosetting resin composition impregnated in the fiber sheet is shaped and/or laminated, and then the shaped and/or laminated product is subjected to pressure while heat curing the resin, a resin transfer molding method in which a liquid thermosetting resin composition is directly impregnated into the fiber sheet, or a pultrusion method in which the fiber sheet is continuously passed through an impregnation tank filled with the liquid thermosetting resin composition for impregnation of the thermosetting resin composition, and is then continuously passed through a squeeze die or heating die and pulled out with a tensioning machine while casting and curing it.

The method of impregnating the resin may be a wet method or a hot-melt method (dry method).

A wet method is a method in which the fiber sheet is immersed in a solution of an epoxy resin composition or photocurable resin composition and thermoplastic resin dissolved in a solvent such as methyl ethyl ketone, and then the fiber sheet is lifted up, and the solvent is evaporated off using an oven or the like to impregnate the resin.

A hot-melt method is a method in which an epoxy resin composition or photocurable resin composition and thermoplastic resin that have been reduced in viscosity by heating are directly impregnated into the fiber sheet, or a method in which films are prepared having an epoxy resin composition coated on a release sheet or the like, and the films are then stacked on one or both sides of reinforcing fibers, impregnating the resin into the reinforcing fibers by heated pressure. During the process, a vacuum defoaming step is preferably included for removal of air. A hot-melt method is preferred since it leaves no residue of solvent in the prepreg.

<<Use of Resin Composite Film>>

Since the resin composite film of this embodiment has high strength and light weight, it can serve as a substitute for steel sheets or as a substitute for carbon fiber-reinforced plastics. For example, it can serve as a material for industrial machinery parts (for example, electromagnetic device housings, roll materials, transport arms or medical equipment members), ordinary machine parts, automobile/railway/vehicle parts (for example, outer platings, chassis, aerodynamic members or seats), ship members (for example, hulls or seats), aviation-related parts (for example, fuselages, wings, tail units, moving vanes, fairings, cowls, doors, seats or interior finishing materials), spacecraft, artificial satellite members (motor cases, wings, body frames or antennae), electronic and electrical components (for example, personal computer cases, cellular phone cases, OA devices, AV devices, telephone sets, facsimiles, household electrical appliances or toy parts), construction and civil engineering materials (for example, reinforcing steel substitute materials, truss structures or suspension bridge cables), subsistence items, sports and leisure products (for example, golf club shafts, fishing rods or tennis and badminton rackets), and wind power generation housing members, as well as members of containers and packings, including high-pressure containers filled with hydrogen gas or the like to be used for fuel cells.

The resin composite film of this embodiment can be suitably used for reinforcement of a laminated sheet in a printed circuit board. In addition, the resin composite film of this embodiment can be suitably applied in, for example, insulating tubes, insulating levers, arc extinguishing plates, operating rods, insulating spacers, cases, wind channels, end bells and wind guard for generators, transformers, rectifiers, circuit breakers and controllers, switch boxes and cases for standard electrical goods, cross bars, insulating shafts, fan blades, mechanism components, transparent bases, speaker diaphragms, eta diaphragms, television screens and fluorescent lamp covers, antennas, horn covers, radomes, cases, mechanism components and circuit boards for communication devices and aerospace purposes, aircraft, rockets, electronic device parts for aircraft, rockets and artificial satellites, railway parts, ship parts, bathtubs, wastewater treatment tanks, corrosion-resistant equipment, chairs, safety helmets, pipes, tank lorries, cooling towers, breakwaters, underground tanks and containers.

The resin composite film of this embodiment can also be used as a friction material for reliable fastening between discs in the interiors of vehicle transmissions. The resin composite film of this embodiment has excellent low linear expansibility and moisture proofness in high-temperature zones and can prevent warping or peeling in electronic devices, and it is therefore particularly suitable for use as an electronic material. More specifically, the resin composite film of this embodiment can be suitably used as an interlayer dielectric film to be included in a resin laminate film, resin laminate sheet, multilayer printed circuit board, semiconductor package board or communication terminal. Therefore, the resin composite film of this embodiment can be suitably used in a driving support system (navigation, on-board camera or sensing system), for on-vehicle purposes.

The resin composite film of this embodiment may also be a resin laminate film laminated on a substrate. Multiple resin laminate films of this embodiment may also be stacked to form a resin composite film-laminated sheet. The resin composite film-laminated sheet can also be used in a multilayer printed circuit board. The multilayer printed circuit board can be used in a semiconductor package board. The semiconductor package board can also be used in a communication terminal or the like. The resin laminate film of this embodiment may also be suitably used as an interlayer dielectric film to be included in a communication terminal or the like.

EXAMPLES

The present invention will now be explained in greater detail by examples and comparative examples, with the understanding that the invention is in no way limited only to the examples.

Embodiment I

<<Measurement of Physical Properties and Method of Evaluation of Cellulose Fiber Sheet>>

<Number-Average Fiber Diameter of Cellulose Microfibers>

The surfaces of cellulose microfibers in a fiber sheet were observed with a scanning electron microscope (SEM) at 10 random locations, at a magnification corresponding to 1,000× to 100,000×, according to the fiber diameters of the microfibers. A line was drawn on the obtained SEM image in the direction perpendicular to the horizontal direction of the image plane, the diameters of fibers intersecting the line were measured from the magnified image, and the number of intersecting fibers and the diameters of the fibers were counted. The number-average fiber diameter was thus calculated using the measurement results for a horizontal/vertical system in each image. The number-average fiber diameter was calculated in the same manner for two more extracted SEM images, and the results for a total of 10 images were averaged.

<Maximum Fiber Diameter of Cellulose Microfibers>

The surface of a structure composed of cellulose microfibers was observed with a scanning electron microscope (SEM) at 10 random locations, at a magnification of 500×. The fiber diameter of the thickest fiber within the 10 SEM images was recorded as the maximum fiber diameter for the cellulose microfiber sheet. A layered sheet obtained by layering onto another nonwoven fabric was observed by SEM from the cellulose microfiber sheet side.

<Sheet Basis Weight>

A sample humidified in an atmosphere at 20° C. room temperature and 50% RH was cut into a 10.0 cm×10.0 cm square piece and weighed, and calculation was performed by the following formula.

$$\text{Sheet basis weight (g/m}^2\text{)}=\text{Weight of 10 cm-square (g)}/0.01 \text{ m}^2$$

<Sheet Thickness>

The thickness of a sample humidified in an atmosphere at 20° C. room temperature, 50% RH was measured at 10 points using a surface contact-type meter (surface contact-type film thickness meter (Code No. 547-401) by Mitutoyo Corp.), and the average value was recorded as the thickness of the sample.

<Void Percentage>

Calculation was performed by the following formula, assuming the density of the cellulose microfibers to be 1.5 g/cm$^3$.

$$\text{Void percentage (\%)}=100-((\text{basis weight (g/m}^2\text{)}/1.5)/\text{sheet thickness (}\mu\text{m}))\times 100)$$

<Air Permeability Resistance>

The air permeability resistance of a sample humidified in an atmosphere at 23° C. room temperature, 50% RH was measured at 10 points using an Oken-type air permeability resistance tester (Model EG01 by Asahi Seiko Co., Ltd.), and the average value was recorded as the air permeability resistance of the sample.

<<Measurement of Physical Properties and Evaluation of Prepreg and Resin Composite Film>>

<Fabrication of Cross-Section Sample for Measurement>

First, platinum was vacuum vapor deposited onto both sides of a resin composite film (coating thickness: 10 nm). Next, the sample film was embedded in an epoxy resin (two-pack epoxy adhesive), and a cross-section was exposed with an ultramicrotome. A diamond knife was used for cutting, and cutting was carried out at ordinary temperature. For films containing silica, since the silica cannot be cut with a microtome, a Dual-Beam FIB device (Dual Beam Nova200 Nanolab by FEI Co., acceleration voltage: 30 kV) was used for sample working to expose a cross-section of the film. The obtained cross-section sample consisted of 5 layers: adhesive-platinum-film-platinum-adhesive, and the location of the film in the sample was distinguished by platinum vapor deposition.

<Microscopic Infrared Imaging>

By microscopic infrared imaging it was confirmed that cellulose microfibers and/or micro aramid fibers were contained in all of the resin composite films. The measurement was carried out under the following conditions, using a cross-section sample of the resin composite film.

Apparatus: Infrared imaging microscope Nicolet™ iN™ 10 MX (Thermo Scientific™)
Resolving power: 8 cm$^{-1}$
Number of scans: 1
Step size: x=2.5 µm, y=2.5 µm
Measurement range: 4000 to 600 cm$^{-1}$ <X-Ray Structural Analysis>

As a result of X-ray structural analysis of the composite film of Example 1, in an X-ray diffraction pattern with a 2θ range of 0° to 30°, the X-ray diffraction pattern was confirmed to have one peak at 10°≤2θ<19° and two peaks at 19°≤2θ≤30°. This identified the microfibers as either natural cellulose or regenerated cellulose.

<Atomic Force Microscope (AFM) Measurement>

The cross-section sample of the resin composite film was fixed onto a special sample fixing stage, and the elastic modulus of the cross-section was measured under the following
AFM measurement conditions.
Apparatus: Dimension Icon by Bruker Co.
Measuring mode: Peak Force Tapping Mode
Probe: Diamond single crystal probe
Spring constant k=48 N/m, tip curvature radius R=12 nm
Resolution: 512×512 pixels
Measurement range: 15 µm×15 µm
Sampling frequency: 0.3 to 0.7 Hz
Maximum indentation load: 50 nN When the distribution of cellulose microfibers could not be confirmed with a resolution of 512×512 pixels and a measurement range of 15 µm×15 µm, measurement was performed with a measurement range of 3 µm×3 µm and with a measurement range of 1 µm×1 µm, at the same resolution as above.

<Cellulose Microfiber Filling Factor>

The filling factor for the cellulose microfibers was defined as the area ratio of cellulose microfibers occupying the entire resin composite film in an AFM elastic modulus image of the resin composite film cross-section. The elastic modulus differs for different materials, and modulus mapping was performed for each material in the resin composite film by setting the threshold value for the histogram of the elastic modulus. For example, for a resin composite film composed entirely of cellulose microfibers and an epoxy, a contrast image is obtained for the epoxy (soft phase) and cellulose microfibers (hard phase). The histogram was largely divided into two peaks, and the midpoint between the two peaks of the histogram was set as the threshold value for binarization (cellulose: black, epoxy: white). When the thickness of the resin composite film was greater than the AFM measurement range of 15 µm, the measurement was performed after first separating the cross-section of the resin composite film into multiple visual fields. Next, after preparing modulus mapping in each visual field, the images were joined to obtain an image with the resin composite film cross-section fitted into a single image. From modulus mapping with all of the resin composite film cross-sections visible, the area due to the cellulose microfibers and the area of the entire resin composite film were calculated using the image editing software "imageJ", and finally the filling factor of the cellulose microfibers was determined by the following formula.

$$\text{Cellulose microfiber filling factor (\%)}=\text{area due to cellulose microfibers/entire resin composite film area}\times 100$$

The filling factor of the cellulose microfibers in the resin composite film cross-section was calculated at 10 locations using the method described above, and the average value of 8 points, excluding the maximum and minimum values, was recorded as the filling factor of the cellulose microfibers for the entire resin composite film.

<Average Fiber Diameter of Cellulose Microfibers>

From modulus mapping with all of the resin composite film cross-sections visible, the area (ΣS) due to the cellulose microfibers and the total length (ΣL) of the interfaces between the cellulose microfibers and other materials (mainly epoxy) were calculated using the image editing software "imageJ", after which the average fiber diameter of the cellulose microfibers was calculated by the following formula.

Average fiber diameter of cellulose microfibers (nm)=4×ΣS/ΣL

The average fiber diameter of the cellulose microfibers in the film cross-section was calculated at 10 locations using the method described above, and the average value of 8 points, excluding the maximum and minimum values, was recorded as the average fiber diameter of the cellulose microfibers for the entire film.

<Maximum Fiber Diameter of Cellulose Microfibers>

Particle analysis was conducted with the image editing software "imageJ" for the modulus mapping at 10 locations with all of the resin composite film cross-sections visible, and the particle diameters were calculated assuming the cellulose microfiber diameters to be perfect circles. The largest particle diameter was used as the maximum fiber diameter of the cellulose microfibers.

For the average fiber diameter and maximum fiber diameter of the cellulose microfibers in the prepreg, the prepreg was first impregnated with an organic solvent and the resin component was removed by dissolution, after which a scanning electron microscope (SEM) was used for measurement of the number-average fiber diameter and maximum fiber diameter of the fiber sheet in the same manner as described above.

<Void Percentage of Fiber Sheet in Resin Composite Film>

From modulus mapping with all of the resin composite film cross-sections visible, the area (ΣS) due to the cellulose microfibers and the area (ΣSp) due to the resin present between the fibers composing the fiber sheet (excluding the overcoat resin layer), determined in the same manner, were calculated using the image editing software "imageJ", after which the void percentage of the fiber sheet in the resin composite film was calculated by the following formula.

Void percentage of fiber sheet in resin composite film (%)=ΣS/(ΣS+ΣSp)×100

<Filling Factor of Inorganic Filler in Entire Resin Composite Film>

The filling factor of the inorganic filler in the entire resin composite film was defined as the area ratio of the constituent atoms of the inorganic filler occupying the resin composite film cross-section. For example, Si was measured for silica particles, and Al was measured for aluminum hydroxide particles. The measuring method will now be explained, using silica particles as an example. After conductive treatment of a cross-section sample with carbon paste and osmium coating, an S-4800 scanning electron microscope (product of Hitachi High-Tech Fielding Corp.) was used for imaging with a photograph magnification of 500×, an acceleration voltage of 1.0 kV and the detector set to secondary electrons, to obtain a cross-sectional SEM image. Next, an energy dispersive X-ray detector (X-Max SILICON DRIFT X-RAY DETECTOR by Horiba, Ltd.) was used in the same visual field, to obtain element mapping for C and Si. For the area ratio, first the sections of the SEM secondary electron image of the film cross-section corresponding to the outer perimeter of the film were cut out using the image editing software "imageJ", to show only the film cross-section. Binarization was then performed, showing the silica portions as black and the other portions as white. The threshold value for black/white binarization was selected so that the portions represented in black corresponded to the Si regions in EDX, and the black area was calculated as a count number. The area of the entire cross-section of the film was also calculated as a count number. The ratio of Si occupying the entire film cross-section was calculated from the ratio of the two, using the following formula.

Inorganic filler filling factor (%)=area of inorganic filler/area of entire film×100

The filling factor of the inorganic filler in the film cross-section was determined at 10 locations using the method described above, and the average value of 8 points, excluding the maximum and minimum values, was recorded as the average filling factor of the inorganic filler for the entire film. Here, binarization refers to binarization based on the difference in the elastic modulus of the organic material (resin or fibers) and inorganic material (inorganic filler).

<Proportion of Inorganic Filler in Cellulose Microfiber Layer>

For the filling factor of the inorganic filler in the cellulose microfiber layer, the total area due to the inorganic filler in the resin composite film and the area due to the inorganic filler in the cellulose microfiber layer were calculated from modulus mapping of the resin composite film cross-section, using the image editing software "imageJ", and finally the content of the inorganic filler in the cellulose microfiber layer was determined by the following formula. The cellulose microfiber layer is defined as the region delineated by selecting at least 10 points in order from the nearest cellulose microfiber to the outer surface of the resin composite film and connecting them with a line.

Content of inorganic filler in cellulose microfiber layer (%)=area of inorganic filler in cellulose microfiber layer/total area of inorganic filler in resin composite film×100

The filling factor of the inorganic filler in the cellulose microfiber layer in the resin composite film cross-section was calculated at 10 locations using the method described above, and the average value of 8 points, excluding the maximum and minimum values, was recorded as the filling factor of the inorganic filler in the cellulose microfiber layer.

<Average Thickness of Overcoat Resin Layer>

The length from the outer surface of the resin composite film to the surface of the nonwoven fabric layer is defined as the overcoat resin layer. The nonwoven fabric layer is defined as the layer comprising organic fibers, including the cellulose microfiber layer. By AFM modulus mapping it can be confirmed to be composed of 3 layers: epoxy layer (front)/nonwoven fabric layer/epoxy layer (back). The length from the outer surface of the film to the surface of the nonwoven fabric layer was measured at 10 points each on the front and back, and the average values were recorded as the overcoat resin layer thickness (front) and the overcoat resin layer thickness (back).

<Overcoat Resin Layer Thickness Homogeneity>

The coefficient of variation was determined from the standard deviation and average value for the overcoat resin layer thickness at the 10 points measured in (7) above. A coefficient of variation of less than 20% was evaluated as "G", at least 20% and less than 50% was evaluated as "F", and 50% or greater was evaluated as "P".

Coefficient of variation (%)=standard deviation of overcoat resin layer thickness/average thickness of overcoat resin layer×100

<Resin Composite Film Thickness>

The thickness of the resin composite film was measured at 10 points and the average value was recorded as the thickness. A surface contact-type meter (surface contact-type film thickness meter (Code No. 547-401) by Mitutoyo Co.) was used as the film thickness meter.

<Moisture Absorption Ratio>

The resin composite film was cut to a 50 mm square and dried at 120° C. for 2 hours and then the initial weight (W0)

was measured, after which the weight (W1) after moisture absorption treatment under conditions of humidity: 85%/temperature: 85° C./192 hours was measured. The moisture absorption ratio was determined by the following formula.

Moisture absorption ratio (%)=(W1−W0)/W0×100

<Transmittance>

The resin composite film of this embodiment preferably has a total light transmittance of 80% or higher. The total light transmittance may be measured by an optical transparency test based on ASTM D1003, using an NDH7000SP CU2II (product name) haze meter (Nippon Denshoku Industries Co., Ltd.).

<Dielectric Characteristics (Relative Dielectric Constant and Dielectric Loss Tangent)>

A thick resin composite film with a thickness of 0.8 mm was cut out to a size of 1.5 (width)×80 mm (length) for use as a measuring sample. The measurement was conducted using the cavity resonance method (Model 8722ES network analyzer, product of Agilent Technologies; cavity resonator, product of Kanto Electronics Application and Development Inc.), measuring the value at 1 GHz.

<Copper Foil Peel Strength (Peel Strength)>

A 1 cm-wide, 10 cm-length slit was made in the copper-clad laminate, one end was peeled off and gripped with an AGS-500 autograph by Shimadzu Corp., and measurement was made of the load (kgf/cm) at 35 mm peeling in the perpendicular direction at a speed of 50 mm/min, at room temperature.

<Circuit Embedding Property Evaluation>

Using an insulating layer laminate having a comb tooth pattern with line/space ratio=600/660 μm, the insulating layer on the comb tooth pattern was observed from the surface with an optical microscope, and samples that were firmly embedded without voids were evaluated as "G", while those with voids and with lifting of the resin were evaluated as "P".

<Thermal Shock Resistance Test>

A plating-treated laminate was exposed to low temperature (−55° C.) and high temperature (125° C.) for 30 minutes each using a thermal shock device (TSA-71S-A/W by Espec), based on MIL-STD-883E conditions A (−55° C. to 125° C.), and 200 such cycles were conducted. The condition of failure of the copper wiring or the copper/resin interface was observed using an optical microscope photograph (transmitted light, magnification: 25× to 100×) and a cross-sectional SEM (magnification 5000×), and an organoleptic evaluation was carried out based on the following scale. A smaller number of failure locations was evaluated as more excellent adhesiveness.

VG: ≤1 failure location confirmed by observation under the described conditions.

G: ≥2 and ≤5 failure locations confirmed by observation under the described conditions.

F: ≥6 and ≤10 failure locations confirmed by observation under the described conditions.

P: ≥11 failure locations confirmed by observation under the described conditions.

Slurry Production Examples

Slurry Production Example 1

Tencel cut filaments (3 mm lengths), as regenerated cellulose fibers acquired from Sojitz Corp., were placed in a washing net, a surfactant was added, and the mixture was washed with water several times in a washing machine to remove the oil agent on the fiber surfaces.

The refined Tencel fibers (cut filaments) were dispersed in water (400 L) to a solid content of 1.5 wt %, and a Model SDR14 Lab Refiner (pressurized disc type) by Aikawa Iron Works Co. was used as a disc refiner apparatus for beating treatment of 400 L of the aqueous dispersion for 20 minutes with a disc clearance of 1 mm. Beating treatment was then continued under conditions with the clearance reduced to a level of essentially zero. Sampling was periodically conducted, and the CSF value of the sampled slurry was evaluated according to the Canadian Standard Freeness test method (hereunder, "CSF method") for pulp as defined by JIS P 8121, by which it was confirmed that the CSF value decreased with time, reaching approximately zero and tending to increase with further beating treatment. Beating treatment was continued under the same conditions for 10 minutes after setting the clearance to nearly zero, and a beaten aqueous dispersion with a CSF value of 100 ml or greater was obtained. The obtained beaten aqueous dispersion was directly subjected to micronization treatment 5 times using a high-pressure homogenizer (NS015H by Niro Soavi) at an operating pressure of 100 MPa, to obtain a cellulose microfiber slurry (solid concentration: 1.5 wt %).

Slurry Production Example 2

Linter pulp was used as natural cellulose for the starting material. The linter pulp was immersed in water to 4 wt % and heat treated in an autoclave at 130° C. for 4 hours, and the obtained swollen pulp was washed with water several times to obtain water-impregnated swollen pulp. Next, disc refiner and high-pressure homogenizer treatment were carried out by the same method as Production Example 1, to obtain a cellulose microfiber slurry (solid concentration: 1.5 wt %). The CSF value was 100 ml or greater.

Slurry Production Example 3

A cellulose microfiber slurry (solid concentration: 1.5 wt %) was obtained by the same method as Slurry Production Example 2, except for changing the starting material to abaca pulp. The CSF value was 630 ml or greater.

Slurry Production Example 4

An aramid microfiber slurry (solid concentration: 1.5 wt %) was obtained by the same method as Slurry Production Example 1, except for changing the starting material to aramid fiber (1 mm length) by Teijin, Ltd.

Slurry Production Example 5

A cellulose microfiber slurry (solid concentration: 1.5 wt %) was obtained by the same method as Slurry Production Example 2, except that the micronization treatment at an operating pressure of 100 MPa was carried out 30 times.

Slurry Production Example 6

An aramid microfiber slurry (solid concentration: 1.5 wt %) was obtained by the same method as Slurry Production Example 4, except that the micronization treatment at an operating pressure of 100 MPa was carried out 30 times.

Slurry Production Example 7

A cellulose microfiber slurry (solid concentration: 1.5 wt %) was obtained by the same method as Slurry Production Example 1, except that treatment was interrupted when the CSF value reached zero.

Slurry Production Comparative Example 1

A sheet was produced with reference to Example 4 of Japanese Unexamined Patent Publication No. 2006-316253. A polysaccharide production medium containing 2.0% glucose (Polysaccharide-production-medium, Akihiko Shimada, Vivaorigino, 23, 1, 52-53, 1995) was subjected to high-pressure steam sterilization treatment, after which 1000 L thereof was placed in a 3000 L-capacity fermenter, strain CF-002 was inoculated to 104 CFU/ml, and agitation culture was carried out under aeration at 30° C. for 2 days, to obtain a dispersion containing a large amount of bacterial cellulose (BC). After then filtering with a screen mesh, rinsing with water and pressing, it was immersed in a 1% NaOH solution and sterilized, and then again neutralized, rinsed with water and pressed. The step of rinsing with water and pressing was repeated another 3 times to obtain a purified flocculent BC/aqueous dispersion (cellulose content: 11.6 wt %). The obtained dispersion was diluted with water to a cellulose concentration of 1.0 wt %, and then pre-dispersed for 10 minutes with a household mixer and subjected to dispersion treatment 4 times using a high-pressure homogenizer (NS3015H by Niro Soavi) at an operating pressure of 80 MPa.

Sheet Production Examples

Sheet Production Example 1

The slurry of Slurry Production Example 1 was diluted to a solid concentration of 0.2 wt % and stirred for 3 minutes with a household mixer to prepare 312.5 g of a paper-making slurry. A PET/nylon mixed spun plain woven fabric (NT20 by Shikishima Canvas Co., Ltd., water permeation: 0.03 ml/($cm^2 \cdot s$) at 25° C. in air, able to filter cellulose microfibers to 99% or greater by filtration at atmospheric pressure, 25° C.) was set in a batch paper machine (automatic square sheet machine by Kumagai Riki Kogyo Co., Ltd., 25 cm×25 cm, 80 mesh), and then the previously prepared paper-making slurry was loaded in an amount for a cellulose sheet with a basis weight of 10 g/$m^2$, and paper-making (dewatering) was carried out with pressure reduction of 4 KPa with respect to atmospheric pressure.

The wet web comprising the wet concentrated composition on the obtained filter cloth was detached from the wire and pressed for 1 minute at a pressure of 1 kg/$cm^2$, after which the wet web surface was contacted with the drum surface of a drum dryer set to a surface temperature of 130° C., in a wet web/filter cloth two-layer state, and dried for about 120 seconds in a manner so as to keep the wet web in contact with the drum surface. The filter cloth was detached from the cellulose sheet structure of the obtained dried two-layer sheet, to obtain a white cellulose microfiber sheet (25 cm×25 cm, 10 g/$m^2$). Next, the cellulose microfiber sheet was subjected to smoothing treatment with a calender apparatus (hydraulic two-roll test embossing machine by Yuri Roll Machine Co., Ltd., upper roll: metal/lower roll: aramid, surface length: 300 mm, temperature: room temperature, pressure: 1.5 ton/300 mm), to obtain a thin-layer cellulose microfiber sheet S1.

Sheet Production Example 2

After mixing 50 parts by weight of the cellulose microfiber slurry of Slurry Production Example 2 and 50 parts by weight of the aramid microfiber slurry of Slurry Production Example 4, the mixture was diluted to a solid concentration of 0.2 wt %. It was then stirred for 3 minutes with a household mixer to prepare 312.5 g of a paper-making slurry. Next, paper-making, drying and smoothing steps were carried out by the same methods as Sheet Production Example 1, to obtain an opalescent cellulose microfiber sheet S2 containing aramid microfibers.

Sheet Production Example 3

After adding 1.2 wt % (3.9 g) and 0.012 wt % (0.039 g) of 1-hexanol and hydroxypropyl methyl cellulose (trade name: "60SH-4000", product of Shin-Etsu Chemical Co., Ltd.), respectively, to the slurry of Slurry Production Example 3 (312.5 g), the mixture was emulsified and dispersed for 4 minutes with a household mixer. Paper-making, drying and smoothing were subsequently carried out using the paper-making slurry by the same method as Example 1, to obtain a cellulose microfiber sheet S3.

Sheet Production Example 4

After mixing 70 parts by weight of the cellulose microfiber slurry of Slurry Production Example 2 and 30 parts by weight of the aramid microfiber slurry of Slurry Production Example 4, the mixture was diluted to a solid concentration of 0.2 wt %. It was then stirred for 3 minutes with a household mixer to prepare 312.5 g of a paper-making slurry. While stirring 312.5 g of paper-making slurry with a Three-one motor, 1.9 g of a cationic blocked polyisocyanate (trade name: "MEIKANATE WEB", product of Meisei Chemical Works, Ltd., diluted to a solid concentration of 1.0 wt %) was added dropwise, and the mixture was then stirred for 3 minutes to obtain a paper-making slurry (total: 314.4 g). The weight ratio of the added cationic blocked polyisocyanate was 3 wt % with respect to the solid weight of the cellulose microfibers and aramid microfibers. A sheet was formed using the same methods for paper-making, drying and smoothing as in Sheet Production Example 1. After the smoothing step, the sheet was sandwiched between two SUS metal frames (25 cm×25 cm), anchored with a clip, and subjected to heat treatment in an oven at 160° C. for 2 minutes, to obtain an opalescent cellulose microfiber sheet S4 containing aramid microfibers crosslinked with a blocked polyisocyanate.

Sheet Production Example 5

Using the same method as Sheet Production Example 1, paper-making was carried out with a cupra long filament nonwoven fabric (trade name: BEMLIESE SN140 by Asahi Kasei Fibers Corp., basis weight: 14 g/$m^2$, film thickness: 70 µm, density: 0.2 g/$cm^3$, average monofilament size: 0.2 dtex) layered over a PET/nylon mixed spun plain weave fabric, to prepare a fiber sheet S5 having a cellulose microfiber sheet layered on a cupra long filament nonwoven fabric. No smoothing step was carried out.

Sheet Production Example 6

While stirring 468.8 g of the paper-making slurry of Sheet Production Example 1 with a Three-one motor, 2.85 g of a cationic blocked polyisocyanate (trade name: "MEIKA-NATE WEB", product of Meisei Chemical Works, Ltd., diluted to a solid concentration of 1.0 wt %) was added dropwise, and the mixture was then stirred for 3 minutes to obtain a paper-making slurry (total: 471.65 g). The weight ratio of the added cationic blocked polyisocyanate was 3.0 wt % with respect to the solid weight of the cellulose microfibers. A sheet was formed using the same methods for paper-making, drying and smoothing as in Sheet Production Example 4. Next, the dry sheet was sandwiched between two SUS metal frames (25 cm×25 cm), anchored with a clip, and subjected to heat treatment in an oven at 160° C. for 2 minutes, to obtain a white cellulose microfiber sheet S6 containing cellulose microfibers crosslinked with a blocked polyisocyanate.

Sheet Production Example 7

After mixing 50 parts by weight of the cellulose microfiber slurry of Slurry Production Example 5 and 50 parts by weight of the aramid microfiber slurry of Slurry Production Example 6, the mixture was diluted to a solid concentration of 0.2 wt %. It was then stirred for 3 minutes with a household mixer to prepare 312.5 g of a paper-making slurry. Next, paper-making, drying and smoothing steps were carried out by the same methods as Sheet Production Example 1, to obtain an opalescent cellulose microfiber sheet S7 containing aramid microfibers.

Sheet Production Example 8

While stirring 468.8 g of the cellulose microfiber slurry of Slurry Production Example 7 with a Three-one motor, 2.85 g of a cationic blocked polyisocyanate (trade name: "MEI-KANATE WEB", product of Meisei Chemical Works, Ltd., diluted to a solid concentration of 1.0 wt %) was added dropwise, and the mixture was then stirred for 3 minutes to obtain a paper-making slurry (total: 471.65 g). The weight ratio of the added cationic blocked polyisocyanate was 3.0 wt % with respect to the solid weight of the cellulose microfibers. A sheet was formed using the same methods for paper-making, drying and smoothing as in Sheet Production Example 4. Next, the dry sheet was sandwiched between two SUS metal frames (25 cm×25 cm), anchored with a clip, and subjected to heat treatment in an oven at 160° C. for 2 minutes, to obtain a white cellulose microfiber sheet S8 containing cellulose microfibers crosslinked with a blocked polyisocyanate.

Sheet Production Comparative Example 1

The dispersion with a cellulose concentration of 1.0 wt % obtained in Slurry Production Comparative Example 1 was diluted with water to a cellulose concentration of 0.40 wt % and again subjected to dispersion treatment for 5 minutes with a household mixer, and the obtained dispersion was used as a paper-making dispersion. The obtained wet web was further covered with the same filter cloth and dewatered with metal rollers, to adjust the cellulose concentration to 12 to 13 wt %. First, without detaching the PET fabric, the obtained wet web was immersed in acetone and subjected to exchange treatment for about 10 minutes while occasionally gently rinsing the entire web, after which it was immersed in a mixed solution of toluene/acetone=50/50 (g/g) and subjected to exchange treatment for about 10 minutes while occasionally gently rinsing the entire web. Immediately following this, the wet web sandwiched between filter cloths was placed on a metal sheet, a deadweight was set on it for drying to a fixed length, and it was set in a drying oven and dried at 100° C. for 50 minutes. After drying, the nonwoven fabric was detached from the filter cloth to obtain a white cellulose sheet RS1.

Table 1 shows the starting materials, production methods and physical properties for the sheet production examples and sheet production comparative examples.

Varnish Production Examples

Varnish Production Example 1

A varnish (V1) with a solid content of 70 wt % was prepared using methyl ethyl ketone as the solvent and the following compounds, mixed with a kneader.
Brominated bisphenol A-type epoxy resin 1121N-80M (Dainippon Ink & Chemicals, Inc.), 78.9 parts by weight
Phenol-novolac-type epoxy resin N680-75M (Dainippon Ink & Chemicals, Inc.), 14.0 parts by weight
Dicyandiamide (Dainippon Ink & Chemicals, Inc.), 2.0 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight
Spherical silica SO25R (Admatechs Co., Ltd., weight-average particle diameter: 0.5 μm), 32.0 parts by weight Varnish Production Example 2

Varnish V2 was produced by the same method as Varnish Production Example 1, except for adding 98.0 parts by weight of spherical silica SO25R (Admatechs Co., Ltd., weight-average particle diameter: 0.5 μm).

Varnish Production Example 3

A varnish (V3) with a solid content of 70 wt % was prepared using methyl ethyl ketone as the solvent and the following compounds in admixture.
Naphthalene-type epoxy resin HP-9500 (Dainippon Ink & Chemicals, Inc.), 54.3 parts by weight
Liquid alicyclic acid anhydride MH-700 (New Japan Chemical Co., Ltd.), 40.6 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight Varnish Production Example 4

A varnish (V4) with a solid content of 70 wt % was prepared using methyl ethyl ketone as the solvent and the following compounds in admixture.
Biphenyl-type epoxy resin NC-3000H (Nippon Kayaku Co., Ltd.), 39.2 parts by weight
Bisphenol A-type epoxy resin 1051 (Dainippon Ink & Chemicals, Inc.), 39.2 parts by weight
Aminotriazine-novolac resin LA-3018 (Dainippon Ink & Chemicals, Inc.), 16.5 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight
Aluminum hydroxide H-43S (Showa Denko K.K., mean particle diameter: 0.7 μm), 61.0 parts by weight Crosslinked fine particle rubber XER-91 (JSR), 2.5 parts by weight Varnish Production Example 5

A varnish (V5) with a solid content of 70 wt % was prepared using methyl ethyl ketone as the solvent and the following compounds in admixture.
Alicyclic epoxy resin 2021P (DAICEL), 20.0 parts by weight
Dicyclopentadiene-type epoxy resin HP-7200H, 30.0 parts by weight
Active ester-type curing agent HPC8000-65T (Dainippon Ink & Chemicals, Inc.), 50.0 parts by weight
4-Dimethylaminopyridine (Tokyo Kasei Kogyo Co., Ltd.), 0.1 part by weight Varnish Production Example 6

A varnish (V6) with a solid content of 70 wt % was prepared using methyl ethyl ketone as the solvent and the following compounds in admixture.
Polystyrene (Wako Pure Chemical Industries, Ltd.), 100.0 parts by weight
Phenoxy resin YL7553BH30 (Mitsubishi Chemical Corp.), 5.0 parts by weight
Spherical silica 5025R (Admatechs Co., Ltd., weight-average particle diameter: 0.5 μm), 32.0 parts by weight
Crosslinked fine particle rubber XER-91 (JSR), 2.5 parts by weight Varnish Production Example 7

Varnish V7 was produced by the same method as Varnish Production Example 1, except for adding 121.0 parts by weight of spherical silica 5025R (Admatechs Co., Ltd., weight-average particle diameter: 0.5 μm).

Varnish Production Example 8

A varnish (V8) with a solid content of 70 wt % was prepared using methyl ethyl ketone as the solvent and the following compounds, mixed with a kneader.
Brominated bisphenol A-type epoxy resin 1121N-80M (Dainippon Ink & Chemicals, Inc.), 83.1 parts by weight
Phenol-novolac-type epoxy resin N680-75M (Dainippon Ink & Chemicals, Inc.), 14.7 parts by weight
Dicyandiamide (Dainippon Ink & Chemicals, Inc.), 2.1 parts by weight
2-Ethyl-4-methylimidazole (Shikoku Chemicals Corp.), 0.1 part by weight
Silica SO25R (Admatechs Co., Ltd., weight-average particle diameter: 0.5 μm), 60.6 parts by weight Varnish Production Comparative Example 1

A varnish was produced with reference to Example 4 of Japanese Unexamined Patent Publication No. 2006-316253. The following compounds were heated to 120° C. and mixed with a kneader to prepare a varnish (RV1) with a solid content of 100 wt %.
Bisphenol A-type epoxy resin (Asahi Kasei Epoxy Co., Ltd., AER-250), 85.0 parts by weight
m-Xylylenediamine, 15.0 parts by weight Table 2 shows the compositions and solid contents of the varnish production examples and varnish production comparative examples. The numerical values for each of the components in Table 2 are parts by weight.

Resin Composite Film Production Examples

Example 1

(1) Fabrication of Prepreg
Varnish V1 was coated to 0.3 g onto the release surface of a 20 cm-square polyethylene terephthalate support film (thickness: 16 μm) using a film applicator, and then the cellulose microfiber sheet (Si) cut to 10 cm-square was placed on it, and the varnish V1 was recoated to 0.3 g on the cellulose microfiber sheet using an applicator. The obtained film was heated to 100° C. for 4 minutes to remove the solvent and obtain a semi-cured prepreg.
(2) Fabrication of Resin Composite Film
After covering the prepreg with another polyethylene terephthalate support film (thickness: 16 μm) in a manner so as to contact the release surface, it was cured with a vacuum heat press machine (heating temperature: 220° C., pressure: 6.0 MPa, time: 160 min). The support film was removed from the obtained cured film to obtain a resin composite film.

An AFM elastic modulus image of the obtained resin composite film is shown in FIG. 1(a), an elastic modulus histogram is shown in FIG. 1(b), and a binarized image is shown in FIG. 1(c). In FIG. 1(c), the shaded area corresponds to the cellulose portions.

Figure 2:
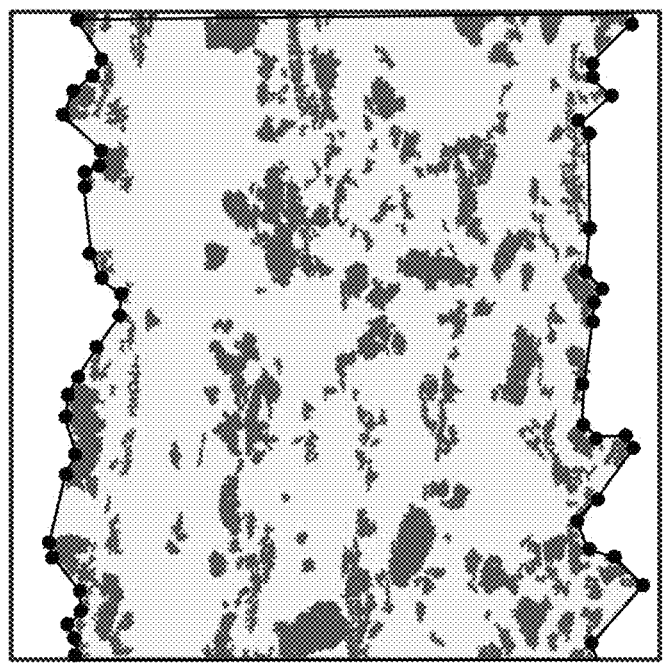
FIG. 2 is the AFM modulus mapping image of FIG. 1(a), after processing for demarcation of the cellulose microfiber layer.

Also, FIG. 2 shows a processed image where the cellulose microfiber layer is defined as the region obtained by calculating the area due to the inorganic filler and the area due to the silica filler in the cellulose microfiber layer from modulus mapping of the resin composite film cross-section in FIG. 1(a), using the image editing software "imageJ", selecting cellulose microfibers in at least 10 points nearest to the film outer surface, and connecting them with a line.
(3) Fabrication of Copper-Clad Laminate
A prescribed number of sheets of the prepreg were stacked for a final cured thickness in the range of 0.7 to 0.9 mm, an electrolytic copper foil F2-WS (Furukawa Circuit Foil Co., Ltd., thickness: 18 μm, treated side Rz=2.3 μm) was situated above and below, and the stack was pressed for 60 minutes at a pressure of 2.5 MPa and a temperature of 240° C., to obtain a copper-clad laminate.
(4) Fabrication of Thick Resin Composite Film
The copper-clad laminate was immersed in a copper etching solution to remove the copper foil, to fabricate a thick resin composite film for evaluation, having a thickness of 0.8 mm.
(5) Fabrication of Inner Layer Circuit Board
On a glass cloth substrate/epoxy resin double-sided copper-clad laminate (copper foil thickness: 35 μm, substrate thickness: 0.8 mm, "R5715ES", product of Matsushita Electric Works, Ltd.) there was formed the pattern of an IPC MULTI-PURPOSE TEST BOARD NO. IPC C-25 (comb tooth pattern with line/space ratio=600/660 μm (residual copper: 48%)). Next, both sides of the substrate were roughened with a micro etching agent ("CZ8100" by MEC Co., Ltd.) to fabricate an inner layer circuit board.
(6) Fabrication of Insulating Layer Laminate
The prepreg was laminated onto both sides of the inner layer circuit board using a vacuum laminator by Meiki Co., Ltd. under conditions with a temperature of 120° C., a pressure of 7 kgf/cm² and an air pressure of mmHg, and then continuously hot pressed with a SUS end plate under conditions with a temperature of 120° C., a pressure of 5 kgf/cm² and atmospheric pressure. After then detaching the PET film, it was thermoset at 180° C. for 30 minutes to form an insulating layer on both sides of the substrate.

(7) Fabrication of Roughened Laminate

For chemical roughening of the cured resin layer on the insulating layer-formed circuit board, an aqueous solution of diethyleneglycol monobutyl ether: 200 ml/L and of NaOH: 5 g/L was prepared as a swelling solution and heated to 80° C., and immersion treatment was carried out for 5 minutes. Next, an aqueous solution of $KMnO_4$: 60 g/L and of NaOH: 40 g/L was prepared as a roughening solution and heated to 80° C., and immersion treatment was carried out for 15 minutes. An aqueous neutralizing solution ($SnCl_2$: 30 g/L, HCl: 300 ml/L) was then prepared and heated to 40° C., and immersion treatment was carried out for 5 minutes for reduction of the $KMnO_4$.

(8) Fabrication of Plating-Treated Laminate

In order to form a circuit on the roughened insulating layer surface by a semi-additive process, the inner layer circuit board was immersed in an electroless plating solution containing $PdCl_2$ at 40° C. for 5 minutes, and then immersed in an electroless copper plating solution at 25° C. for 20 minutes. After heating at 150° C. for 30 minutes for annealing treatment, an etching resist was formed, and after pattern formation by etching (straight slit wiring with L/S=40 μm/40 μm, 5 cm length), copper sulfate electrolytic plating and annealing treatment were carried out at 200° C. for 60 minutes, to form a 30 μm-thick conductive layer.

Example 2

Different resin composite films F2 (prepreg, resin composite film, copper-clad laminate, thick resin composite film, insulating layer laminate, roughened laminate, plating-treated laminate) were fabricated by the same method as Example 1, except that the cellulose microfiber sheet was S2.

Example 3

Different resin composite films F3 (prepreg, resin composite film, copper-clad laminate, thick resin composite film, insulating layer laminate, roughened laminate, plating-treated laminate) were fabricated by the same method as Example 1, except that the coating amount of the varnish (V2) was 0.9 g.

Example 4

Different resin composite films F4 (prepreg, resin composite film, copper-clad laminate, thick resin composite film, insulating layer laminate, roughened laminate, plating-treated laminate) were fabricated by the same method as Example 1, except that the cellulose microfiber sheet was S3, the varnish was V3, and the coating amount of the varnish was 0.1 g. The total light transmittance of the resin composite film was measured to be 82%.

Example 5

Different resin composite films F5 (prepreg, resin composite film, copper-clad laminate, thick resin composite film, insulating layer laminate, roughened laminate, plating-treated laminate) were fabricated by the same method as Example 1, except that the cellulose microfiber sheet was S4, the varnish was V4, and the coating amount of the varnish was 0.1 g.

Example 6

A varnish (V5) was coated to 0.8 g onto the release surface of a 20 cm-square polyethylene terephthalate support film (thickness: 16 μm) using a film applicator, and then the cellulose microfiber layered sheet (S5) cut to 10 cm-square was placed on it with the cellulose microfiber side in contact, and the varnish (V5) was recoated to 8.0 g on the cellulose microfiber sheet using an applicator. Different resin composite films F6 (prepreg, resin composite film, copper-clad laminate, thick resin composite film, insulating layer laminate, roughened laminate, plating-treated laminate) were fabricated, otherwise by the same method as Example 1.

Example 7

Different resin composite films F7 (prepreg, resin composite film, copper-clad laminate, thick resin composite film, insulating layer laminate, roughened laminate, plating-treated laminate) were fabricated by the same method as Example 6, except that the varnish was changed to V6.

Example 8

Different resin composite films F8 (prepreg, resin composite film, copper-clad laminate, thick resin composite film, insulating layer laminate, roughened laminate, plating-treated laminate) were fabricated by the same method as Example 1, except that the varnish was changed to V7, the coating amount of the varnish was 9.0 g, and the cellulose microfiber sheet was S6.

Example 9

Different resin composite films F9 (prepreg, resin composite film, copper-clad laminate, thick resin composite film, insulating layer laminate, roughened laminate, plating-treated laminate) were fabricated by the same method as Example 1, except that the cellulose microfiber sheet was S7 and the varnish was V8.

Example 10

Different resin composite films F10 (prepreg, resin composite film, copper-clad laminate, thick resin composite film, insulating layer laminate, roughened laminate, plating-treated laminate) were fabricated by the same method as Example 1, except that the cellulose microfiber sheet was S8 and the varnish was V1.

Example 11

The cellulose microfiber sheet S6 was placed on the release surface of a 20 cm-square polyethylene terephthalate support film (thickness: 16 μm), a 60 μm-thick polypropylene film was set over it and covered with a separate polyethylene terephthalate support film (thickness: 16 μm) with the release surface in contact. The stack was hot pressed at 200° C. for 10 minutes using a hot press machine, embedding the cellulose microfiber sheet S6 in the polypropylene film.

Next, the cellulose microfiber sheet S6-attached polypropylene film was in turn placed on the release surface of a 20 cm-square polyethylene terephthalate support film (thickness: 16 μm), a 60 μm-thick polypropylene film was set over it with the cellulose microfiber sheet S6 facing the outer side, and it was covered with a separate polyethylene terephthalate support film (thickness: 16 μm) with the release surface in contact. This was hot pressed at 200° C. for 10 minutes using a hot press machine, to fabricate a resin composite film F11 having a cellulose microfiber sheet S6 sandwiched by polypropylene films on both sides.

Using the resin composite film F11, the resin composite film F11 was laminated onto both sides of the inner layer circuit board fabricated in Example 1(5) using a vacuum laminator by Meiki Co., Ltd. under conditions with a temperature of 200° C., a pressure of 7 kgf/cm² and an air pressure of mmHg, and then continuously hot pressed with a SUS end plate under conditions with a temperature of 200° C., a pressure of 5 kgf/cm² and atmospheric pressure. The PET film was then detached and the circuit embedding property alone was evaluated.

Comparative Example 1

A resin composite film was produced with reference to Example 4 of Japanese Unexamined Patent Publication No. 2006-316253. One sheet of the varnish RV1 obtained in Varnish Production Comparative Example 1 impregnated in the cellulose nonwoven fabric RS1 obtained in Sheet Production Comparative Example 1 (impregnation time: minutes) was thermoset in a hot press machine at a temperature of 100° C. and a pressure of 9.81 MPa (curing time: 1 hour), to fabricate resin composite film RF1. Resin composite films (prepreg, copper-clad laminate, evaluation substrate, insulating layer laminate, roughened laminate, plating-treated laminate) were also fabricated according to Example 1.

The physical properties and evaluation results for the resin composite films obtained in the examples and comparative examples are shown in Table 3.

TABLE 1

|  |  |  | Sheet Prod. Example 1 S1 | Sheet Prod. Example 2 S2 | Sheet Prod. Example 3 S3 | Sheet Prod. Example 4 S4 | Sheet Prod. Example 5 S5 | Sheet Prod. Example 6 S6 | Sheet Prod. Example 7 S7 | Sheet Prod. Example 8 S8 | Sheet Prod. Comp. Example 1 RS1 |
|---|---|---|---|---|---|---|---|---|---|---|---|
| Starting materials | Slurly Prod. Example 1 | pts by wt | 100 |  |  |  | 100 | 100 |  |  |  |
|  | Slurly Prod. Example 2 | pts by wt |  | 50 |  | 70 |  |  |  |  |  |
|  | Slurry Prod. Example 3 | pts by wt |  |  | 100 |  |  |  |  |  |  |
|  | Slurry Prod. Example 4 | pts by wt |  | 50 |  | 30 |  |  |  |  |  |
|  | Slurry Prod. Example 5 | pts by wt |  |  |  |  |  |  | 50 |  |  |
|  | Slurry Prod. Example 6 | pts by wt |  |  |  |  |  |  | 50 |  |  |
|  | Slurry Prod. Example 7 | pts by wt |  |  |  |  |  |  |  | 100 |  |
|  | Slurry Prod. Comparative Example 1 | pts by wt |  |  |  |  |  |  |  |  | 100 |
| Production method | Single-layer |  | G | G | G | G |  | G | G | G | G |
|  | Nonwoven fabric layering |  |  |  |  |  | G |  |  |  |  |
|  | Calendering treatment |  | G | G | G | G |  |  | G |  |  |
|  | Cellulose microfiber basis weight (charging) | g/m² | 10 | 10 | 5 | 10 | 18 | 15 | 10 | 10 | 38 |
| Physical properties | Fiber sheet basis weight (measured) | g/m² | 10 | 10 | 5 | 10 | 32 | 15 | 10 | 10 | 38 |
|  | Fiber sheet thickness | μm | 17 | 17 | 5 | 17 | 135 | 40 | 10 | 55 | 100 |
|  | Air permeability resistance | sec/100 ml | 10 | 900 | 100 | 2000 | 6 | 20 | 1200 | 6 | 300 |
|  | Void percentage | % | 61 | 50 | 43 | 61 | 86 | 75 | 45 | 81 | 75 |
|  | Number average fiber diameter of cellulose microfiber layer | nm | 397 | 120 | 35 | 130 | 380 | 408 | 108 | 1502 | 65 |
|  | Maximum fiber diameter cellulose microfiber layer | μm | 11 | 13 | 6 | 1.2 | 10 | 9 | 0.9 | 13 | 0.26 |

TABLE 2

|  |  |  | Varnish Prod. Example 1 V1 | Varnish Prod. Example 2 V2 | Varnish Prod. Example 3 V3 | Varnish Prod. Example 4 V4 | Varnish Prod. Example 5 V5 | Varnish Prod. Example 6 V6 | Varnish Prod. Example 7 V7 | Varnish Prod. Example 8 V8 | Varnish Prod. Comp. Example 1 RV1 |
|---|---|---|---|---|---|---|---|---|---|---|---|
| Epoxy resin | Brominated bisphenol A-type | 1121N-80 M | 78.9 | 78.9 |  |  |  |  |  | 78.9 | 83.1 |
|  | Naphthalene-type | HP-9500 |  |  | 54.3 |  |  |  |  |  |  |
|  | Biphenyl-type | NC-3000H |  |  |  | 39.2 |  |  |  |  |  |
|  | Alicyclic | 2021P |  |  |  |  | 20.0 |  |  |  |  |
|  | Dicyclopentadiene-type | HP-7200H |  |  |  |  | 30.0 |  |  |  |  |
|  | Bisphenol A-type | 1051 |  |  |  | 39.2 |  |  |  |  |  |
|  | Bisphenol A-type | AER-250 |  |  |  |  |  |  |  |  | 85.0 |
| Curing agent | Phenol-novolac-type | N680-75 M | 14.0 | 14.0 |  |  |  |  | 14.0 | 14.7 |  |
|  | Acid anhydride-type | MH-700 |  |  | 40.6 |  |  |  |  |  |  |
|  | Aminotriazine-novolac-type | LA-3018 |  |  |  |  | 16.5 |  |  |  |  |
|  | Active ester-type | HPC8000-65T |  |  |  |  |  | 50.0 |  |  |  |
|  | m-Xylylenediamine |  |  |  |  |  |  |  |  |  | 15.0 |
|  | Dicyandiamide |  | 2.0 | 2.0 |  |  |  |  | 2.0 | 2.1 |  |
| Curing accelerator | 2-Ethyl-4-methylimidazole |  | 0.1 | 0.1 | 0.1 | 0.1 |  |  | 0.1 | 0.1 |  |
|  | 4-Dimethylaminopyridine |  |  |  |  |  |  | 0.1 |  |  |  |
| Additive | Phenoxy resin | YL7553BH30 | 5.0 | 5.0 | 5.0 | 5.0 |  | 5.0 | 5.0 |  |  |

TABLE 2-continued

|  |  |  | Varnish Prod. Example 1 V1 | Varnish Prod. Example 2 V2 | Varnish Prod. Example 3 V3 | Varnish Prod. Example 4 V4 | Varnish Prod. Example 5 V5 | Varnish Prod. Example 6 V6 | Varnish Prod. Example 7 V7 | Varnish Prod. Example 8 V8 | Varnish Prod. Comp. Example 1 RV1 |
|---|---|---|---|---|---|---|---|---|---|---|---|
|  | Rubber | XER-91 |  |  |  | 2.5 |  | 2.5 |  |  |  |
|  | Aluminum hydroxide | H-43S |  |  |  | 61.0 |  |  |  |  |  |
|  | Silica | SO25R | 32.0 | 98.0 |  |  |  | 32.0 | 121.0 | 60.6 |  |
| Heat curable resin | Polystyrene |  |  |  |  |  | 100.0 |  |  |  |  |
|  | Solid content ratio (%) |  | 70 | 70 | 70 | 70 | 70 | 70 | 70 | 70 | 100 |

TABLE 3

|  |  |  |  | Example 1 | Example 2 | Example 3 | Example 4 | Example 5 | Example 6 |
|---|---|---|---|---|---|---|---|---|---|
|  |  |  |  | F1 | F2 | F3 | F4 | F5 | F6 |
| Material | Cellulose microfiber sheet |  | Type | S1 | S2 | S1 | S3 | S4 | S5 |
|  |  |  | Num. | 1 | 1 | 1 | 1 | 1 | 1 |
|  | Varnish |  | Type | V1 | V1 | V2 | V3 | V4 | V5 |
| Prepreg | Prepreg thickness |  | μm | 23.3 | 24.2 | 70.7 | 7.2 | 35.6 | 158 |
|  | Average fiber diameter of cellulose microfibers in prepreg |  | nm | 376 | 131 | 408 | 29 | 115 | 397 |
|  | Maximum fiber diameter of cellulose microfibers in prepreg |  | μm | 12 | 12 | 10 | 7 | 1.3 | 9 |
| Resin composite film | Filling factor of fiber sheet calculated from AFM modulus mapping |  | vol % | 30 | 30 | 10 | 50 | 20 | 8 |
|  | Average fiber diameter of cellulose microfiber layer calculated from AFM modulus mapping |  | nm | 408 | 125 | 392 | 34 | 122 | 370 |
|  | Maximum fiber diameter of cellulose microfiber layer calculated from AFM modulus mapping |  | μm | 12 | 12 | 10 | 5 | 1.2 | 9 |
|  | Void percentage of cellulose microfiber layer calculated from AFM modulus mapping |  | % | 58 | 49 | 59 | 44 | 60 | 82 |
|  | Resin composite film thickness |  | μm | 22.2 | 22.2 | 66.7 | 6.7 | 33.3 | 150 |
|  | Overcoat resin layer thickness (front) |  | μm | 2.8 | 2.9 | 26.3 | 0.9 | 8 | 6.9 |
|  | Uniformity of overcoat resin layer thickness (front) |  | — | G | G | G | F | G | G |
|  | Overcoat resin layer thickness (back) |  | μm | 2.4 | 2.3 | 23.3 | 0.7 | 8.4 | 7.3 |
|  | Uniformity of overcoat resin layer thickness (back) |  | — | G | G | G | F | G | G |
|  | Inorganic filler filling factor |  | vol % | 10.5 | 10.5 | 31.5 | 0 | 20.0 | 0 |
|  | Proportion of inorganic filler included in cellulose microfiber layer |  | weight % | 2 | 2 | 2 | — | 2 | — |
|  | Moisture absorption ratio |  | weight % | 0.9 | 0.9 | 0.7 | 1.1 | 0.8 | 0.6 |
| Thick film resin composite film | Relative dielectric constant (1 GHz) |  | — | 3.8 | 3.8 | 3.6 | 3.9 | 3.7 | 3.6 |
|  | Dielectric loss tangent (1 GHz) |  | — | 0.01 | 0.01 | 0.008 | 0.011 | 0.009 | 0.008 |
| Copper-clad laminate | Copper foil peel strength |  | kgf/cm | 0.83 | 0.81 | 0.98 | 0.75 | 0.92 | 0.87 |
| Insulating layer laminate | Circuit embedding property |  | — | G | G | G | G | G | G |
| Plating-treated laminate | Thermal shock resistance test |  | — | G | G | G | VG | G | G |

|  |  |  |  | Example 7 | Example 8 | Example 9 | Example 10 | Example 11 | Comp. Example 1 |
|---|---|---|---|---|---|---|---|---|---|
|  |  |  |  | F7 | F8 | F9 | F10 | F11 | RF1 |
| Material | Cellulose microfiber sheet |  | Type | S5 | S6 | S7 | S8 | S6 | RS1 |
|  |  |  | Num. | 1 | 1 | 1 | 1 | 1 | 1 |
|  | Varnish |  | Type | V6 | V7 | V8 | V1 | — | RV1 |
| Prepreg | Prepreg thickness |  | μm | 158 | 207 | 24.9 | 102.0 | — | 115 |
|  | Average fiber diameter of cellulose microfibers in prepreg |  | nm | 392 | 403 | 102 | 1540 | — | 65 |
|  | Maximum fiber diameter of cellulose microfibers in prepreg |  | μm | 9 | 11 | 0.8 | 13 | — | 0.26 |
| Resin composite film | Filling factor of fiber sheet calculated from AFM modulus mapping |  | vol % | 8 | 5 | 29 | 9 | 29 | 25 |
|  | Average fiber diameter of cellulose microfiber layer calculated from AFM modulus mapping |  | nm | 370 | 388 | 101 | 1589 | 402 | 65 |
|  | Maximum fiber diameter of cellulose microfiber layer calculated from AFM modulus mapping |  | μm | 9 | 8 | 0.8 | 13 | 9 | 0.26 |
|  | Void percentage of cellulose microfiber layer calculated from AFM modulus mapping |  | % | 81 | 73 | 43 | 60 | 57 | 73 |

TABLE 3-continued

| | | | | | | | | |
|---|---|---|---|---|---|---|---|---|
| | Resin composite film thickness | μm | 150 | 200 | 23 | 99.1 | 103 | 100 |
| | Overcoat resin layer thickness (front) | μm | 6.9 | 77 | 6.1 | 21.6 | 31.1 | 0 |
| | Uniformity of overcoat resin layer thickness (front) | — | G | G | G | G | G | P |
| | Overcoat resin layer thickness (back) | μm | 7.3 | 83 | 6.9 | 23.9 | 32.5 | 0 |
| | Uniformity of overcoat resin layer thickness (back) | — | G | G | G | G | G | P |
| | Inorganic filler filling factor | vol % | 25.8 | 38.0 | 17.8 | 0 | 0 | 0 |
| | Proportion of inorganic filler included in cellulose microfiber layer | weight % | 2 | 2 | 2 | — | — | — |
| | Moisture absorption ratio | weight % | 1 | 0.5 | 0.9 | 0.9 | 0.2 | 3.1 |
| Thick film resin composite film | Relative dielectric constant (1 GHz) | — | 2.4 | 3.6 | 3.8 | 3.8 | — | 4.6 |
| | Dielectric loss tangent (1 GHz) | — | 0.003 | 0.009 | 0.01 | 0.01 | — | 0.014 |
| Copper-clad laminate | Copper foil peel strength | kgf/cm | 0.73 | 0.92 | 0.9 | 0.9 | — | 0.38 |
| Insulating layer laminate | Circuit embedding property | — | G | G | G | G | G | P |
| Plating-treated laminate | Thermal shock resistance test | — | G | F | G | F | — | P |

Embodiment II

Cellulose Microfiber Sheet

The physical properties of the cellulose microfiber sheet were measured by the following methods.

[Number-Average Fiber Diameter of Cellulose Microfibers]

The surfaces of cellulose microfibers in the fiber sheet were observed with a scanning electron microscope (SEM) at 10 random locations, at a magnification corresponding to 1,000× to 100,000×, according to the fiber diameters of the microfibers. A line was drawn on the obtained SEM image in the direction perpendicular to the horizontal direction of the image plane, the diameters of fibers intersecting the line were measured from the magnified image, and the number of intersecting fibers and the diameters of the fibers were counted. The number-average fiber diameter was thus calculated using the measurement results for a horizontal/vertical system in each image. The number-average fiber diameter was calculated in the same manner for two more extracted SEM images, and the results for a total of 10 images were averaged.

[Maximum Fiber Diameter of Cellulose Microfibers]

The surface of a structure composed of cellulose microfibers was observed with a scanning electron microscope (SEM) at 10 random locations, at a magnification of 500×. The fiber diameter of the thickest fiber within the 10 SEM images was recorded as the maximum fiber diameter for the cellulose microfiber sheet. A layered sheet obtained by layering onto another nonwoven fabric was observed by SEM from the cellulose microfiber sheet side.

[Sheet Basis Weight]

A sample humidified in an atmosphere at 20° C. room temperature and 50% RH was cut into a 10.0 cm×10.0 cm square piece and weighed, and calculation was performed by the following formula.

Sheet basis weight $(g/m^2)$=Weight of 10 cm-square $(g)/0.01\ m^2$

[Sheet Thickness]

The thickness of a sample humidified in an atmosphere at 20° C. room temperature, 50% RH was measured at 10 points using a surface contact-type meter (surface contact-type film thickness meter (Code No. 547-401) by Mitutoyo Corp.), and the average value was recorded as the thickness of the sample.

[Void Percentage]

Calculation was performed by the following formula, assuming the density of the cellulose microfibers to be 1.5 $g/cm^3$.

Void percentage (%)=100−([basis weight $(g/m^2)$/ {sheet thickness (μm)×1.5 $(g/cm^3)$}]×100)

[Air Permeability Resistance]

The air permeability resistance of a sample humidified in an atmosphere at 23° C. room temperature, 50% RH was measured at 10 points using an Oken-type air permeability resistance tester (Model EG01 by Asahi Seiko Co., Ltd.), and the average value was recorded as the air permeability resistance of the sample.

Slurry Production Example 1

Tencel cut filaments (3 mm lengths), as regenerated cellulose fibers acquired from Sojitz Corp., were placed in a washing net, a surfactant was added, and the mixture was washed with water several times in a washing machine to remove the oil agent on the fiber surfaces.

The refined Tencel fibers (cut filaments) were dispersed in water (400 L) to a solid content of 1.5 wt %, and a Model SDR14 Lab Refiner (pressurized disc type) by Aikawa Iron Works Co. was used as a disc refiner apparatus for beating treatment of 400 L of the aqueous dispersion for 20 minutes with a disc clearance of 1 mm. Beating treatment was then continued under conditions with the clearance reduced to a level of essentially zero. Sampling was periodically conducted, and the CSF value of the sampled slurry was evaluated according to the Canadian Standard Freeness test method (hereunder, "CSF method") for pulp as defined by JIS P 8121, by which it was confirmed that the CSF value decreased with time, reaching approximately zero and tending to increase with further beating treatment. Beating treatment was continued under the same conditions for 10 minutes after setting the clearance to nearly zero, and a beaten aqueous dispersion with a CSF value of 100 ml or greater was obtained. The obtained beaten aqueous dispersion was directly subjected to micronization treatment 5 times using a high-pressure homogenizer (NS015H by Niro Soavi) at an operating pressure of 100 MPa, to obtain a cellulose microfiber slurry (solid concentration: 1.5 wt %).

Slurry Production Example 2

Linter pulp was used as natural cellulose for the starting material. The linter pulp was immersed in water to 4 wt % and heat treated in an autoclave at 130° C. for 4 hours, and the obtained swollen pulp was washed with water several times to obtain water-impregnated swollen pulp. Next, disc refiner and high-pressure homogenizer treatment were carried out by the same method as Production Example 1, to obtain a cellulose microfiber slurry (solid concentration: 1.5 wt %). The CSF value was 100 ml or greater.

Slurry Production Example 3

A cellulose microfiber slurry (solid concentration: 1.5 wt %) was obtained by the same method as Slurry Production Example 2, except for changing the starting material to abaca pulp. The CSF value was 630 ml or greater.

Slurry Production Example 4

An aramid microfiber slurry (solid concentration: 1.5 wt %) was obtained by the same method as Slurry Production Example 1, except for changing the starting material to aramid fiber (1 mm length) by Teijin, Ltd.

Slurry Production Example 5

A cellulose microfiber slurry (solid concentration: 1.5 wt %) was obtained by the same method as Slurry Production Example 2, except that the micronization treatment at an operating pressure of 100 MPa was carried out 30 times.

Slurry Production Example 6

An aramid microfiber slurry (solid concentration: 1.5 wt %) was obtained by the same method as Slurry Production Example 4, except that the micronization treatment at an operating pressure of 100 MPa was carried out 30 times.

Slurry Production Example 7

A cellulose microfiber slurry (solid concentration: 1.5 wt %) was obtained by the same method as Slurry Production Example 1, except that treatment was interrupted when the CSF value reached zero.

Slurry Production Comparative Example 1

A sheet was produced with reference to Example 4 of Japanese Unexamined Patent Publication No. 2006-316253. A polysaccharide production medium containing 2.0% glucose (Polysaccharide-production-medium, Akihiko Shimada, Vivaorigino, 23, 1, 52-53, 1995) was subjected to high-pressure steam sterilization treatment, after which 1000 L thereof was placed in a 3000 L-capacity fermenter, strain CF-002 was inoculated to 104 CFU/ml, and agitation culture was carried out under aeration at 30° C. for 2 days, to obtain a dispersion containing a large amount of bacterial cellulose (BC). After then filtering with a screen mesh, rinsing with water and pressing, it was immersed in a 1% NaOH solution and sterilized, and then again neutralized, rinsed with water and pressed. The step of rinsing with water and pressing was repeated another 3 times to obtain a purified flocculent BC/aqueous dispersion (cellulose content: 11.6 wt %). It was then diluted with water to a cellulose concentration of 1.0 wt %, and then pre-dispersed for 10 minutes with a household mixer and subjected to dispersion treatment 4 times using a high-pressure homogenizer (NS3015H by Niro Soavi) at an operating pressure of 80 MPa.

Sheet Production Example 1

The slurry of Slurry Production Example 1 was diluted to a solid concentration of 0.2 wt % and stirred for 3 minutes with a household mixer to prepare 312.5 g of a paper-making slurry. A PET/nylon mixed spun plain woven fabric (NT20 by Shikishima Canvas Co., Ltd., water permeation: 0.03 ml/(cm$^2$·s) at 25° C. in air, able to filter cellulose microfibers to 99% or greater by filtration at atmospheric pressure, 25° C.) was set in a batch paper machine (automatic square sheet machine by Kumagai Riki Kogyo Co., Ltd., 25 cm×25 cm, 80 mesh), and then the previously prepared paper-making slurry was loaded in an amount for a cellulose sheet with a basis weight of 10 g/m$^2$, and paper-making (dewatering) was carried out with pressure reduction of 4 KPa with respect to atmospheric pressure.

The wet web comprising the wet concentrated composition on the obtained filter cloth was detached from the wire and pressed for 1 minute at a pressure of 1 kg/cm$^2$, after which the wet web surface was contacted with the drum surface of a drum dryer set to a surface temperature of 130° C., in a wet web/filter cloth two-layer state, and dried for about 120 seconds in a manner so as to keep the wet web in contact with the drum surface. The filter cloth was detached from the cellulose sheet structure of the obtained dried two-layer sheet, to obtain a white cellulose microfiber sheet (25 cm×25 cm, 10 g/m$^2$). Next, the cellulose microfiber sheet was subjected to smoothing treatment with a calender apparatus (hydraulic two-roll test embossing machine by Yuri Roll Machine Co., Ltd., upper roll: metal/lower roll: aramid, surface length: 300 mm, temperature: room temperature, pressure: 1.5 ton/300 mm), to obtain a thin-layer cellulose microfiber sheet S1.

Sheet Production Example 2

After mixing 50 parts by weight of the cellulose microfiber slurry of Slurry Production Example 2 and 50 parts by weight of the aramid microfiber slurry of Slurry Production Example 4, the mixture was diluted to a solid concentration of 0.2 wt %. It was then stirred for 3 minutes with a household mixer to prepare 312.5 g of a paper-making slurry. Next, paper-making, drying and smoothing steps were carried out by the same methods as Sheet Production Example 1, to obtain an opalescent cellulose microfiber sheet S2 containing aramid microfibers.

Sheet Production Example 3

After adding 1.2 wt % (3.9 g) and 0.012 wt % (0.039 g) of 1-hexanol and hydroxypropyl methyl cellulose (trade name: "60SH-4000", product of Shin-Etsu Chemical Co., Ltd.), respectively, to the slurry of Slurry Production Example 3 (312.5 g), the mixture was emulsified and dispersed for 4 minutes with a household mixer. Paper-making, drying and smoothing were subsequently carried out by the same method as Example 1, to obtain a cellulose microfiber sheet S3.

Sheet Production Example 4

After mixing 70 parts by weight of the cellulose microfiber slurry of Slurry Production Example 2 and 30 parts by weight of the aramid microfiber slurry of Slurry Production Example 4, the mixture was diluted to a solid concentration of 0.2 wt %. It was then stirred for 3 minutes with a household mixer to prepare 312.5 g of a paper-making slurry. While stirring 312.5 g of paper-making slurry with a Three-one motor, 1.9 g of a cationic blocked polyisocyanate (trade name: "MEIKANATE WEB", product of Meisei Chemical Works, Ltd., diluted to a solid concentration of 1.0 wt %) was added dropwise, and the mixture was then stirred for 3 minutes to obtain a paper-making slurry (total: 314.4 g). The weight ratio of the added cationic blocked polyisocyanate was 3 wt % with respect to the solid weight of the cellulose microfibers and aramid microfibers. A sheet was formed using the same methods for paper-making and drying as in Sheet Production Example 1. Next, after the smoothing step, the sheet was sandwiched between two SUS metal frames (25 cm×25 cm), anchored with a clip, and subjected to heat treatment in an oven at 160° C. for 2 minutes, to obtain an opalescent cellulose microfiber sheet S4 containing aramid microfibers crosslinked with a blocked polyisocyanate.

Sheet Production Example 5

Using the same method as Sheet Production Example 1, paper-making was carried out with a cupra long filament nonwoven fabric (trade name: BEMLIESE SN140 by Asahi Kasei Fibers Corp., basis weight: 14 g/m$^2$, film thickness: 70 μm, density: 0.2 g/cm$^3$, average monofilament size: 0.2 dtex) layered over a PET/nylon mixed spun plain weave fabric, to prepare a fiber sheet S5 having a cellulose microfiber sheet layered on a cupra long filament nonwoven fabric. No smoothing step was carried out.

Sheet Production Example 6

After mixing 50 parts by weight of the cellulose microfiber slurry of Slurry Production Example 5 and 50 parts by weight of the aramid microfiber slurry of Slurry Production Example 6, the mixture was diluted to a solid concentration of 0.2 wt %. It was then stirred for 3 minutes with a household mixer to prepare 312.5 g of a paper-making slurry. Next, paper-making, drying and smoothing steps were carried out by the same methods as Sheet Production Example 1, to obtain an opalescent cellulose microfiber sheet S6 containing aramid microfibers.

Sheet Production Example 7

While stirring 468.8 g of the cellulose microfiber slurry of Slurry Production Example 7 with a Three-one motor, 2.85 g of a cationic blocked polyisocyanate (trade name: "MEIKANATE WEB", product of Meisei Chemical Works, Ltd., diluted to a solid concentration of 1.0 wt %) was added dropwise, and the mixture was then stirred for 3 minutes to obtain a paper-making slurry (total: 471.65 g). The weight ratio of the added cationic blocked polyisocyanate was 3.0 wt % with respect to the solid weight of the cellulose microfibers. A sheet was formed using the same methods for paper-making, drying and smoothing as in Sheet Production Example 4. Next, the dry sheet was sandwiched between two SUS metal frames (25 cm×25 cm), anchored with a clip, and subjected to heat treatment in an oven at 160° C. for 2 minutes, to obtain a white cellulose microfiber sheet S7 containing cellulose microfibers crosslinked with a blocked polyisocyanate.

Sheet Production Comparative Example 1

The dispersion with a cellulose concentration of 1.0 wt % obtained in Slurry Production Comparative Example 1 was diluted with water to a cellulose concentration of 0.40 wt % and again subjected to dispersion treatment for 5 minutes with a household mixer, and the obtained dispersion was used as a paper-making dispersion. The obtained wet web was further covered with the same filter cloth and dewatered with metal rollers, to adjust the cellulose concentration to 12 to 13 wt %. First, without detaching the PET fabric, the obtained wet web was immersed in acetone and subjected to exchange treatment for about 10 minutes while occasionally gently rinsing the entire web, after which it was immersed in a mixed solution of toluene/acetone=50/50 (g/g) and subjected to exchange treatment for about 10 minutes while occasionally gently rinsing the entire web. Immediately following this, the wet web sandwiched between filter cloths was placed on a metal sheet, a deadweight was set on it for drying to a fixed length, and it was set in a drying oven and dried at 100° C. for 50 minutes. After drying, the nonwoven fabric was detached from the filter cloth to obtain a white cellulose sheet RS1.

Details for Sheet Production Examples 1 to 7 and Sheet Production Comparative Example 1

The starting materials, production methods and physical properties for Sheet Production Examples 1 to 7 and Sheet Production Comparative Example 1 are shown in Table 4 below.

Varnishes

Varnish Production Example 1

A varnish (V1) with a solid content of 70 wt % was prepared using methyl ethyl ketone as the solvent and the following compounds, mixed with a kneader.
Brominated bisphenol A-type epoxy resin 1121N-80M (Dainippon Ink & Chemicals, Inc.), 78.9 parts by weight
Phenol-novolac-type epoxy resin N680-75M (Dainippon Ink & Chemicals, Inc.), 14.0 parts by weight
Dicyandiamide (Dainippon Ink & Chemicals, Inc.), 2.0 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight
Spherical silica SO25R (Admatechs Co., Ltd., weight-average particle diameter: 0.5 μm), 32.0 parts by weight Varnish Production Example 2

Varnish V2 was produced by the same method as Varnish Production Example 1, except for adding 98 parts by weight of spherical silica SO25R (Admatechs Co., Ltd., weight-average particle diameter: 0.5 μm).

Varnish Production Example 3

A varnish (V3) with a solid content of 70 wt % was prepared using methyl ethyl ketone as the solvent and the following compounds, mixed with a kneader.
Biphenylaralkyl-type epoxy resin NC-3000 (Dainippon Ink & Chemicals, Inc.), 31.5 parts by weight
Cresol-novolac-type epoxy resin N-690 (Dainippon Ink & Chemicals, Inc.), 31.5 parts by weight
Biphenylaralkyl-type phenol MEH-7851H (Meiwa Plastic Industries, Ltd.), 30.0 parts by weight
Dicyandiamide (Dainippon Ink & Chemicals, Inc.), 1.9 parts by weight 2-Ethyl-4-methylimidazole (Shikoku Chemicals Corp.), 0.1 part by weight
Phenoxy resin YL7553BH30 (Mitsubishi Chemical Corp.), 5.0 parts by weight Varnish Production Example 4

A varnish (V4) with a solid content of 70 wt % was prepared using methyl ethyl ketone as the solvent and the following compounds, mixed with a kneader.
Bisphenol A-type epoxy resin 828EL (Mitsubishi Chemical Corp.), 21.1 parts by weight
Naphthalene-type tetrafunctional epoxy resin HP-4710 (Dainippon Ink & Chemicals, Inc.), 26.4 parts by weight
Triazine-containing phenol-novolac resin LA-7054 (Dainippon Ink & Chemicals, Inc.), 15.8 parts by weight
Naphthol-based curing agent SN-485 (TOHTO Chemical Industry Co., Ltd.), 15.8 parts by weight
Naphthol-based curing agent EXB-9500 (Dainippon Ink & Chemicals, Inc.), 15.8 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight
Aluminum hydroxide H-43S (Showa Denko K.K., mean particle diameter: 0.7 μm), 61.0 parts by weight
Crosslinked fine particle rubber XER-91 (JSR), 2.5 parts by weight Varnish Production Example 5

A varnish (V5) with a solid content of 70 wt % was prepared using methyl ethyl ketone as the solvent and the following compounds in admixture.
Naphthalene-type epoxy resin HP-9500 (Dainippon Ink & Chemicals, Inc.), 57.1 parts by weight
Liquid alicyclic acid anhydride MH-700 (New Japan Chemical Co., Ltd.), 42.8 parts by weight
2-Ethyl-4-methylimidazole (Shikoku Chemicals Corp.), 0.1 part by weight Varnish Production Example 6

A varnish (V6) with a solid content of 70 wt % was prepared using methyl ethyl ketone as the solvent and the following compounds, mixed with a kneader.
Brominated bisphenol A-type epoxy resin 1121N-80M (Dainippon Ink & Chemicals, Inc.), 83.1 parts by weight
Phenol-novolac-type epoxy resin N680-75M (Dainippon Ink & Chemicals, Inc.), 14.7 parts by weight
Dicyandiamide (Dainippon Ink & Chemicals, Inc.), 2.2 parts by weight
2-Ethyl-4-methylimidazole (Shikoku Chemicals Corp.), 0.1 part by weight
Silica SO25R (Admatechs Co., Ltd., weight-average particle diameter: 0.5 μm), 60.6 parts by weight Varnish Production Comparative Example 1

The following compounds were heated to 120° C. and mixed with a kneader to prepare a varnish (RV1) with a solid content of 100 wt %.
Bisphenol A-type epoxy resin (Asahi Kasei Epoxy Co., Ltd., AER-250), 85 parts by weight
Curing agent (m-xylylenediamine), 15 parts by weight Details for Varnish Production Examples 1 to 6 and Varnish Production Comparative Example 1

The compositions and solid contents of Varnish Production Examples 1 to 6 and Varnish Production Comparative Example 1 are shown in Table 5 below. The numerical values for each of the components in Table 5 are parts by weight.

<Resin Composite Film>

The physical properties of the resin composite films were measured by the following methods.

[Fabrication of Cross-Section Sample for Measurement]

First, platinum was vacuum vapor deposited onto both sides of a resin composite film (coating thickness: 10 nm). Next, the sample film was embedded in an epoxy resin (two-pack epoxy adhesive), and a cross-section was exposed with an ultramicrotome. A diamond knife was used for cutting, and cutting was carried out at ordinary temperature. For films containing silica, since the silica cannot be cut with a microtome, a Dual-Beam FIB device (Dual Beam Nova200 Nanolab by FEI Co., acceleration voltage: 30 kV) was used for sample working to expose a cross-section of the film. The obtained cross-section sample consisted of 5 layers: adhesive-platinum-film-platinum-adhesive, and the location of the film in the sample was distinguished by platinum vapor deposition.

[Microscopic Infrared Imaging]

By microscopic infrared imaging it was confirmed that cellulose microfibers and/or aramid microfibers were contained in all of the resin composite films. The measurement was carried out under the following conditions, using a cross-section sample of the resin composite film.
Apparatus: Nicolet™ iN™ 10 MX infrared imaging microscope (Thermo Scientific™)
Resolving power: 8 cm$^{-1}$
Number of scans: 1
Step size: x=2.5 μm, y=2.5 μm
Measurement range: 4000 to 600 cm$^{-1}$

[X-Ray Structural Analysis]

As a result of X-ray structural analysis of the composite film of Example 1, in an X-ray diffraction pattern with a 2θ range of 0° to 30°, the X-ray diffraction pattern was confirmed to have one peak at 10°≤2θ<19° and two peaks at 19°≤2θ≤30°. This identified the microfibers as either natural cellulose or regenerated cellulose.

[AFM Elastic Modulus Measurement and Modulus Mapping of Film Cross-Section]

The cross-section sample of the resin composite film was fixed onto a special sample fixing stage, and the elastic modulus of the cross-section was measured under the following AFM measurement conditions.
Apparatus: Dimension Icon by Bruker Co.
Measuring mode: Peak Force Tapping Mode
Probe: Diamond single crystal probe
Spring constant k=48 N/m, tip curvature radius R=12 nm
Resolution: 512×512 pixels
Measurement range: 15 μm×15 μm
Sampling frequency: 0.3 to 0.7 Hz
Maximum indentation load: 50 nN When the distribution of cellulose microfibers could not be confirmed with a resolution of 512×512 pixels and a measurement range of 15 μm×15 μm, measurement was performed with a measurement range of 3 μm×3 μm and with a measurement range of 1 μm×1 μm, at the same resolution as above.

Incidentally, for Examples 2 to 9 and Comparative Example 1 as well, modulus mapping was carried out according to the modulus mapping of Example 1 described below.

[Cellulose Microfiber Filling Factor]

The filling factor for the cellulose microfibers was defined as the area ratio of cellulose microfibers occupying the entire film in an AFM elastic modulus image of the film cross-section. The elastic modulus differs for different materials, and modulus mapping was performed for each material in the film by setting the threshold value for the histogram of the elastic modulus. For example, for a resin composite film composed entirely of cellulose microfibers and an epoxy, a contrast image is obtained for the epoxy (soft phase) and cellulose microfibers (hard phase). The histogram was largely divided into two peaks, and the midpoint between the two peaks of the histogram was set as the threshold value for binarization (cellulose: black, epoxy: white). When the thickness of the film was greater than the AFM measurement range of 15 μm, the measurement was performed after first separating the cross-section of the film into multiple visual fields. Next, after preparing modulus mapping in each visual field, the images were joined to obtain an image with the film cross-section fitted into a single image. From modulus mapping with all of the resin composite film cross-sections visible, the area due to the cellulose microfibers and the area of the entire film were calculated using the image editing software "imageJ", and finally the filling factor of the cellulose microfibers was determined by the following formula.

Cellulose microfiber filling factor (%)=area due to cellulose microfibers/entire film area×100

The filling factor of the cellulose microfibers in the film cross-section was calculated at 10 locations using the method described above, and the average value of 8 points, excluding the maximum and minimum values, was recorded as the filling factor of the cellulose microfibers for the entire film.

[Average Fiber Diameter of Cellulose Microfibers]

From modulus mapping with all of the resin composite film cross-sections visible, the area ($\Sigma S$) due to the cellulose microfibers and the total length ($\Sigma L$) of the interfaces between the cellulose microfibers and other materials (mainly epoxy) were calculated using the image editing software "imageJ", after which the average fiber diameter of the cellulose microfibers was calculated by the following formula.

Average fiber diameter of cellulose microfibers (nm) =4×$\Sigma S/\Sigma L$

The average fiber diameter of the cellulose microfibers in the film cross-section was calculated at 10 locations using the method described above, and the average value of 8 points, excluding the maximum and minimum values, was recorded as the average fiber diameter of the cellulose microfibers for the entire film.

[Maximum Fiber Diameter of Cellulose Microfibers]

Particle analysis was conducted with the image editing software "imageJ" for the modulus mapping at 10 locations with all of the resin composite film cross-sections visible, and the particle diameters were calculated assuming the cellulose microfiber diameters to be perfect circles. The largest particle diameter was used as the maximum fiber diameter of the cellulose microfibers.

For the average fiber diameter and maximum fiber diameter of the cellulose microfibers in the prepreg, the prepreg was first impregnated with an organic solvent and the resin component was removed by dissolution, after which a scanning electron microscope (SEM) was used for measurement of the number-average fiber diameter and maximum fiber diameter of the fiber sheet in the same manner as described above.

[Void Percentage of Cellulose Microfiber Layer in Resin Composite Film]

From modulus mapping with all of the resin composite film cross-sections visible, the area ($\Sigma S$) due to the cellulose microfibers and the area ($\Sigma Sp$) due to the resin present between the fibers composing the cellulose microfiber layer (excluding the overcoat resin layer), determined in the same manner, were calculated using the image editing software "imageJ", after which the void percentage of the cellulose microfiber layer in the resin composite film was calculated by the following formula.

Void percentage of cellulose microfiber layer in resin composite film (%)=$\Sigma S/(\Sigma S+\Sigma Sp)\times 100$

[Filling Factor of Inorganic Filler in Resin Composite Film]

The filling factor of the inorganic filler in the resin composite film was defined as the area ratio of the resin composite film cross-section occupied by the atoms composing the inorganic filler. For example, Si was measured for silica particles, and Al was measured for aluminum hydroxide particles. The measuring method will now be explained, using silica particles as an example. After conductive treatment of a cross-section sample with C paste and Os coating, a "HITACHI S-4800" scanning electron microscope (product of Hitachi High-Tech Fielding Corp.) was used for imaging with a photograph magnification of 500×, an acceleration voltage of 1.0 kV and the detector set to secondary electrons, to obtain a cross-sectional SEM image. Next, an energy dispersive X-ray detector (X-Max SILICON DRIFT X-RAY DETECTOR by Horiba, Ltd.) was used in the same visual field, to obtain element mapping for C and Si. For the area ratio, first the sections of the SEM secondary electron image of the film cross-section corresponding to the outer perimeter of the film were cut out using the image editing software "imageJ", to show only the film cross-section. Binarization was then performed, showing the silica portions as black and the other portions as white. The threshold value for black/white binarization was selected so that the portions represented in black corresponded to the Si regions in EDX, and the black area was calculated as a count number. The area of the entire cross-section of the film was also calculated as a count number. The ratio of Si occupying the entire film cross-section was calculated from the ratio of the two, using the following formula.

Inorganic filler filling factor (%)=area of inorganic filler/area of entire film×100

The filling factor of the inorganic filler in the film cross-section was determined at 10 locations using the method described above, and the average value of 8 points, excluding the maximum and minimum values, was recorded as the average filling factor of the inorganic filler in the resin composite film.

Here, binarization refers to binarization based on the difference in the elements of the organic material (resin or fibers) and inorganic material (inorganic filler).

[Proportion of Inorganic Filler in Cellulose Microfiber Layer]

For the proportion of the inorganic filler in the cellulose microfiber layer, the total area due to the inorganic filler in the resin composite film and the area due to the inorganic filler in the cellulose microfiber layer were calculated from modulus mapping of the resin composite film cross-section, using the image editing software "imageJ", and finally the proportion of the inorganic filler in the cellulose microfiber layer was determined by the following formula. The cellulose microfiber layer is defined as the region delineated by selecting at least 10 points in order from the edge of the cellulose microfiber sheet near the outer surface of the film and connecting them with a line.

> Proportion of inorganic filler in cellulose microfiber layer (%)=(area of inorganic filler in cellulose microfibers/total area of inorganic filler in resin composite film)×100

The proportion of the inorganic filler in the cellulose microfiber layer in the resin composite film cross-section was calculated at 10 locations using the method described above, and the average value of 8 points, excluding the maximum and minimum values, was recorded as the proportion of the inorganic filler in the cellulose microfiber layer.

[Overcoat Resin Layer Thickness]

The length from the outer surface of the resin composite film to the surface of the nonwoven fabric layer is defined as the overcoat resin layer. The nonwoven fabric layer is defined as the layer comprising organic fibers, including the cellulose microfiber layer. By AFM modulus mapping it can be confirmed to be composed of 3 layers: epoxy layer (front)/nonwoven fabric layer/epoxy layer (back). The length from the outer surface of the film to the surface of the nonwoven fabric layer is measured at 10 points each on the front and back, and the average values are recorded as the overcoat resin layer thickness (front) and the overcoat resin layer thickness (back).

[Storage Elastic Modulus (E')]

The obtained resin composite film was cut to 4 mm width×30 mm length as a measuring sample. It was measured using an EXSTAR TMA6100 viscoelasticity meter (SII Nanotechnology, Inc.) in tension mode with a chuck distance of 20 mm and a frequency of 1 Hz, under a nitrogen atmosphere, raising the temperature from room temperature to 200° C. at 5° C./min, lowering the temperature from 200° C. to 25° C. at 5° C./min, and then again raising the temperature from 25° C. to 200° C. at 5° C./min. The storage elastic modulus (E'150, E'200) was determined at 150° C. and 200° C. during the 2nd temperature increase.

[Change in Storage Elastic Modulus]

The change in storage elastic modulus from 150° C. to 200° C. is expressed by the following formula:

> storage elastic modulus change rate=$E'150/E'200$.

Generally, the storage elastic modulus is lower at higher temperature (E'150>E'200), and therefore the storage elastic modulus change rate is 1 or greater. A value closer to 1 may be considered lower change in storage elastic modulus at high temperature, and thus the material exhibits higher heat resistance.

[Coefficient of Linear Thermal Expansion (CTE)]

The resin composite film was cut to 3 mm width×25 mm length as a measuring sample. It was measured using a model SII TMA6100 in tension mode with a chuck distance of 10 mm and load of 5 g, under a nitrogen atmosphere, raising the temperature from room temperature to 200° C. at 5° C./min, lowering the temperature from 200° C. to 25° C. at 5° C./min, and then again raising the temperature from 25° C. to 200° C. at 5° C./min. The coefficient of linear thermal expansion (CTE150, CTE200) was determined at 150° C. and 200° C. during the 2nd temperature increase. CTE150 and CTE200 are the linear expansion coefficients at 1° C. ranges of 149° C. to 150° C. and 199° C. to 200° C., respectively, and they are expressed by the following formulas.

> CTE150=($L$150−$L$149)/$L$100×($10^6$)

> CTE200=($L$200−$L$199)/$L$200×($10^6$)

L149, L150, L199 and L200: Chuck distance lengths at 149° C., 150° C., 199° C. and 200° C.

[CTE Difference]

The absolute value of the CTE difference between 150° C. and 200° C. is expressed by the following formula.

> CTE difference=|CTE200−CTE150|

[Glass Transition Temperature (Tg)]

An EXSTAR TMA6100 viscoelasticity meter (SII Nanotechnology, Inc.) was used to measure the Tg of the resin composite film. It was measured in tension mode with a chuck distance of 20 mm and a frequency of 1 Hz, under a nitrogen atmosphere, raising the temperature from room temperature to 200° C. at 5° C./min, lowering the temperature from 200° C. to 25° C. at 5° C./min, and then again raising the temperature from 25° C. to 200° C. at 5° C./min. The Tg was defined as the intersection between the baseline at the 2nd temperature increase, and the tangent line at the inflection point (the point where the upward convex curve changes to a lower convex curve).

[Prepreg Thickness]

The thickness was measured at 10 points in the prepreg, and the average value was recorded as the film thickness of the prepreg. A surface contact-type meter (surface contact-type film thickness meter (Code No. 547-401) by Mitutoyo Co.) was used as the film thickness meter.

[Resin Composite Film Thickness]

The thickness of the obtained resin composite film was measured at 10 points and the average value was recorded as the film thickness. A surface contact-type meter (surface contact-type film thickness meter (Code No. 547-401) by Mitutoyo Co.) was used as the film thickness meter.

[Moisture Absorption Ratio]

The resin composite film was cut to a 50 mm square and dried at 120° C. for 2 hours and then the initial weight (W0) was measured, after which the weight (W1) after moisture absorption treatment under conditions of humidity: 85%/temperature: 85° C./192 hours was measured. The moisture absorption ratio was determined by the following formula.

> Moisture absorption ratio (%)=($W$1−$W$0)/$W$0×100

[Dielectric Characteristics (Relative Dielectric Constant and Dielectric Loss Tangent)]

A thick resin composite film with a thickness of 0.8 mm was cut out to a size of 1.5 mm (width)×80 mm (length) for use as a measuring sample. The value at 1 GHz was measured by the cavity resonance method (Model 8722ES network analyzer, product of Agilent Technologies; cavity resonator, product of Kanto Electronics Application and Development Inc.).

[Thermal Shock Resistance Test]

A plating-treated laminate was exposed to low temperature (−55° C.) and high temperature (125° C.) for 30 minutes each using a thermal shock device (TSA-71S-A/W by Espec), based on MIL-STD-883E conditions A (−55° C. to 125° C.), and 200 such cycles were conducted. The condition of failure of the copper wiring or the copper/resin interface was observed using an optical microscope photograph (transmitted light, magnification: 25× to 100×) and a cross-sectional SEM (magnification 5000×), and an organoleptic evaluation was carried out based on the following scale. Sections with peeling or blistering of the wiring, or cracking, were defined as failure locations, and a lower number of failure locations was evaluated as superior adhesiveness.

VG: ≤1 failure location by observation under the described conditions.

G: ≥2 and ≤5 failure locations by observation under the described conditions.

F: ≥6 and ≤10 failure locations by observation under the described conditions.

P: ≥11 failure locations by observation under the described conditions.

Example 1

(Fabrication of Prepreg)

Varnish V1 was coated to 0.3 g onto the release surface of a 20 cm-square polyethylene terephthalate support film (thickness: 16 μm) using a film applicator, and then the cellulose microfiber sheet (S1) cut to 10 cm-square was placed on it, and the varnish V1 was recoated to 0.3 g on the cellulose microfiber sheet using an applicator. The obtained film was heated to 100° C. for 4 minutes to remove the solvent and obtain a semi-cured prepreg.

(Fabrication of Resin Composite Film)

After covering the prepreg with another polyethylene terephthalate support film (thickness: 16 μm) with the release surface contacting, it was cured with a vacuum heat press machine (heating temperature: 220° C., pressure: 6.0 MPa, time: 160 min). The support film was removed from the obtained cured film to obtain a resin composite film. The physical properties of the obtained resin composite film (F1) are shown in Table 6.

An AFM elastic modulus image of the obtained resin composite film is shown in FIG. 1(a), an elastic modulus histogram is shown in FIG. 1(b), and a binarized image is shown in FIG. 1(c). In FIG. 1(c), the shaded area corresponds to the fibers constituting the cellulose microfiber sheet.

Also, FIG. 2 shows a processed image where the cellulose microfiber layer is defined as the region obtained by calculating the area due to the inorganic filler and the area due to the silica filler in the cellulose microfiber layer from modulus mapping of the resin composite film cross-section in FIG. 1(a), using the image editing software "image)", selecting at least 10 points at the edge of the cellulose microfiber sheet near the film outer surface, and connecting them with a line.

(Fabrication of Copper-Clad Laminate)

A prescribed number of sheets of the prepreg were stacked for a final cured thickness in the range of 0.7 mm to 0.9 mm, an electrolytic copper foil F2-WS (Furukawa Circuit Foil Co., Ltd., thickness: 18 μm, treated side Rz=2.3 μm) was situated above and below, and the stack was pressed for 60 minutes at a pressure of 2.5 MPa and a temperature of 240° C., to obtain a copper-clad laminate.

[Fabrication of Thick Resin Composite Film]

The copper-clad laminate was immersed in a copper etching solution to completely remove the copper foil, in order to fabricate a thick resin composite film for evaluation.

(Fabrication of Inner Layer Circuit Board)

On a glass cloth substrate/epoxy resin double-sided copper-clad laminate (copper foil thickness: 35 μm, substrate thickness: 0.8 mm, "R5715ES", product of Matsushita Electric Works, Ltd.) there was formed the pattern of an IPC MULTI-PURPOSE TEST BOARD NO. IPC C-25 (comb tooth pattern with line/space ratio=600/660 μm (residual copper: 48%)). Next, both sides of the substrate were roughened with a microetching agent ("CZ8100" by MEC Co., Ltd.) to fabricate an inner layer circuit board.

(Insulating Layer Formation)

The prepreg was laminated onto both sides of the inner layer circuit board using a vacuum laminator by Meiki Co., Ltd. under conditions with a temperature of 120° C., a pressure of 7 kgf/cm$^2$ and an air pressure of mmHg, and then continuously hot pressed with a SUS end plate under conditions with a temperature of 120° C. and a pressure of 5 kgf/cm$^2$, under atmospheric pressure. After then detaching the PET film, it was thermoset at 180° C. for 30 minutes to form an insulating layer on both sides of the substrate.

(Fabrication of Roughened Laminate)

For chemical roughening of the cured resin layer on the insulating layer-formed circuit board, an aqueous solution of diethyleneglycol monobutyl ether: 200 ml/L and of NaOH: 5 g/L was prepared as a swelling solution and heated to 80° C., and immersion treatment was carried out for 5 minutes. Next, an aqueous solution of $KMnO_4$: 60 g/L and of NaOH: 40 g/L was prepared as a roughening solution and heated to 80° C., and immersion treatment was carried out for 15 minutes. An aqueous neutralizing solution ($SnCl_2$: 30 g/L, HCl: 300 ml/L) was then prepared and heated to 40° C., and immersion treatment was carried out for 5 minutes for reduction of the $KMnO_4$.

(Fabrication of Plating-Treated Laminate)

In order to form a circuit on the roughened insulating layer surface by a semi-additive process, the inner layer circuit board was immersed in an electroless plating solution containing $PdCl_2$ at 40° C. for 5 minutes, and then immersed in an electroless copper plating solution at 25° C. for 20 minutes. After heating at 150° C. for 30 minutes for annealing treatment, an etching resist was formed, and after pattern formation by etching (straight slit wiring with L/S=40 μm/40 μm, 5 cm length), copper sulfate electrolytic plating and annealing treatment were carried out at 200° C. for 60 minutes, to form a 30 μm-thick conductive layer.

Example 2

Different resin composite films F2 (prepreg, resin composite film, copper-clad laminate, thick resin composite film, insulating layer laminate, roughened laminate, plating-treated laminate) were fabricated by the same method as Example 1, except that the cellulose microfiber sheet was S2.

Example 3

Different resin composite films F3 (prepreg, resin composite film, copper-clad laminate, thick resin composite film, insulating layer laminate, roughened laminate, plating-treated laminate) were fabricated by the same method as Example 1, except that the coating amount of the varnish (V2) was 0.9 g.

Example 4

Different resin composite films F4 (prepreg, resin composite film, copper-clad laminate, thick resin composite film, insulating layer laminate, roughened laminate, plating-treated laminate) were fabricated by the same method as Example 1, except that the cellulose microfiber sheet was S3, the varnish was V3, and the coating amount of the varnish was 0.1 g. The total light transmittance of the resin composite film was measured to be 82%.

Example 5

Different resin composite films F5 (prepreg, resin composite film, copper-clad laminate, thick resin composite film, insulating layer laminate, roughened laminate, plating-treated laminate) were fabricated by the same method as Example 1, except that the cellulose microfiber sheet was S4, the varnish was V4, and the coating amount of the varnish was 0.1 g.

Example 6

A varnish (V5) was coated to 0.8 g onto the release surface of a 20 cm-square polyethylene terephthalate support film (thickness: 16 μm) using a film applicator, and then the cellulose microfiber layered sheet (S5) cut to 10 cm-square was placed on it with the cellulose microfiber side in contact, and the varnish (V5) was recoated to 8.0 g on the cellulose microfiber sheet using an applicator. Different resin composite films F6 (prepreg, resin composite film, copper-clad laminate, thick resin composite film, insulating layer laminate, roughened laminate, plating-treated laminate) were fabricated, otherwise by the same method as Example 1.

Example 7

Slurry Production Example 3 was used for paper-making and fabrication of a wet web by the method of Sheet Production Example 1. Next, exchange was performed 5 times with isopropanol to prepare an isopropanol dispersion of the cellulose microfibers, and finally the isopropanol was removed by vacuum filtration. The obtained cellulose microfiber sheet was added to varnish V1 and mixed with a vacuum kneader. The obtained mixture was coated at 1 g onto the release surface of a 20 cm-square polyethylene terephthalate support film (thickness: 16 μm) using an applicator. The obtained film was heated to 100° C. for 10 minutes in a vacuum to remove the solvent and obtain a semi-cured prepreg. Different resin composite films F7 (prepreg, resin composite film, copper-clad laminate, thick resin composite film, insulating layer laminate, roughened laminate, plating-treated laminate) were fabricated, otherwise by the same method as Example 1.

Example 8

Different resin composite films F8 (prepreg, resin composite film, copper-clad laminate, thick resin composite film) were fabricated by the same method as Example 2, except that the cellulose microfiber sheet was S6 and the varnish was V6.

Example 9

Different resin composite films F9 (prepreg, resin composite film, copper-clad laminate, thick resin composite film, insulating layer laminate, roughened laminate, plating-treated laminate) were fabricated by the same method as Example 1, except that the cellulose microfiber sheet was S7 and the varnish was V1.

Comparative Example 1

A resin composite film was produced with reference to Example 4 of Japanese Unexamined Patent Publication No. 2006-316253. One sheet of the varnish RV1 obtained in Varnish Production Comparative Example 1 impregnated in the cellulose nonwoven fabric RS-1 obtained in Sheet Production Comparative Example 1 (impregnation time: minutes) was thermoset in a hot press machine at a temperature of 100° C. and a pressure of 9.81 MPa (curing time: 1 hour), to fabricate resin composite film RF1. Also, copper-clad laminate and thick resin composite film fabrication, insulating layer formation, roughening treatment and plating treatment were carried out by the same methods as Example 1.

The materials and evaluation results for Examples 1 to 9 and Comparative Example 1 are shown in Table 6.

TABLE 4

| | | | Sheet Prod. Example 1 S1 | Sheet Prod. Example 2 S2 | Sheet Prod. Example 3 S3 | Sheet Prod. Example 4 S4 | Sheet Prod. Example 5 S5 | Sheet Prod. Example 6 S6 | Sheet Prod. Example 7 S7 | Sheet Prod. Comp. Example 1 RS1 |
|---|---|---|---|---|---|---|---|---|---|---|
| Starting materials | Slurry Prod. Example 1 | pts by wt | 100 | | | | 100 | | | |
| | Slurry Prod. Example 2 | pts by wt | | 50 | | 70 | | | | |
| | Slurry Prod. Example 3 | pts by wt | | | 100 | | | | | |
| | Slurry Prod. Example 4 | pts by wt | | 50 | | 30 | | | | |
| | Slurry Prod. Example 5 | pts by wt | | | | | | 50 | | |
| | Slurry Prod. Example 6 | pts by wt | | | | | | 50 | | |
| | Slurry Prod. Example 7 | pts by wt | | | | | | | 100 | |
| | Slurry Prod. Comparative Example 1 | pts by wt | | | | | | | | 100 |
| Production method | Single-layer | | G | G | G | G | | G | G | G |
| | Nonwoven fabric layering | | | | | | G | | | |
| | Calendering treatment | | G | G | G | G | | G | | |
| | Cellulose microfiber basis weight (charging) | g/m² | 10 | 10 | 5 | 10 | 18 | 10 | 10 | 38 |

TABLE 4-continued

| | | | Sheet Prod. Example 1 S1 | Sheet Prod. Example 2 S2 | Sheet Prod. Example 3 S3 | Sheet Prod. Example 4 S4 | Sheet Prod. Example 5 S5 | Sheet Prod. Example 6 S6 | Sheet Prod. Example 7 S7 | Sheet Prod. Comp. Example 1 RS1 |
|---|---|---|---|---|---|---|---|---|---|---|
| Physical properties | Sheet basis weight (measured) | g/m² | 10 | 10 | 5 | 10 | 32 | 10 | 10 | 38 |
| | Sheet thickness | μm | 17 | 17 | 5 | 17 | 135 | 10 | 55 | 100 |
| | Air permeability resistance | sec/100 ml | 10 | 900 | 100 | 2000 | 6 | 1200 | 6 | 300 |
| | Void percentage | % | 61 | 50 | 43 | 61 | 86 | 45 | 81 | 75 |
| | Number average fiber diameter of cellulose microfibers | nm | 397 | 120 | 35 | 130 | 380 | 108 | 1502 | 65 |
| | Maximum fiber diameter of cellulose microfibers | μm | 11 | 13 | 6 | 1.2 | 10 | 0.9 | 13 | 0.26 |

TABLE 5

| | | | Varnish Prod. Example 1 V1 | Varnish Prod. Example 2 V2 | Varnish Prod. Example 3 V3 | Varnish Prod. Example 4 V4 | Varnish Prod. Example 5 V5 | Varnish Prod. Example 6 V6 | Varnish Prod. Comp. Example 1 RV1 |
|---|---|---|---|---|---|---|---|---|---|
| Epoxy resin | Brominated bisphenol A-type | 1121N-80 M | 78.9 | 78.9 | | | | 83.1 | |
| | Cresol-type | N-690 | | | 31.5 | | | | |
| | Biphenylaralkyl-type | NC-3000 | | | 31.5 | | | | |
| | Naphthalene-type | HP-4710 | | | | 26.4 | | | |
| | Naphthalene-type | HP-9500 | | | | | 57.1 | | |
| | Bisphenol A-type | 828EL | | | | 21.1 | | | |
| | Bisphenol A-type | AER-250 | | | | | | | 85 |
| Curing agent | Phenol-novolac-type | N680-75 M | 14.0 | 14.0 | | | | 14.7 | |
| | Phenylaralkyl-type phenol | MEH-7851H | | | 30.0 | | | | |
| | Triazine-containing phenol-novolac-type | LA-7054 | | | | 15.8 | | | |
| | Naphthol-type | SN-485 | | | | 15.8 | | | |
| | Naphthol-type | EXB-9500 | | | | 15.8 | | | |
| | Acid anhydride-type | MH-700 | | | | | 42.8 | | |
| | m-Xylylenediamine | | | | | | | | 15.0 |
| | Dicyandiamide | | 2.0 | 2.0 | 1.9 | | | 2.2 | |
| Curing accelerator | 2-Ethyl-4-methylimidazole | | 0.1 | 0.1 | 0.1 | 0.1 | 0.1 | 0.1 | |
| Additive | Phenoxy resin | YL7553BH30 | 5.0 | 5.0 | 5.0 | 5.0 | | | |
| | Rubber | XER-91 | | | | 2.5 | | | |
| | Aluminum hydroxide | H-43S | | | | 61.0 | | | |
| | Silica | SO25R | 32.0 | 98.0 | | | | 60.6 | |
| | Solid content ratio (%) | | 70 | 70 | 70 | 70 | 70 | 70 | 100 |

TABLE 6

| | | | Example 1 F1 | Example 2 F2 | Example 3 F3 | Example 4 F4 | Example 5 F5 | Example 6 F6 | Example 7 F7 | Example 8 F8 | Example 9 F9 | Comp. Example 1 RF1 |
|---|---|---|---|---|---|---|---|---|---|---|---|---|
| Material | Cellulose microfiber sheet | Sheet used | S1 | S2 | S1 | S3 | S4 | S5 | Slurry Prod. Example 3 | S6 | S7 | RS1 |
| | | Num. | 1 | 1 | 1 | 1 | 1 | 1 | — | 1 | 1 | 1 |
| | Varnish | Varnish used | V1 | V1 | V2 | V3 | V4 | V5 | V1 | V6 | V1 | RV1 |
| Prepreg | Prepreg thickness | μm | 23.3 | 24.2 | 70.7 | 7.2 | 35.6 | 158 | 44 | 24.9 | 102.0 | 115 |
| Resin composite film | Filling factor of cellulose microfibers calculated from AFM modulus mapping | vol % | 30 | 30 | 10 | 50 | 20 | 8 | 20 | 29 | 9 | 25 |
| | Average fiber diameter of cellulose microfibers calculated from AFM modulus mapping | nm | 408 | 125 | 392 | 34 | 122 | 370 | 32 | 101 | 1589 | 65 |

TABLE 6-continued

| | | | Example 1 F1 | Example 2 F2 | Example 3 F3 | Example 4 F4 | Example 5 F5 | Example 6 F6 | Example 7 F7 | Example 8 F8 | Example 9 F9 | Comp. Example 1 RF1 |
|---|---|---|---|---|---|---|---|---|---|---|---|---|
| | Maximum fiber diameter of cellulose microfibers calculated from AFM modulus mapping | μm | 12 | 12 | 10 | 5 | 1.3 | 9 | 4 | 0.8 | 13 | 0.26 |
| | Void percentage of cellulose microfiber layer calculated from AFM modulus mapping | % | 59 | 48 | 42 | 59 | 84 | 44 | — | 44 | 60 | 73 |
| | E'150 | GPa | 3 | 3.5 | 1.5 | 2.5 | 1.8 | 2 | 1.8 | 3.7 | 2 | 2 |
| | E'200 | GPa | 2 | 2.5 | 0.9 | 1.9 | 1 | 1.1 | 0.7 | 3.0 | 0.9 | 0.4 |
| | E'150/E'200 | — | 1.5 | 1.4 | 1.7 | 1.3 | 1.8 | 1.8 | 2.6 | 1.2 | 2.2 | 5.0 |
| | CTE150 | ppm/°C. | 30 | 20 | 40 | 27 | 30 | 40 | 51 | 18 | 42 | 50 |
| | CTE200 | ppm/°C. | 40 | 15 | 70 | 21 | 45 | 75 | 71 | 36 | 76 | 110 |
| | \|CTE200 − CTE150\| | ppm/°C | 10 | 5 | 30 | 6 | 15 | 35 | 20 | 18 | 34 | 60 |
| | Glass transition point | °C. | 151 | 151 | 151 | 189 | 192 | 150 | 151 | 151 | 151 | 145 |
| | Film thickness | μm | 22.2 | 22.2 | 66.7 | 6.7 | 33.3 | 150 | 40 | 23.0 | 99.1 | 100 |
| | Thickness of overcoat resin layer (front) | μm | 2.8 | 2.9 | 26.3 | 0.9 | 8.0 | 6.9 | 0 | 6.1 | 21.6 | 0 |
| | Thickness of overcoat resin layer (back) | μm | 2.4 | 2.3 | 23.3 | 0.7 | 8.4 | 7.3 | 0 | 6.9 | 23.9 | 0 |
| | Inorganic filler filling factor | vol % | 10.5 | 10.5 | 31.5 | 0 | 20 | 0 | 0 | 17.8 | 0 | 0 |
| | Proportion of inorganic filler included in cellulose microfiber layer | % | 2 | 2 | 2 | — | 2 | — | — | 2 | — | — |
| Thick film resin composite film | Moisture absorption ratio | % | 0.9 | 0.9 | 0.7 | 1.1 | 0.8 | 0.6 | 1.4 | 0.9 | 0.9 | 3.1 |
| | Relative dielectric constant (1 GHz) | — | 3.8 | 3.8 | 3.6 | 3.9 | 3.7 | 3.6 | 4.1 | 3.8 | 3.8 | 4.6 |
| | Dielectric loss tangent (1 GHz) | — | 0.010 | 0.010 | 0.008 | 0.011 | 0.009 | 0.008 | 0.011 | 0.010 | 0.010 | 0.014 |
| Plating-treated laminate | Thermal shock resistance test | — | G | G | G | VG | G | G | G | G | F | P |

Embodiment III

<<Measuring and Evaluation Methods>>
<<Methods for Physical Property Measurement and Evaluation of Cellulose Fiber Sheet and Prepreg>>
(1) Number-Average Fiber Diameter of Cellulose Microfibers The surfaces of cellulose microfibers in the fiber sheet were observed with a scanning electron microscope (SEM) at 10 random locations, at a magnification corresponding to 1,000× to 100,000×, according to the fiber diameters of the microfibers. A line was drawn on the obtained SEM image in the direction perpendicular to the horizontal direction of the image plane, the diameters of fibers intersecting the line were measured from the magnified image, and the number of intersecting fibers and the diameters of the fibers were counted. The number-average fiber diameter was thus calculated using the measurement results for a horizontal/vertical system in each image. The number-average fiber diameter was calculated in the same manner for two more extracted SEM images, and the results for a total of 10 images were averaged.

(2) Maximum Fiber Diameter of Fibers Constituting Cellulose Microfiber Sheet

The surface of the fiber sheet was observed with a scanning electron microscope (SEM) at 10 random locations, at a magnification of 500×. The fiber diameter of the thickest fiber within the 10 SEM images was recorded as the maximum fiber diameter for the fiber sheet. A multilayer structure obtained by layering onto another nonwoven fabric or the like was observed by SEM from the fiber sheet side.

(3) Sheet Basis Weight

A sample humidified in an atmosphere at 20° C. room temperature and 50% RH was cut into a 10.0 cm×10.0 cm square piece and weighed, and calculation was performed by the following formula.

Sheet basis weight (g/m$^2$)=10 cm-square sample weight (g)/0.01 m$^2$ (4) Sheet Thickness The thickness of a sample humidified in an atmosphere at 20° C. room temperature, 50% RH was measured at 10 points using a surface contact-type meter (surface contact-type film thickness meter (Code No. 547-401) by Mitutoyo Corp.), and the average value was recorded as the thickness of the sample.

(5) Void Percentage

Calculation was performed by the following formula, assuming the density of the cellulose microfibers to be 1.5 g/cm$^3$.

Void percentage (%)=100−([basis weight (g/m$^2$)/ {sheet thickness (μm)×1.5 (g/cm$^3$)}]×100)

(6) Air Permeability Resistance

The air permeability resistance of a sample humidified in an atmosphere at 23° C. room temperature, 50% RH was measured at 10 points using an Oken-type air permeability resistance tester (Model EG01 by Asahi Seiko Co., Ltd.), and the average value was recorded as the air permeability resistance of the sample.

(7) Prepreg Thickness

The thickness was measured at 10 points in the prepreg, and the average value was recorded as the film thickness of the prepreg. A surface contact-type meter (surface contact-type film thickness meter (Code No. 547-401) by Mitutoyo Co.) was used as the film thickness meter.

(8) Number-Average Fiber Diameter and Maximum Fiber Diameter of Cellulose Microfibers in Prepreg The prepreg was impregnated with methyl ethyl ketone to dissolve the resin component, and the cellulose microfibers were dispersed. The dispersion was then subjected to vacuum filtration (pressure reduction: −0.09 MPa (absolute degree of vacuum: 10 kPa)). The filter used was a KG-90 by Advantech, Inc., with a 1.0 μm-diameter PTFE membrane filter (effective filtration area: 48 cm$^2$) also by Advantech, Inc. on the glass filter. The cellulose fibers accumulated on the PTFE membrane filter were dried in an oven at 120° C. to obtain a film made of cellulose fibers. The number-average fiber diameter and maximum fiber diameter of the film were calculated using the following SEM observation method.

First, 10 random locations on the surface of a structure composed of cellulose microfibers were observed with a scanning electron microscope (SEM) at a magnification corresponding to 1,000× to 100,000×, according to the fiber diameters of the microfibers. A line was drawn on the obtained SEM image in the direction perpendicular to the horizontal direction of the image plane, the diameters of fibers intersecting the line were measured from the magnified image, and the number of intersecting fibers and the diameters of the fibers were counted. The number-average fiber diameter was thus calculated using the measurement results for a horizontal/vertical system in each image. The number-average fiber diameter was calculated in the same manner for two more extracted SEM images, and the results for a total of 10 images were averaged to obtain the average fiber diameter for the sample being measured.

Ten locations on the surface of the structure were observed by SEM at a magnification of 500×. The thickest fiber diameter within the 10 SEM images was recorded as the maximum fiber diameter.

A multilayer structure obtained by layering onto a nonwoven fabric or the like was observed by SEM from the cellulose microfiber sheet side.

<Methods for Physical Property Measurement and Evaluation of Resin Composite Film>

(1) Fabrication of Cross-Section Sample for Measurement

First, platinum was vacuum vapor deposited onto both sides of a resin composite film (coating thickness: 10 nm). Next, the sample film was embedded in an epoxy resin (two-pack epoxy adhesive), and a cross-section was exposed with an ultramicrotome. A diamond knife was used for cutting, and cutting was carried out at ordinary temperature. For films containing silica, since the silica cannot be cut with a microtome, a Dual-Beam FIB device (Dual Beam Nova200 Nanolab by FEI Co., acceleration voltage: 30 kV) was used for sample working to expose a cross-section of the film. The obtained cross-section sample consisted of 5 layers: adhesive-platinum-film-platinum-adhesive, and the location of the film in the sample was distinguished by platinum vapor deposition.

(2) Microscopic Infrared Imaging

By microscopic infrared imaging it was confirmed that cellulose microfibers and/or aramid microfibers were contained in all of the resin composite films. The measurement was carried out under the following conditions, using a cross-section sample of the resin composite film.

Apparatus: Nicolet™ iN™ 10 MX infrared imaging microscope (Thermo Scientific™)
Resolving power: 8 cm$^{-1}$
Number of scans: 1
Step size: x=2.5 μm, y=2.5 μm
Measurement range: 4000 to 600 cm$^{-1}$ (3) X-Ray Structural Analysis As a result of X-ray structural analysis of the composite film of Example 1, in an X-ray diffraction pattern with a 2θ range of 0° to 30°, the X-ray diffraction pattern was confirmed to have one peak at 10°≤2θ<19° and two peaks at 19°≤2θ≤30°. This identified the microfibers as either natural cellulose or regenerated cellulose.

(4) Measurement of Elastic Modulus by AFM of Film Cross-Section

The cross-section sample of the resin composite film was fixed onto a special sample fixing stage, and the elastic modulus of the cross-section was measured under the following AFM measurement conditions.

Apparatus: Dimension Icon by Bruker Co.
Measuring mode: Peak Force Tapping Mode
Probe: Diamond single crystal probe
Spring constant k=48 N/m, tip curvature radius R=12 nm
Resolution: 512×512 pixels
Measurement range: 15 μm×15 μm
Sampling frequency: 0.3 to 0.7 Hz
Maximum indentation load: 50 nN When the distribution of cellulose microfibers could not be confirmed with a resolution of 512×512 pixels and a measurement range of 15 μm×15 μm, measurement was performed with a measurement range of 3 μm×3 μm and with a measurement range of 1 μm×1 μm, at the same resolution as above.

(5) Cellulose Microfiber Sheet Filling Factor

The filling factor for the cellulose microfiber sheet was defined as the area ratio of the cellulose microfiber sheet occupying the entire resin composite film in an AFM elastic modulus image of the resin composite film cross-section. The elastic modulus differs for different materials, and modulus mapping was performed for each material in the resin composite film by setting the threshold value for the histogram of the elastic modulus. For example, for a resin composite film composed entirely of cellulose microfibers and an epoxy, a contrast image is obtained for the epoxy (soft phase) and cellulose microfibers (hard phase). The histogram was largely divided into two peaks, and the midpoint between the two peaks of the histogram was set as the threshold value for binarization (cellulose: black, epoxy: white).

When the thickness of the resin composite film was greater than the AFM measurement range of 15 μm, the measurement was performed after first separating the cross-section of the resin composite film into multiple visual fields. Next, after preparing modulus mapping in each visual field, the images were joined to obtain an image with the resin composite film cross-section fitted into a single image. From modulus mapping with all of the resin composite film cross-sections visible, the area due to the cellulose microfiber sheet and the area of the entire film were calculated using the image editing software "imageJ", and finally the filling factor of the cellulose microfiber sheet was determined by the following formula.

Cellulose microfiber sheet filling factor (%)=area of cellulose microfiber sheet/entire film area×100

The filling factor of the cellulose microfiber sheet in the film cross-section was calculated at 10 locations using the method described above, and the average value of 8 points, excluding the maximum and minimum values, was recorded as the filling factor of the cellulose microfiber sheet for the entire film.

(6) Average Fiber Diameter of Fibers Constituting Cellulose Microfiber Sheet

From modulus mapping with all of the resin composite film cross-sections visible, the area ($\Sigma S_f$) due to the cellulose microfiber sheet and the total length ($\Sigma L_f$) of the interfaces between the cellulose microfiber sheet and other materials (epoxy, etc.) were calculated using the image editing software "imageJ", after which the average fiber diameter of the fibers constituting the cellulose microfiber sheet was calculated by the following formula.

Average fiber diameter of fibers constituting cellulose microfiber sheet (nm)=$4\times\Sigma S_f/\Sigma L_f$ The average fiber diameter of the fibers constituting the cellulose microfiber sheet in the resin composite film cross-section was calculated at 10 locations using the method described above, and the average value of 8 points, excluding the maximum and minimum values, was recorded as the average fiber diameter of the fibers constituting the cellulose microfiber sheet for the entire film.

(7) Maximum Fiber Diameter of Fibers Constituting Cellulose Microfiber Sheet

Particle analysis was conducted with the image editing software "imageJ" for the modulus mapping at 10 locations with all of the resin composite film cross-sections visible, and the particle diameters were calculated assuming the fiber diameters of the fibers constituting the cellulose microfiber sheet to be perfect circles. The largest particle diameter obtained from the analysis was used as the maximum fiber diameter of the fibers constituting the cellulose microfiber sheet.

(8) Void Percentage of Cellulose Microfiber Layer in Resin Composite Film

From modulus mapping with all of the resin composite film cross-sections visible, the area ($\Sigma S$) due to the cellulose microfibers and the area ($\Sigma Sp$) due to the resin present between the fibers composing the cellulose microfiber layer (excluding the overcoat resin layer), determined in the same manner, were calculated using the image editing software "imageJ", after which the void percentage of the cellulose microfiber layer in the resin composite film was calculated by the following formula.

Void percentage of cellulose microfiber layer in resin composite film (%)=$\Sigma S/(\Sigma S+\Sigma Sp)\times 100$ (9) Filling Factor of Inorganic Filler in Resin Composite Film The filling factor of the inorganic filler in the resin composite film was defined as the area ratio of the resin composite film cross-section occupied by the atoms composing the inorganic filler. For example, Si was measured for silica particles, and Al was measured for aluminum hydroxide particles. The measuring method will now be explained, using silica particles as an example. After conductive treatment of a cross-section sample with C paste and Os coating, an S-4800 scanning electron microscope (product of Hitachi High-Tech Fielding Corp.) was used for imaging with a photograph magnification of 500×, an acceleration voltage of 1.0 kV and the detector set to secondary electrons, to obtain a cross-sectional SEM image. Next, an energy dispersive X-ray detector (X-Max SILICON DRIFT X-RAY DETECTOR by Horiba, Ltd.) was used in the same visual field, to obtain element mapping for C and Si. For the area ratio, first the sections of the SEM secondary electron image of the film cross-section corresponding to the outer perimeter of the film were cut out using the image editing software "imageJ", to show only the film cross-section. Binarization was then performed, showing the silica portions as black and the other portions as white. The threshold value for black/white binarization was selected so that the portions represented in black corresponded to the Si regions in EDX, and the black area was calculated as a count number. The area of the entire cross-section of the film was also calculated as a count number. The ratio of Si occupying the entire film cross-section was calculated from the ratio of the two, using the following formula.

Inorganic filler filling factor (%)=(area of inorganic filler/area of entire film)×100

The filling factor of the inorganic filler in the film cross-section was determined at 10 locations using the method described above, and the average value of 8 points, excluding the maximum and minimum values, was recorded as the average filling factor of the inorganic filler in the resin composite film.

Here, binarization refers to binarization based on the difference in the elements of the organic material (resin or fibers) and inorganic material (inorganic filler).

(10) Proportion of Inorganic Filler in Cellulose Microfiber Layer

For the proportion of the inorganic filler in the cellulose microfiber layer, the total area due to the inorganic filler in the resin composite film and the area due to the inorganic filler in the cellulose microfiber layer were calculated from modulus mapping of the resin composite film cross-section, using the image editing software "imageJ", and finally the proportion of the inorganic filler in the cellulose microfiber layer was determined by the following formula. The cellulose microfiber layer is defined as the region delineated by selecting at least 10 points in order from the edge of the cellulose microfiber sheet near the outer surface of the film and connecting them with a line.

Proportion of inorganic filler in cellulose microfiber layer (%)=(area of inorganic filler in cellulose microfibers/total area of inorganic filler in resin composite film)×100

The proportion of the inorganic filler in the cellulose microfiber layer in the resin composite film cross-section was calculated at 10 locations using the method described above, and the average value of 8 points, excluding the maximum and minimum values, was recorded as the proportion of the inorganic filler in the cellulose microfiber layer.

(11) Average Thickness of Overcoat Resin Layer

The length from the outer surface of the resin composite film to the surface of the nonwoven fabric layer is defined as the overcoat resin layer. The nonwoven fabric layer is defined as the layer comprising organic fibers, including the cellulose microfiber layer. By AFM modulus mapping it can be confirmed to be composed of 3 layers: epoxy layer (front)/nonwoven fabric layer/epoxy layer (back). The length from the outer surface of the film to the surface of the nonwoven fabric layer is measured at 10 points each on the front and back, and the average values are recorded as the overcoat resin layer thickness (front) and the overcoat resin layer thickness (back).

(12) Resin Composite Film Thickness

The thickness of the resin composite film was measured at 10 points and the average value was recorded as the film thickness. A surface contact-type meter (surface contact-type film thickness meter (Code No. 547-401) by Mitutoyo Co.) was used as the film thickness meter.

(13) Moisture Absorption Ratio

The resin composite film was cut to a 50 mm square and dried at 120° C. for 2 hours and then the initial weight (W0) was measured, after which the weight (W1) after moisture absorption treatment under conditions of humidity: 85%/temperature: 85° C./192 hours was measured. The moisture absorption ratio was determined by the following formula.

Moisture absorption ratio (%)=($W1-W0$)/$W0$×100

(14) Transmittance

The total light transmittance may be measured by an optical transparency test based on ASTM D1003, using an NDH7000SP CU2II (product name) haze meter (Nippon Denshoku Industries Co., Ltd.).

(15) Dielectric Characteristics (Relative Dielectric Constant and Dielectric Loss Tangent)

A thick resin composite film with a thickness of 0.8 mm was cut out to a size of 1.5 (width)×80 mm (length) for use as a measuring sample. The value at 1 GHz was measured by the cavity resonance method (Model 8722ES network analyzer, product of Agilent Technologies; cavity resonator, product of Kanto Electronics Application and Development Inc.).

(16) Fractal Dimension

The fractal dimension at the interface between the metal surface roughened layer of the comb tooth pattern of the inner layer circuit board and the insulating layer was measured for the insulating layer laminate. In order to obtain a cross-sectional structure photograph of the insulating layer laminated sheet, a Dual-Beam FIB apparatus (product of FEI Co., Dual Beam Nova200 Nanolab, acceleration voltage: 30 kV) was used for sample working to expose a cross-section of the metal/insulating layer interface. The cross-section was observed with an S-4800 scanning electron microscope (product of Hitachi High-Tech Fielding Corp.), and image data was obtained with a single pixel size of 5 to 20 µm. The interface portion (line segment) of the metal/insulating layer cross-sectional photograph was extracted by image processing. The fractal dimension (box count dimension) was calculated by the box count method, and the region size was set to 3 µm×3 µm to allow evaluation of the complexity of the structure in the fine regions.

(17) Surface Maximum Cross-Section Height (Rt) of Insulating Layer Laminate

The maximum cross-section height (Rt) of the exposed surface of the insulating layer of the insulating layer laminate was measured. The maximum cross-section height (Rt) of the insulating layer surface was determined using a non-contact surface roughness meter ("WYKO NT9300" by Veeco Instruments, Inc.), from the numerical value obtained with a 0.82 mm×1.1 mm measurement range in VSI contact mode from a 10× lens. The measurement was conducted by determining the average value for 3 locations straddling a portion with circuit wiring and a portion without circuit wiring, in a region in which circuit wiring having a comb tooth pattern with line/space ratio=600/660 µm (residual copper: 48%) had been formed. An Rt value of less than 2.5 µm was evaluated as "G", 2.5 µm or greater and less than 3 µm was evaluated as "F", and 3 µm or greater was evaluated as "P".

(18) Surface Roughness (Ra) of Roughened Laminate

The surface roughness (Ra) of the roughened laminate was measured using an "OLS3000" laser microscope by Olympus Corp., and recorded as the arithmetic mean roughness (Ra) under the following conditions.

Semiconductor laser: 408 nm wavelength

Measuring pitch: 0.1 µm

Measurement range: 0.012 mm² (plane)

(19) Peel Strength of Slit Wiring of Plating-Treated Laminate

One end of straight slit wiring on the plating-treated laminate (L/S=40 µm/40 length: 5 cm) was peeled off and gripped with an AGS-500 autograph by Shimadzu Corp., and measurement was made of the load (kgf/cm) at 35 mm peeling in the perpendicular direction at a speed of 50 mm/min, at room temperature.

(20) Boiling Heat Resistance of Plating-Treated Laminate

A plating-treated laminate with straight slit wiring (L/S=40 µm/40 µm, length: 5 cm) was subjected to boiling treatment for 2 hours, and then immersed for 30 seconds in a solder bath at 260° C. and evaluated. The evaluation was conducted by visually judging the outer appearance of the test substrate.

G: Good, P: Blistering, peeling or measling.

Slurry Production Examples

Slurry Production Example 1

Tencel cut filaments (3 mm lengths), as regenerated cellulose fibers acquired from Sojitz Corp., were placed in a washing net, a surfactant was added, and the mixture was washed with water several times in a washing machine to remove the oil agent on the fiber surfaces. The refined Tencel fibers were dispersed in water (400 L) to a solid content of 1.5 wt %, and a Model SDR14 Lab Refiner (pressurized disc type) by Aikawa Iron Works Co. was used as a disc refiner apparatus for beating treatment of 400 L of the aqueous dispersion for 20 minutes with a disc clearance of 1 mm. Beating treatment was then continued under conditions with the clearance reduced to a level of essentially zero. Sampling was periodically conducted, and the CSF value of the sampled slurry was evaluated according to the Canadian Standard Freeness test method (hereunder, "CSF method") for pulp as defined by JIS P 8121, by which it was confirmed that the CSF value decreased with time, reaching approximately zero and tending to increase with further beating treatment. Beating treatment was continued under the same conditions for 10 minutes after setting the clearance to nearly zero, and a beaten aqueous dispersion with a CSF value of 100 ml or greater was obtained. The obtained beaten aqueous dispersion was directly subjected to micronization treatment 5 times using a high-pressure homogenizer (NS015H by Niro Soavi) at an operating pressure of 100 MPa, to obtain a cellulose microfiber slurry (solid concentration: 1.5 wt %).

Slurry Production Example 2

Linter pulp was used as natural cellulose for the starting material. The linter pulp was immersed in water to 4 wt % and heat treated in an autoclave at 130° C. for 4 hours, and the obtained swollen pulp was washed with water several times to obtain water-impregnated swollen pulp. Next, disc refiner and high-pressure homogenizer treatment were carried out by the same method as Production Example 1, to obtain a cellulose microfiber slurry (solid concentration: 1.5 wt %). The CSF value was 100 ml or greater.

Slurry Production Example 3

A cellulose microfiber slurry (solid concentration: 1.5 wt %) was obtained by the same method as Slurry Production Example 2, except for changing the starting material to abaca pulp. The CSF value was 630 ml or greater.

Slurry Production Example 4

An aramid microfiber slurry (solid concentration: 1.5 wt %) was obtained by the same method as Slurry Production Example 1, except for changing the starting material to aramid fiber (1 mm length) by Teijin, Ltd.

Slurry Production Example 5

A cellulose microfiber slurry (solid concentration: 1.5 wt %) was obtained by the same method as Slurry Production Example 2, except that the micronization treatment at an operating pressure of 100 MPa was carried out 30 times.

Slurry Production Example 6

An aramid microfiber slurry (solid concentration: 1.5 wt %) was obtained by the same method as Slurry Production Example 4, except that the micronization treatment at an operating pressure of 100 MPa was carried out 30 times.

Slurry Production Example 7

A cellulose microfiber slurry (solid concentration: 1.5 wt %) was obtained by the same method as Slurry Production Example 1, except that treatment was interrupted when the CSF value reached zero.

Slurry Production Comparative Example 1

A slurry was produced with reference to Example 4 of Japanese Unexamined Patent Publication No. 2006-316253. A polysaccharide production medium containing 2.0% glucose (Polysaccharide-production-medium, Akihiko Shimada, Vivaorigino, 23, 1, 52-53, 1995) was subjected to high-pressure steam sterilization treatment, after which 1000 L thereof was placed in a 3000 L-capacity fermenter, strain CF-002 was inoculated to 104 CFU/ml, and agitation culture was carried out under aeration at 30° C. for 2 days, to obtain a dispersion containing a large amount of bacterial cellulose (BC). After then filtering with a screen mesh, rinsing with water and pressing, it was immersed in a 1% NaOH solution and sterilized, and then again neutralized, rinsed with water and pressed. The step of rinsing with water and pressing was repeated another 3 times to obtain a purified flocculent BC/aqueous dispersion (cellulose content: 11.6 wt %). It was then diluted with water to a cellulose concentration of 1.0 wt %, and then pre-dispersed for 10 minutes with a household mixer and subjected to dispersion treatment 4 times using a high-pressure homogenizer (NS3015H by Niro Soavi) at an operating pressure of 80 MPa.

Sheet Production Examples

Sheet Production Example 1

The slurry of Slurry Production Example 1 was diluted to a solid concentration of 0.2 wt % and stirred for 3 minutes with a household mixer to prepare 312.5 g of a paper-making slurry. A PET/nylon mixed spun plain woven fabric (NT20 by Shikishima Canvas Co., Ltd., water permeation: 0.03 ml/(cm²·s) at 25° C. in air, able to filter cellulose microfibers to 99% or greater by filtration at atmospheric pressure, 25° C.) was set in a batch paper machine (automatic square sheet machine by Kumagai Riki Kogyo Co., Ltd., 25 cm×25 cm, 80 mesh), and then the previously prepared paper-making slurry was loaded in an amount for a cellulose sheet with a basis weight of 10 g/m², and paper-making (dewatering) was carried out with pressure reduction of 4 KPa with respect to atmospheric pressure.

The wet web comprising the wet concentrated composition on the obtained filter cloth was detached from the wire and pressed for 1 minute at a pressure of 1 kg/cm², after which the wet web surface was contacted with the drum surface of a drum dryer set to a surface temperature of 130° C., in a wet web/filter cloth two-layer state, and dried for about 120 seconds in a manner so as to keep the wet web in contact with the drum surface. The filter cloth was detached from the cellulose sheet structure of the obtained dried two-layer sheet, to obtain a white cellulose microfiber sheet (25 cm×25 cm, 10 g/m²). Next, the cellulose microfiber sheet was subjected to smoothing treatment with a calender apparatus (hydraulic two-roll test embossing machine by Yuri Roll Machine Co., Ltd., upper roll: metal/lower roll: aramid, surface length: 300 mm, temperature: room temperature, pressure: 1.5 ton/300 mm), to obtain a thin-layer cellulose microfiber sheet S1.

Sheet Production Example 2

After mixing 50 parts by weight of the cellulose microfiber slurry of Slurry Production Example 2 and 50 parts by weight of the aramid microfiber slurry of Slurry Production Example 4, the mixture was diluted to a solid concentration of 0.2 wt %. It was then stirred for 3 minutes with a household mixer to prepare 312.5 g of a paper-making slurry. Next, paper-making, drying and smoothing steps were carried out by the same methods as Sheet Production Example 1, to obtain an opalescent cellulose microfiber sheet S2 containing aramid microfibers.

Sheet Production Example 3

After adding 1.2 wt % (3.9 g) and 0.012 wt % (0.039 g) of 1-hexanol and hydroxypropyl methyl cellulose (trade name: "60SH-4000", product of Shin-Etsu Chemical Co., Ltd.), respectively, to the slurry of Slurry Production Example 3 (312.5 g), the mixture was emulsified and dispersed for 4 minutes with a household mixer. Paper-making, drying and smoothing were subsequently carried out using the paper-making slurry by the same method as Example 1, to obtain a cellulose microfiber sheet S3.

Sheet Production Example 4

After mixing 70 parts by weight of the cellulose microfiber slurry of Slurry Production Example 2 and 30 parts by weight of the aramid microfiber slurry of Slurry Production Example 4, the mixture was diluted to a solid concentration of 0.2 wt %. It was then stirred for 3 minutes with a household mixer to prepare 312.5 g of a paper-making slurry. While stirring 312.5 g of paper-making slurry with a Three-one motor, 1.9 g of a cationic blocked polyisocyanate (trade name: "MEIKANATE WEB", product of Meisei Chemical Works, Ltd., diluted to a solid concentration of 1.0 wt %) was added dropwise, and the mixture was then stirred for 3 minutes to obtain a paper-making slurry (total: 314.4 g). The weight ratio of the added cationic blocked polyisocyanate was 3 wt % with respect to the solid weight of the cellulose microfibers and aramid microfibers. A sheet was formed using the same methods for paper-making, drying and smoothing as in Sheet Production Example 1. Next, the smoothed sheet was sandwiched between two SUS metal frames (25 cm×25 cm), anchored with a clip, and subjected to heat treatment in an oven at 160° C. for 2 minutes, to obtain an opalescent cellulose microfiber sheet S4 containing aramid microfibers crosslinked with a blocked polyisocyanate.

Sheet Production Example 5

Using the same method as Sheet Production Example 1, paper-making was carried out with a cupra long filament nonwoven fabric (trade name: BEMLIESE SN140 by Asahi Kasei Fibers Corp., basis weight: 14 g/m$^2$, film thickness: 70 μm, density: 0.2 g/cm$^3$, average monofilament size: 0.2 dtex) layered over a PET/nylon mixed spun plain weave fabric, to prepare a fiber sheet S5 having a cellulose microfiber sheet layered on a cupra long filament nonwoven fabric. No smoothing step was carried out.

Sheet Production Example 6

After mixing 50 parts by weight of the cellulose microfiber slurry of Slurry Production Example 5 and 50 parts by weight of the aramid microfiber slurry of Slurry Production Example 6, the mixture was diluted to a solid concentration of 0.2 wt %. It was then stirred for 3 minutes with a household mixer to prepare 312.5 g of a paper-making slurry. Next, paper-making, drying and smoothing steps were carried out by the same methods as Sheet Production Example 1, to obtain an opalescent cellulose microfiber sheet S6 containing aramid microfibers.

Sheet Production Example 7

While stirring 468.8 g of the cellulose microfiber slurry of Slurry Production Example 7 with a Three-one motor, 2.85 g of a cationic blocked polyisocyanate (trade name: "MEIKANATE WEB", product of Meisei Chemical Works, Ltd., diluted to a solid concentration of 1.0 wt %) was added dropwise, and the mixture was then stirred for 3 minutes to obtain a paper-making slurry (total: 471.65 g). The weight ratio of the added cationic blocked polyisocyanate was 3.0 wt % with respect to the solid weight of the cellulose microfibers. A sheet was formed using the same methods for paper-making, drying and smoothing as in Sheet Production Example 4. Next, the dry sheet was sandwiched between two SUS metal frames (25 cm×25 cm), anchored with a clip, and subjected to heat treatment in an oven at 160° C. for 2 minutes, to obtain a white cellulose microfiber sheet S7 containing cellulose microfibers crosslinked with a blocked polyisocyanate.

Sheet Production Comparative Example 1

A sheet was produced with reference to Example 4 of Japanese Unexamined Patent Publication No. 2006-316253. The slurry with a cellulose concentration of 1.0 wt % produced in Slurry Production Comparative Example 1 was diluted with water to a cellulose concentration of 0.40 wt % and again subjected to dispersion treatment for 5 minutes with a household mixer, and the obtained dispersion was used as a paper-making dispersion. The obtained wet web was further covered with the same filter cloth and dewatered with metal rollers, to adjust the cellulose concentration to 12 to 13 wt %. First, without detaching the PET fabric, the obtained wet web was immersed in acetone and subjected to exchange treatment for about 10 minutes while occasionally gently rinsing the entire web, after which it was immersed in a mixed solution of toluene/acetone=50/50 (g/g) and subjected to exchange treatment for about 10 minutes while occasionally gently rinsing the entire web. Immediately following this, the wet web sandwiched between filter cloths was placed on a metal sheet, a deadweight was set on it for drying to a fixed length, and it was set in a drying oven and dried at 100° C. for 50 minutes. After drying, the nonwoven fabric was detached from the filter cloth to obtain a white cellulose sheet RS1.

The starting materials, production methods and physical properties for Sheet Production Examples 1 to 7 and Sheet Production Comparative Example 1 are shown in Table 7 below.

Varnish Production Examples

Varnish Production Example 1

A varnish (V1) with a solid content of 70 wt % was prepared using methyl ethyl ketone as the solvent and the following compounds, mixed with a kneader.
Brominated bisphenol A-type epoxy resin 1121N-80M (Dainippon Ink & Chemicals, Inc.), 78.9 parts by weight
Phenol-novolac-type epoxy resin N680-75M (Dainippon Ink & Chemicals, Inc.), 14.0 parts by weight
Dicyandiamide (Dainippon Ink & Chemicals, Inc.), 2.0 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight
Spherical silica SO25R (Admatechs Co., Ltd., weight-average particle diameter: 0.5 μm), 32 parts by weight Varnish Production Example 2

Varnish V2 was produced by the same method as Varnish Production Example 1, except for adding 98 parts by weight of spherical silica SO25R (Admatechs Co., Ltd., weight-average particle diameter: 0.5 μm).

Varnish Production Example 3

A varnish (V3) with a solid content of 70 wt % was prepared using methyl ethyl ketone as the solvent and the following compounds, mixed with a kneader.
Cresol-novolac-type epoxy N-660 (Dainippon Ink & Chemicals, Inc.), 48.7 parts by weight
Triazine-containing phenol-novolac-type epoxy LA-7054 (Dainippon Ink & Chemicals, Inc.), 46.3 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight Varnish Production Example 4

A varnish (V4) with a solid content of 70 wt % was prepared using methyl ethyl ketone as the solvent and the following compounds, mixed with a kneader.
Biphenyl-type epoxy resin NC-3000H (Nippon Kayaku Co., Ltd.), 39.2 parts
Bisphenol A-type epoxy resin 1051 (Dainippon Ink & Chemicals, Inc.), 39.2 parts Aminotriazine-novolac resin LA-3018 (Dainippon Ink & Chemicals, Inc.), 16.5 parts
2-Ethyl-4-methylimidazole (Shikoku Chemicals Corp.), 0.1 part by weight
Phenoxy resin YL7553BH30 (Mitsubishi Chemical Corp.), 5.0 parts
Aluminum hydroxide H-43S (Showa Denko K.K., mean particle diameter: 0.7 μm), 61.0 parts by weight
Crosslinked fine particle rubber XER-91 (JSR), 2.5 parts by weight Varnish Production Example 5

A varnish (V5) with a solid content of 70 wt % was prepared using methyl ethyl ketone as the solvent and the following compounds, mixed with a kneader.
Alicyclic epoxy resin 2021P (DAICEL), 20.0 parts
Dicyclopentadiene-type epoxy resin HP-7200H, 30.0 parts
Active ester-type curing agent HPC8000-65T (Dainippon Ink & Chemicals, Inc.), 49.9 parts
4-Dimethylaminopyridine (Tokyo Kasei Kogyo Co., Ltd.), 0.1 part by weight
Phenoxy resin YL7553BH30 (Mitsubishi Chemical Corp.), 5.0 parts
Crosslinked fine particle rubber XER-91 (JSR), 2.5 parts by weight Varnish Production Example 6

A varnish (V6) with a solid content of 70 wt % was prepared using methyl ethyl ketone as the solvent and the following compounds, mixed with a kneader.
Brominated bisphenol A-type epoxy resin 1121N-80M (Dainippon Ink & Chemicals, Inc.), 83.1 parts by weight
Phenol-novolac-type epoxy resin N680-75M (Dainippon Ink & Chemicals, Inc.), 14.7 parts by weight
Dicyandiamide (Dainippon Ink & Chemicals, Inc.), 2.2 parts by weight
2-Ethyl-4-methylimidazole (Shikoku Chemicals Corp.), 0.1 part by weight
Silica 5025R (Admatechs Co., Ltd., weight-average particle diameter: 0.5 μm), 60.6 parts by weight Varnish Production Comparative Example 1

A varnish was produced with reference to Example 4 of Japanese Unexamined Patent Publication No. 2006-316253. The following compounds were heated to 120° C. and mixed with a kneader to prepare a varnish (RV1) with a solid content of 100 wt %.
Bisphenol A-type epoxy resin (Asahi Kasei Epoxy Co., Ltd., AER-250), 100 parts by weight
m-Xylylenediamine, 18 parts by weight The compositions and solid contents of Varnish Production Examples 1 to 6 and Varnish Production Comparative Example 1 are shown in Table 8 below. The numerical values for each of the components in Table 8 are parts by weight.

<Fabrication of Resin Composite Film>

Example 1

(Fabrication of Prepreg)
Varnish V1 was coated to 0.3 g onto the release surface of a 20 cm-square polyethylene terephthalate support film (thickness: 16 μm) using a film applicator, and then the cellulose microfiber sheet (Si) cut to 10 cm-square was placed on it, and the varnish V1 was recoated to 0.3 g on the cellulose microfiber sheet using an applicator. The obtained film was heated to 100° C. for 4 minutes to remove the solvent and obtain a semi-cured prepreg.

(Fabrication of Resin Composite Film)
After covering the prepreg with another polyethylene terephthalate support film (thickness: 16 μm) with the release surface contacting, it was cured with a vacuum heat press machine (heating temperature: 220° C., pressure: 6.0 MPa, time: 160 min). The support film was removed from the obtained cured film to obtain a resin composite film. The physical properties of the obtained resin composite film (F1) are shown in Table 9.

An AFM elastic modulus image of the obtained resin composite film is shown in FIG. 1(a), an elastic modulus histogram is shown in FIG. 1(b), and a binarized image is shown in FIG. 1(c). In FIG. 1(c), the shaded area corresponds to the cellulose portions.

Also, FIG. 2 shows a processed image where the cellulose microfiber layer is defined as the region obtained by calculating the area due to the inorganic filler and the area due to the silica filler in the cellulose microfiber layer from modulus mapping of the resin composite film cross-section in FIG. 1(a), using the image editing software "imageJ", selecting cellulose microfibers in at least 10 points nearest to the film outer surface, and connecting them with a line.

(Fabrication of Copper-Clad Laminate)
A prescribed number of sheets of the prepreg were stacked for a final cured thickness in the range of 0.7 mm to 0.9 mm, an electrolytic copper foil F2-WS (Furukawa Circuit Foil Co., Ltd., thickness: 18 μm, treated side Rz=2.3 μm) was situated above and below, and the stack was pressed for 60 minutes at a pressure of 2.5 MPa and a temperature of 240° C., to obtain a copper-clad laminate.

(Fabrication of Thick Resin Composite Film)
The copper-clad laminate was immersed in a copper etching solution to completely remove the copper foil, to fabricate a thick resin composite film for evaluation.

(Fabrication of Inner Layer Circuit Board)
On a glass cloth substrate/epoxy resin double-sided copper-clad laminate (copper foil thickness: 35 μm, substrate thickness: 0.8 mm, "R5715ES", product of Matsushita Electric Works, Ltd.) there was formed the pattern of an IPC MULTI-PURPOSE TEST BOARD NO. IPC C-25 (comb tooth pattern with line/space ratio=600/660 μm (residual copper: 48%)). Next, both sides of the substrate were roughened with a microetching agent ("CZ8100" by MEC Co., Ltd.) to fabricate an inner layer circuit board.

(Fabrication of Insulating Layer Laminate)
The prepreg was laminated onto both sides of the inner layer circuit board using a vacuum laminator by Meiki Co., Ltd. under conditions with a temperature of 120° C., a pressure of 7 kgf/cm² and an air pressure of mmHg, and then continuously hot pressed with a SUS end plate under conditions with a temperature of 120° C., a pressure of 5 kgf/cm² and atmospheric pressure. After then detaching the PET film, it was thermoset at 180° C. for 30 minutes to form an insulating layer on both sides of the substrate.

(Fabrication of Roughened Laminate)
For chemical roughening of the cured resin layer on the insulating layer-formed circuit board (the insulating layer laminate), an aqueous solution of diethyleneglycol monobutyl ether: 200 ml/L and of NaOH: 5 g/L was prepared as a swelling solution and heated to 80° C., and immersion treatment was carried out for 5 minutes. Next, an aqueous solution of $KMnO_4$: 60 g/L and of NaOH: 40 g/L was prepared as a roughening solution and heated to 80° C., and immersion treatment was carried out for 15 minutes. An aqueous neutralizing solution (SnCl$_2$: 30 g/L, HCl: 300 ml/L) was then prepared and heated to 40° C., and immersion treatment was carried out for 5 minutes for reduction of the KMnO$_4$.

(Fabrication of Plating-Treated Laminate)

In order to form a circuit on the roughened insulating layer surface by a semi-additive process, the inner layer circuit board was immersed in an electroless plating solution containing PdCl$_2$ at 40° C. for 5 minutes, and then immersed in an electroless copper plating solution at 25° C. for 20 minutes. After heating at 150° C. for 30 minutes for annealing treatment, an etching resist was formed, and after pattern formation by etching (straight slit wiring with L/S=40 μm/40 μm, 5 cm length), copper sulfate electrolytic plating and annealing treatment were carried out at 200° C. for 60 minutes, to form a 30 μm-thick conductive layer.

Example 2

Different resin composite films F2 (prepreg, resin composite film, copper-clad laminate, thick resin composite film, insulating layer laminate, roughened laminate, plating-treated laminate) were fabricated by the same method as Example 1, except that the cellulose microfiber sheet was S2.

Example 3

Different resin composite films F3 (prepreg, resin composite film, copper-clad laminate, thick resin composite film, insulating layer laminate, roughened laminate, plating-treated laminate) were fabricated by the same method as Example 1, except that the coating amount of the varnish (V2) was 0.9 g.

Example 4

Different resin composite films F4 (prepreg, resin composite film, copper-clad laminate, thick resin composite film, insulating layer laminate, roughened laminate, plating-treated laminate) were fabricated by the same method as Example 1, except that the cellulose microfiber sheet was S3, the varnish was V3, and the coating amount of the varnish was 0.1 g. The total light transmittance of the resin composite film was measured to be 82%.

Example 5

Different resin composite films F5 (prepreg, resin composite film, copper-clad laminate, thick resin composite film, insulating layer laminate, roughened laminate, plating-treated laminate) were fabricated by the same method as Example 1, except that the cellulose microfiber sheet was S4, the varnish was V4, and the coating amount of the varnish was 0.1 g.

Example 6

A varnish (V5) was coated to 0.8 g onto the release surface of a 20 cm-square polyethylene terephthalate support film (thickness: 16 μm) using a film applicator, and then the cellulose microfiber layered sheet (S5) cut to 10 cm-square was placed on it with the cellulose microfiber side in contact, and the varnish (V5) was recoated to 8.0 g on the cellulose microfiber sheet using an applicator. Different resin composite films F6 (prepreg, resin composite film, copper-clad laminate, thick resin composite film, insulating layer laminate, roughened laminate, plating-treated laminate) were fabricated, otherwise by the same method as Example 1.

Example 7

Different resin composite films F7 (prepreg, resin composite film, copper-clad laminate, thick resin composite film, insulating layer laminate, roughened laminate, plating-treated laminate) were fabricated by the same method as Example 2, except that the cellulose microfiber sheet was S6 and the varnish was V6.

Example 8

Different resin composite films F8 (prepreg, resin composite film, copper-clad laminate, thick resin composite film, insulating layer laminate, roughened laminate, plating-treated laminate) were fabricated by the same method as Example 1, except that the cellulose microfiber sheet was S7 and the varnish was V1.

Comparative Example 1

A resin composite film was produced with reference to Example 4 of Japanese Unexamined Patent Publication No. 2006-316253. One sheet of the varnish RV-1 obtained in Varnish Production Comparative Example 1 impregnated in the cellulose nonwoven fabric RS-1 obtained in Sheet Production Comparative Example 1 (impregnation time: minutes) was thermoset in a hot press machine at a temperature of 100° C. and a pressure of 9.81 MPa (curing time: 1 hour), to fabricate resin composite film RF-1. Also, copper-clad laminate and thick resin composite film fabrication, insulating layer formation, roughening treatment and plating treatment were carried out by the same methods as Example 1.

The physical properties and evaluation results for the resin composite films obtained in Examples 1 to 8 and Comparative Example 1 are shown in Table 9 below.

TABLE 7

|  |  |  | Sheet Prod. Example 1 S1 | Sheet Prod. Example 2 S2 | Sheet Prod. Example 3 S3 | Sheet Prod. Example 4 S4 | Sheet Prod. Example 5 S5 | Sheet Prod. Example 6 S6 | Sheet Prod. Example 7 S7 | Sheet Prod. Comp. Example 1 RS1 |
| --- | --- | --- | --- | --- | --- | --- | --- | --- | --- | --- |
| Starting materials | Slurry Prod. Example 1 | pts by wt | 100 |  |  |  | 100 |  |  |  |
|  | Slurry Prod. Example 2 | pts by wt |  | 50 |  | 70 |  |  |  |  |
|  | Slurry Prod. Example 3 | pts by wt |  |  | 100 |  |  |  |  |  |
|  | Slurry Prod. Example 4 | pts by wt |  | 50 |  | 30 |  |  |  |  |
|  | Slurry Prod. Example 5 | pts by wt |  |  |  |  |  | 50 |  |  |
|  | Slurry Prod. Example 6 | pts by wt |  |  |  |  |  |  | 50 |  |

TABLE 7-continued

|  |  |  | Sheet Prod. Example 1 S1 | Sheet Prod. Example 2 S2 | Sheet Prod. Example 3 S3 | Sheet Prod. Example 4 S4 | Sheet Prod. Example 5 S5 | Sheet Prod. Example 6 S6 | Sheet Prod. Example 7 S7 | Sheet Prod. Comp. Example 1 RS1 |
|---|---|---|---|---|---|---|---|---|---|---|
|  | Slurry Prod. Example 7 | pts by wt |  |  |  |  |  |  | 100 |  |
|  | Slurry Prod. Comparative Example 1 | pts by wt |  |  |  |  |  |  |  | 100 |
| Production method | Single-layer |  | G | G | G | G |  | G | G | G |
|  | Nonwoven fabric layering |  |  |  |  |  | G |  |  |  |
|  | Calendering treatment |  | G | G | G | G |  | G |  |  |
|  | Cellulose microfiber basis weight (charging) | g/m² | 10 | 10 | 5 | 10 | 18 | 10 | 10 | 38 |
| Physical properties | Fiber sheet basis weight (measured) | g/m² | 10 | 10 | 5 | 10 | 32 | 10 | 10 | 38 |
|  | Fiber sheet thickness | μm | 17 | 17 | 5 | 17 | 135 | 10 | 55 | 100 |
|  | Air permeability resistance | sec/100 ml | 10 | 900 | 100 | 2000 | 6 | 1200 | 6 | 300 |
|  | Void percentage | % | 61 | 50 | 43 | 61 | 86 | 45 | 81 | 75 |
|  | Number average fiber diameter of cellulose microfiber layer | nm | 397 | 120 | 35 | 130 | 380 | 108 | 1502 | 65 |
|  | Maximum fiber diameter of cellulose microfiber layer | μm | 11 | 13 | 6 | 1.2 | 10 | 0.9 | 13 | 0.26 |

TABLE 8

|  |  |  | Varnish Prod. Example 1 V1 | Varnish Prod. Example 2 V2 | Varnish Prod. Example 3 V3 | Varnish Prod. Example 4 V4 | Varnish Prod. Example 5 V5 | Varnish Prod. Example 6 V6 | Varnish Prod. Comp. Example 1 RV1 |
|---|---|---|---|---|---|---|---|---|---|
| Epoxy resin | Brominated bisphenol A-type | 1121N-80 M | 78.9 | 78.9 |  |  |  | 83.1 |  |
|  | Cresol-type | N-660 |  |  | 48.7 |  |  |  |  |
|  | Biphenyl-type | NC-3000H |  |  |  | 39.2 |  |  |  |
|  | Alicyclic | 2021P |  |  |  |  | 20.0 |  |  |
|  | Dicyclopentadiene-type | HP-7200H |  |  |  |  | 30.0 |  |  |
|  | Bisphenol A-type | 1051 |  |  |  | 39.2 |  |  |  |
|  | Bisphenol A-type | AER-250 |  |  |  |  |  |  | 85 |
| Curing agent | Phenol-novolac-type | N680-75 M | 14.0 | 14.0 |  |  |  | 14.7 |  |
|  | Triazine-containing phenol-novolac-type | LA-7052 |  |  | 46.3 |  |  |  |  |
|  | Aminotriazine-novolac-type | LA-3018 |  |  |  | 16.5 |  |  |  |
|  | Active ester-type | HPC8000-65T |  |  |  |  | 49.9 |  |  |
|  | m-Xylylenediamine |  |  |  |  |  |  |  | 15 |
|  | Dicyandiamide |  | 2.0 | 2.0 |  |  |  | 2.0 |  |
| Curing accelerator | 2-Ethyl-4-methylimidazole |  | 0.1 | 0.1 | 0.1 | 0.1 |  | 0.1 |  |
|  | 4-Dimethylaminopyridine |  |  |  |  |  | 0.1 |  |  |
| Additive | Phenoxy resin | YL7553BH30 | 5.0 | 5.0 | 5.0 | 5.0 |  |  |  |
|  | Rubber | XER-91 |  |  |  |  | 2.5 |  |  |
|  | Aluminum hydroxide | H-43S |  |  |  | 61.0 |  |  |  |
|  | Silica | SO25R | 32.0 | 98.0 |  |  |  | 60.6 |  |
|  | Solid content ratio (%) |  | 70 | 70 | 70 | 70 | 70 | 70 | 100 |

TABLE 9

|  |  |  | Example 1 | Example 2 | Example 3 | Example 4 | Example 5 |
|---|---|---|---|---|---|---|---|
|  |  |  | F1 | F2 | F3 | F4 | F5 |
|  | Cellulose microfiber sheet | Sheet used | S1 | S2 | S1 | S3 | S4 |
|  |  | Num. | 1 | 1 | 1 | 1 | 1 |
|  | Varnish | Varnish used | V1 | V1 | V2 | V3 | V4 |
| Prepreg Resin composite film | Prepreg thickness | μm | 23.3 | 24.2 | 70.7 | 7.2 | 35.6 |
|  | Filling factor of fiber sheet calculated from AFM modulus mapping | % | 30 | 15 | 10 | 50 | 14 |
|  | Average fiber diameter of cellulose microfiber layer calculated from AFM modulus mapping | nm | 408 | 125 | 392 | 34 | 122 |
|  | Maximum fiber diameter of cellulose microfiber layer calculated from AFM modulus mapping | μm | 12 | 12 | 10 | 5 | 1.3 |
|  | Void percentage of cellulose microfiber layer calculated from AFM modulus mapping | % | 59 | 48 | 60 | 42 | 59 |

TABLE 9-continued

|  |  |  |  |  |  |  |
|---|---|---|---|---|---|---|
|  | Resin composite film thickness | μm | 22.2 | 22.2 | 66.7 | 6.7 | 33.3 |
|  | Overcoat resin layer thickness (front) | μm | 2.8 | 2.9 | 26.3 | 0.9 | 8.0 |
|  | Overcoat resin layer thickness (back) | μm | 2.4 | 2.3 | 23.3 | 0.7 | 8.4 |
|  | Inorganic filler filling factor | vol % | 10.5 | 10.5 | 31.5 | 0 | 20.0 |
|  | Proportion of inorganic filler included in cellulose microfiber layer | % | 2 | 2 | 2 | — | 2 |
|  | Moisture absorption ratio | % | 0.9 | 0.9 | 0.7 | 1.1 | 0.8 |
| Thick film resin film | Relative dielectric constant (1 GHz) | — | 3.8 | 3.8 | 3.6 | 3.9 | 3.7 |
|  | Dielectric loss tangent (1 GHz) | — | 0.01 | 0.01 | 0.008 | 0.011 | 0.009 |
| Insulating layer laminate | Interface fractal dimension | — | 1.220 | 1.180 | 1.340 | 1.120 | 1.280 |
|  | Surface maximum cross-section height (Rt) | — | G | G | G | F | G |
| Roughened laminate | Surface roughness (Ra) | μm | 0.38 | 0.40 | 0.62 | 0.25 | 0.52 |
| Plating-treated laminate | Slit wiring peel strength | kgf/cm | 0.79 | 0.70 | 0.91 | 0.63 | 0.83 |
|  | Boiling heat resistance | — | G | G | G | G | G |

|  |  |  | Example 6 | Example 7 | Example 8 | Comp. Example 1 |
|---|---|---|---|---|---|---|
|  | Cellulose microfiber sheet | Sheet used | F6 | F7 | F8 | RS1 |
|  |  | Num. | S5 | S6 | S7 | RF1 |
|  |  |  | 1 | 1 | 1 | 1 |
|  | Varnish | Varnish used | V5 | V6 | V1 | RV1 |
| Prepreg | Prepreg thickness | μm | 157.5 | 24.9 | 102.0 | 115 |
| Resin composite film | Filling factor of fiber sheet calculated from AFM modulus mapping | % | 8 | 29 | 9 | 25 |
|  | Average fiber diameter of cellulose microfiber layer calculated from AFM modulus mapping | nm | 370 | 101 | 1589 | 65 |
|  | Maximum fiber diameter of cellulose microfiber layer calculated from AFM modulus mapping | μm | 9 | 0.8 | 13 | 0.26 |
|  | Void percentage of cellulose microfiber layer calculated from AFM modulus mapping | % | 84 | 44 | 60 | 73 |
|  | Resin composite film thickness | μm | 150 | 23.0 | 99.1 | 100 |
|  | Overcoat resin layer thickness (front) | μm | 7 | 6.1 | 21.6 | 0 |
|  | Overcoat resin layer thickness (back) | μm | 7.3 | 6.9 | 23.9 | 0 |
|  | Inorganic filler filling factor | vol % | 0 | 17.8 | 0 | 0 |
|  | Proportion of inorganic filler included in cellulose microfiber layer | % | — | 2 | — | — |
|  | Moisture absorption ratio | % | 0.6 | 0.9 | 0.9 | 3.1 |
| Thick film resin film | Relative dielectric constant (1 GHz) | — | 3.6 | 3.8 | 3.8 | 4.6 |
|  | Dielectric loss tangent (1 GHz) | — | 0.008 | 0.010 | 0.010 | 0.014 |
| Insulating layer laminate | Interface fractal dimension | — | 1.250 | 1.310 | 1.225 | 1.05 |
|  | Surface maximum cross-section height (Rt) | — | G | G | G | P |
| Roughened laminate | Surface roughness (Ra) | μm | 0.47 | 0.74 | 0.41 | — |
| Plating-treated laminate | Slit wiring peel strength | kgf/cm | 0.81 | 0.85 | 0.75 | 0.37 |
|  | Boiling heat resistance | — | G | G | F | P |

Embodiment IV

<<Measuring and Evaluation Methods>>
<Methods for Physical Property Measurement and Evaluation of Cellulose Microfiber Sheet and Prepreg>
(1) Number-Average Fiber Diameter of Cellulose Microfibers The surfaces of cellulose microfibers in the fiber sheet were observed with a scanning electron microscope (SEM) at 10 random locations, at a magnification corresponding to 1,000× to 100,000×, according to the fiber diameters of the microfibers. A line was drawn on the obtained SEM image in the direction perpendicular to the horizontal direction of the image plane, the diameters of fibers intersecting the line were measured from the magnified image, and the number of intersecting fibers and the diameters of the fibers were counted. The number-average fiber diameter was thus calculated using the measurement results for a horizontal/vertical system in each image. The number-average fiber diameter was calculated in the same manner for two more extracted SEM images, and the results for a total of 10 images were averaged.
(2) Maximum Fiber Diameter of Fibers Constituting Cellulose Microfiber Sheet The surface of the cellulose microfiber sheet was observed with a scanning electron microscope (SEM) at 10 random locations, at a magnification of 500×. The fiber diameter of the thickest fiber within the 10 SEM images was recorded as the maximum fiber diameter for the fiber sheet. A multilayer structure obtained by layering onto another nonwoven fabric or the like was observed by SEM from the fiber sheet side.
(3) Sheet Basis Weight A sample humidified in an atmosphere at 20° C. room temperature and 50% RH was cut into a 10.0 cm×10.0 cm square piece and weighed, and calculation was performed by the following formula.

Sheet basis weight $(g/m^2)$=10 cm-square sample weight $(g)/0.01\ m^2$ (4) Sheet Thickness The thickness of a sample humidified in an atmosphere at 20° C. room temperature, 50% RH was measured at 10 points using a surface contact-type meter (surface contact-type film thickness meter (Code No. 547-401) by Mitutoyo Corp.), and the average value was recorded as the thickness of the sample.
(5) Void Percentage Calculation was performed by the following formula, assuming the density of the cellulose microfibers to be 1.5 $g/cm^3$.

Void percentage (%)=100−([basis weight $(g/m^2)$/{sheet thickness $(\mu m) \times 1.5\ (g/cm^3)$}]×100)

(6) Air Permeability Resistance

The air permeability resistance of a sample humidified in an atmosphere at 23° C. room temperature, 50% RH was measured at 10 points using an Oken-type air permeability resistance tester (Model EG01 by Asahi Seiko Co., Ltd.), and the average value was recorded as the air permeability resistance of the sample.

(7) Prepreg Thickness

The thickness was measured at 10 points in the prepreg, and the average value was recorded as the film thickness of the prepreg. A surface contact-type meter (surface contact-type film thickness meter (Code No. 547-401) by Mitutoyo Co.) was used as the film thickness meter.

(8) Number-Average Fiber Diameter and Maximum Fiber Diameter of Cellulose Microfibers in Prepreg The prepreg was impregnated with methyl ethyl ketone to dissolve the resin component, and the cellulose microfibers were dispersed. The dispersion was then subjected to vacuum filtration (pressure reduction: −0.09 MPa (absolute degree of vacuum: 10 kPa)). The filter used was a KG-90 by Advantech, Inc., with a 1.0 μm-diameter PTFE membrane filter (effective filtration area: 48 cm$^2$) also by Advantech, Inc. on the glass filter. The cellulose fibers accumulated on the PTFE membrane filter were dried in an oven at 120° C. to obtain a film made of cellulose fibers. The number-average fiber diameter and maximum fiber diameter of the film were calculated using the following SEM observation method.

First, 10 random locations on the surface of a structure composed of cellulose microfibers were observed with a scanning electron microscope (SEM) at a magnification corresponding to 1,000× to 100,000×, according to the fiber diameters of the microfibers. A line was drawn on the obtained SEM image in the direction perpendicular to the horizontal direction of the image plane, the diameters of fibers intersecting the line were measured from the magnified image, and the number of intersecting fibers and the diameters of the fibers were counted. The number-average fiber diameter was thus calculated using the measurement results for a horizontal/vertical system in each image. The number-average fiber diameter was calculated in the same manner for two more extracted SEM images, and the results for a total of 10 images were averaged to obtain the average fiber diameter for the sample being measured.

Ten locations on the surface of the structure were observed by SEM at a magnification of 500×. The thickest fiber diameter within the 10 SEM images was recorded as the maximum fiber diameter.

A multilayer structure obtained by layering onto a nonwoven fabric or the like was observed by SEM from the cellulose microfiber sheet side.

<Methods for Physical Property Measurement and Evaluation of Resin Composite Film>

(1) Fabrication of Cross-Section Sample for Measurement

First, platinum was vacuum vapor deposited onto both sides of a resin composite film (coating thickness: 10 nm). Next, the sample film was embedded in an epoxy resin (two-pack epoxy adhesive), and a cross-section was exposed with an ultramicrotome. A diamond knife was used for cutting, and cutting was carried out at ordinary temperature. For films containing silica, since the silica cannot be cut with a microtome, a Dual-Beam FIB device (Dual Beam Nova200 Nanolab by FEI Co., acceleration voltage: 30 kV) was used for sample working to expose a cross-section of the film. The obtained cross-section sample consisted of 5 layers: adhesive-platinum-film-platinum-adhesive, and the location of the film in the sample was distinguished by platinum vapor deposition.

(2) Microscopic Infrared Imaging

By microscopic infrared imaging it was confirmed that cellulose microfibers and/or aramid microfibers were contained in all of the resin composite films. The measurement was carried out under the following conditions, using a cross-section sample of the resin composite film.

Apparatus: Nicolet™ iN™ 10 MX infrared imaging microscope (Thermo Scientific™)
Resolving power: 8 cm$^{-1}$
Number of scans: 1
Step size: x=2.5 μm, y=2.5 μm
Measurement range: 4000 to 600 cm$^{-1}$ (3) X-Ray Structural Analysis As a result of X-ray structural analysis of the composite film of Example 1, in an X-ray diffraction pattern with a 2θ range of 0° to 30°, the X-ray diffraction pattern was confirmed to have one peak at 10°≤2θ<19° and two peaks at 19°≤2θ≤30°. This identified the microfibers as either natural cellulose or regenerated cellulose.

(4) Measurement of Elastic Modulus by AFM of Film Cross-Section

The cross-section sample of the resin composite film was fixed onto a special sample fixing stage, and the elastic modulus of the cross-section was measured under the following AFM measurement conditions.

Apparatus: Dimension Icon by Bruker Co.
Measuring mode: Peak Force Tapping Mode
Probe: Diamond single crystal probe
Spring constant k=48 N/m, tip curvature radius R=12 nm
Resolution: 512×512 pixels
Measurement range: 15 μm×15 μm
Sampling frequency: 0.3 to 0.7 Hz
Maximum indentation load: 50 nN When the distribution of cellulose microfibers could not be confirmed with a resolution of 512×512 pixels and a measurement range of 15 μm×15 μm, measurement was performed with a measurement range of 3 μm×3 μm and with a measurement range of 1 μm×1 μm, at the same resolution as above.

(5) Cellulose Microfiber Sheet Filling Factor

The filling factor for the cellulose microfiber sheet was defined as the area ratio of the cellulose microfiber sheet occupying the entire resin composite film in an AFM elastic modulus image of the resin composite film cross-section. The elastic modulus differs for different materials, and modulus mapping was performed for each material in the resin composite film by setting the threshold value for the histogram of the elastic modulus. For example, for a resin composite film composed entirely of cellulose microfibers and an epoxy, a contrast image is obtained for the epoxy (soft phase) and cellulose microfibers (hard phase). The histogram was largely divided into two peaks, and the midpoint between the two peaks of the histogram was set as the threshold value for binarization (cellulose: black, epoxy: white).

When the thickness of the resin composite film was greater than the AFM measurement range of 15 μm, the measurement was performed after first separating the cross-section of the resin composite film into multiple visual fields. Next, after preparing modulus mapping in each visual field, the images were joined to obtain an image with the resin composite film cross-section fitted into a single image. From modulus mapping with all of the resin composite film cross-sections visible, the area due to the cellulose microfiber sheet and the area of the entire film were calculated using the image editing software "imageJ", and finally the filling factor of the cellulose microfiber sheet was determined by the following formula.

Cellulose microfiber sheet filling factor (%)=area of cellulose microfiber sheet/entire film area×100

The filling factor of the cellulose microfiber sheet in the film cross-section was calculated at 10 locations using the method described above, and the average value of 8 points, excluding the maximum and minimum values, was recorded as the filling factor of the cellulose microfiber sheet for the entire film.

(6) Average Fiber Diameter of Fibers Constituting Cellulose Microfiber Sheet

From modulus mapping with all of the resin composite film cross-sections visible, the area ($\Sigma S_f$) due to the cellulose microfiber sheet and the total length ($\Sigma L_f$) of the interfaces between the cellulose microfiber sheet and other materials (epoxy, etc.) were calculated using the image editing software "imageJ", after which the average fiber diameter of the fibers constituting the cellulose microfiber sheet was calculated by the following formula.

Average fiber diameter of fibers constituting cellulose microfiber sheet (nm)=4×$\Sigma S_f/\Sigma L_f$ The average fiber diameter of the fibers constituting the cellulose microfiber sheet in the resin composite film cross-section was calculated at 10 locations using the method described above, and the average value of 8 points, excluding the maximum and minimum values, was recorded as the average fiber diameter of the fibers constituting the cellulose microfiber sheet for the entire film.

(7) Maximum Fiber Diameter of Fibers Constituting Cellulose Microfiber Sheet

Particle analysis was conducted with the image editing software "imageJ" for the modulus mapping at 10 locations with all of the resin composite film cross-sections visible, and the particle diameters were calculated assuming the fiber diameters of the fibers constituting the cellulose microfiber sheet to be perfect circles. The largest particle diameter obtained from the analysis was used as the maximum fiber diameter of the fibers constituting the cellulose microfiber sheet.

(8) Void Percentage of Cellulose Microfiber Layer in Resin Composite Film

From modulus mapping with all of the resin composite film cross-sections visible, the area ($\Sigma S$) due to the cellulose microfibers and the area ($\Sigma Sp$) due to the resin present between the fibers composing the cellulose microfiber layer (excluding the overcoat resin layer), determined in the same manner, were calculated using the image editing software "imageJ", after which the void percentage of the cellulose microfiber layer in the resin composite film was calculated by the following formula.

Void percentage of cellulose microfiber layer in resin composite film (%)=$\Sigma S/(\Sigma S+\Sigma Sp)$×100

(9) Filling Factor of Inorganic Filler in Resin Composite Film

The filling factor of the inorganic filler in the resin composite film was defined as the area ratio of the resin composite film cross-section occupied by the atoms composing the inorganic filler. For example, Si was measured for silica particles, and Al was measured for aluminum hydroxide particles. The measuring method will now be explained, using silica particles as an example. After conductive treatment of a cross-section sample with C paste and Os coating, an S-4800 scanning electron microscope (product of Hitachi High-Tech Fielding Corp.) was used for imaging with a photograph magnification of 500×, an acceleration voltage of 1.0 kV and the detector set to secondary electrons, to obtain a cross-sectional SEM image. Next, an energy dispersive X-ray detector (X-Max SILICON DRIFT X-RAY DETECTOR by Horiba, Ltd.) was used in the same visual field, to obtain element mapping for C and Si. For the area ratio, first the sections of the SEM secondary electron image of the film cross-section corresponding to the outer perimeter of the film were cut out using the image editing software "imageJ", to show only the film cross-section. Binarization was then performed, showing the silica portions as black and the other portions as white. The threshold value for black/white binarization was selected so that the portions represented in black corresponded to the Si regions in EDX, and the black area was calculated as a count number. The area of the entire cross-section of the film was also calculated as a count number. The ratio of Si occupying the entire film cross-section was calculated from the ratio of the two, using the following formula.

Inorganic filler filling factor (%)=(area of inorganic filler/area of entire film)×100

The filling factor of the inorganic filler in the film cross-section was determined at 10 locations using the method described above, and the average value of 8 points, excluding the maximum and minimum values, was recorded as the average filling factor of the inorganic filler in the resin composite film.

Here, binarization refers to binarization based on the difference in the elements of the organic material (resin or fibers) and inorganic material (inorganic filler).

(10) Proportion of Inorganic Filler in Cellulose Microfiber Layer

For the proportion of the inorganic filler in the cellulose microfiber layer, the total area due to the inorganic filler in the resin composite film and the area due to the inorganic filler in the cellulose microfiber layer were calculated from modulus mapping of the resin composite film cross-section, using the image editing software "imageJ", and finally the proportion of the inorganic filler in the cellulose microfiber layer was determined by the following formula. The cellulose microfiber layer is defined as the region delineated by selecting at least 10 points in order from the edge of the cellulose microfiber sheet near the outer surface of the film and connecting them with a line.

Proportion of inorganic filler in cellulose microfiber layer (%)=(area of inorganic filler in cellulose microfibers/total area of inorganic filler in resin composite film)×100

The proportion of the inorganic filler in the cellulose microfiber layer in the resin composite film cross-section was calculated at 10 locations using the method described above, and the average value of 8 points, excluding the maximum and minimum values, was recorded as the proportion of the inorganic filler in the cellulose microfiber layer.

(11) Overcoat Resin Layer Thickness

The length from the outer surface of the resin composite film to the surface of the nonwoven fabric layer is defined as the overcoat resin layer. The nonwoven fabric layer is defined as the layer comprising organic fibers, including the cellulose microfiber layer. By AFM modulus mapping it can be confirmed to be composed of 3 layers: epoxy layer (front)/nonwoven fabric layer/epoxy layer (back). The length from the outer surface of the film to the surface of the nonwoven fabric layer is measured at 10 points each on the front and back, and the average values are recorded as the overcoat resin layer thickness (front) and the overcoat resin layer thickness (back).

(12) Coefficient of Linear Thermal Expansion (CTE)

The resin composite film was cut to 3 mm width×25 mm length as a measuring sample. It was measured using a model SII TMA6100 in tension mode with a chuck distance of 10 mm and load of 5 g, under a nitrogen atmosphere, raising the temperature from room temperature to 200° C. at 5° C./min, lowering the temperature from 200° C. to 25° C. at 5° C./min, and then again raising the temperature from 25° C. to 200° C. at 5° C./min. The coefficient of linear thermal expansion (CTE150 and CTE200) was determined at 150° C. and 200° C. during the 2nd temperature increase. CTE150 and CTE200 are the linear expansion coefficients at 1° C. ranges of 149° C. to 150° C. and 199° C. to 200° C., respectively, and they are expressed by the following formulas.

$$CTE150=(L150-L149)/L100\times(10^6)$$

$$CTE200=(L200-L199)/L200\times(10^6)$$

Incidentally, L149, L150, L199 and L200 are the chuck distance lengths at 149° C., 150° C., 199° C. and 200° C., respectively.

(13) CTE Difference

The absolute value of the CTE difference between 150° C. and 200° C. is expressed by the following formula.

Absolute value of CTE difference=|CTE200−CTE150|

(14) Resin Composite Film Thickness

The thickness of the resin composite film was measured at 10 points and the average value was recorded as the film thickness. A surface contact-type meter (surface contact-type film thickness meter (Code No. 547-401) by Mitutoyo Co.) was used as the film thickness meter.

(15) Moisture Absorption Ratio

The resin composite film was cut to a 50 mm square and dried at 120° C. for 2 hours and then the initial weight (W0) was measured, after which the weight (W1) after moisture absorption treatment under conditions of humidity: 85%/temperature: 85° C./192 hours was measured. The moisture absorption ratio was determined by the following formula.

Moisture absorption ratio (%)=(W1−W0)/W0×100

(16) Transmittance

The total light transmittance may be measured by an optical transparency test based on ASTM D1003, using an NDH7000SP CU2II (product name) haze meter (Nippon Denshoku Industries Co., Ltd.).

(17) Dielectric Characteristics (Relative Dielectric Constant and Dielectric Loss Tangent)

A thick resin composite film with a thickness of 0.8 mm was cut out to a size of 1.5 (width)×80 mm (length) for use as a measuring sample. The value at 1 GHz was measured by the cavity resonance method (Model 8722ES network analyzer, product of Agilent Technologies; cavity resonator, product of Kanto Electronics Application and Development Inc.).

(18) Insulating Reliability

A wiring pattern arranged with through-holes at 0.2 mm spacings was formed on a copper foil on both sides of a copper-clad laminate, a 10 V voltage was applied between adjacent through-holes in an atmosphere at a temperature of 120° C. and a humidity of 85% RH, and the change in resistance value was measured. A resistance of less than 1 MΩ within 500 hours after starting the test was considered to be poor insulation, and the proportion of samples without poor insulation was evaluated (with a sample number of 10).

(19) Warping

A 0.8 mm-thickness thick resin composite film was cut to a size of 40 mm×40 mm. The sample was heated from room temperature to 260° C. and then cooled to 50° C., and the degree of warping during that time was measured according to the following formula.

Warping (%)=Deflection $h$ (mm)/length $L$ (mm)×100

Figure 3:
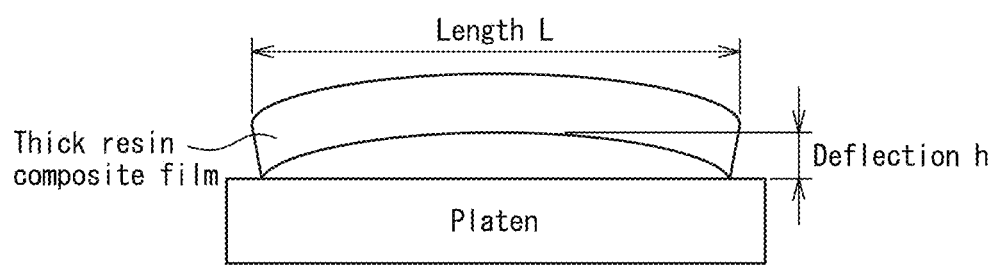
FIG. 3 is a conceptual drawing for illustration of the deflection (h) and length (L) of a thick resin composite film.

FIG. 3 is a conceptual drawing of the deflection (h) and length (L) of a thick resin composite film. A warping rate of <1% was indicated as "G", <2% was indicated as "F", and was indicated as "P".

Slurry Production Examples

Slurry Production Example 1

Tencel cut filaments (3 mm lengths), as regenerated cellulose fibers acquired from Sojitz Corp., were placed in a washing net, a surfactant was added, and the mixture was washed with water several times in a washing machine to remove the oil agent on the fiber surfaces. The refined Tencel fibers (cut filaments) were dispersed in water (400 L) to a solid content of 1.5 wt %, and a Model SDR14 Lab Refiner (pressurized disc type) by Aikawa Iron Works Co. was used as a disc refiner apparatus for beating treatment of 400 L of the aqueous dispersion for 20 minutes with a disc clearance of 1 mm. Beating treatment was then continued under conditions with the clearance reduced to a level of essentially zero. Sampling was periodically conducted, and the CSF value of the sampled slurry was evaluated according to the Canadian Standard Freeness test method (hereunder, "CSF method") for pulp as defined by JIS P 8121, by which it was confirmed that the CSF value decreased with time, reaching approximately zero and tending to increase with further beating treatment. Beating treatment was continued under the same conditions for 10 minutes after setting the clearance to nearly zero, and a beaten aqueous dispersion with a CSF value of 100 ml or greater was obtained. The obtained beaten aqueous dispersion was directly subjected to micronization treatment 5 times using a high-pressure homogenizer (NS015H by Niro Soavi) at an operating pressure of 100 MPa, to obtain a cellulose microfiber slurry (solid concentration: 1.5 wt %).

Slurry Production Example 2

Linter pulp was used as natural cellulose for the starting material. The linter pulp was immersed in water to 4 wt % and heat treated in an autoclave at 130° C. for 4 hours. The obtained swollen pulp was washed with water several times to obtain water-impregnated swollen pulp. Next, disc refiner and high-pressure homogenizer treatment were carried out by the same method as Slurry Production Example 1, to obtain a cellulose microfiber slurry (solid concentration: 1.5 wt %). The CSF value was 100 ml or greater.

Slurry Production Example 3

A cellulose microfiber slurry (solid concentration: 1.5 wt %) was obtained by the same method as Slurry Production Example 2, except for changing the starting material to abaca pulp. The CSF value was 630 ml or greater.

Slurry Production Example 4

An aramid microfiber slurry (solid concentration: 1.5 wt %) was obtained by the same method as Slurry Production Example 1, except for changing the starting material to aramid fiber (1 mm length) by Teijin, Ltd.

Slurry Production Example 5

A cellulose microfiber slurry (solid concentration: 1.5 wt %) was obtained by the same method as Slurry Production Example 2, except that the micronization treatment at an operating pressure of 100 MPa was carried out 30 times.

Slurry Production Example 6

An aramid microfiber slurry (solid concentration: 1.5 wt %) was obtained by the same method as Slurry Production Example 4, except that the micronization treatment at an operating pressure of 100 MPa was carried out 30 times.

Slurry Production Example 7

A cellulose microfiber slurry (solid concentration: 1.5 wt %) was obtained by the same method as Slurry Production Example 1, except that treatment was interrupted when the CSF value reached zero.

Slurry Production Comparative Example 1

A slurry was produced with reference to Example 4 of Japanese Unexamined Patent Publication No. 2006-316253. A polysaccharide production medium containing 2.0% glucose (Polysaccharide-production-medium, Akihiko Shimada, Vivaorigino, 23, 1, 52-53, 1995) was subjected to high-pressure steam sterilization treatment, after which 1000 L thereof was placed in a 3000 L-capacity fermenter, strain CF-002 was inoculated to 104 CFU/ml, and agitation culture was carried out under aeration at 30° C. for 2 days, to obtain a dispersion containing a large amount of bacterial cellulose (BC). After then filtering with a screen mesh, rinsing with water and pressing, it was immersed in a 1% NaOH solution and sterilized, and then again neutralized, rinsed with water and pressed. The step of rinsing with water and pressing was repeated another 3 times to obtain a purified flocculent BC/aqueous dispersion (cellulose content: 11.6 wt %). It was then diluted with water to a cellulose concentration of 1.0 wt %, and then pre-dispersed for 10 minutes with a household mixer and subjected to dispersion treatment 4 times using a high-pressure homogenizer (NS3015H by Niro Soavi) at an operating pressure of 80 MPa.

Sheet Production Examples

Sheet Production Example 1

The slurry of Slurry Production Example 1 was diluted to a solid concentration of 0.2 wt % and stirred for 3 minutes with a household mixer to prepare 312.5 g of a paper-making slurry. A PET/nylon mixed spun plain woven fabric {NT20 by Shikishima Canvas Co., Ltd., water permeation: 0.03 ml/(cm$^2$·s) at 25° C. in air, able to filter cellulose microfibers to 99% or greater by filtration at atmospheric pressure, 25° C.} was set in a batch paper machine (automatic square sheet machine by Kumagai Riki Kogyo Co., Ltd., 25 cm×25 cm, 80 mesh), and then the previously prepared paper-making slurry was loaded in an amount for a cellulose sheet with a basis weight of 10 g/m$^2$, and paper-making (dewatering) was carried out with pressure reduction of 4 KPa with respect to atmospheric pressure.

The wet web comprising the wet concentrated composition set on the obtained filter cloth was detached from the wire and pressed for 1 minute at a pressure of 1 kg/cm$^2$. The wet web surface was contacted with the drum surface of a drum dryer set to a surface temperature of 130° C., in a wet web/filter cloth two-layer state and dried for about 120 seconds in a manner so as to keep the wet web in contact with the drum surface. The filter cloth was detached from the cellulose sheet structure of the obtained dried two-layer sheet, to obtain a white cellulose microfiber sheet (25 cm×25 cm, 10 g/m$^2$). Next, the cellulose microfiber sheet was subjected to smoothing treatment with a calender apparatus (hydraulic two-roll test embossing machine by Yuri Roll Machine Co., Ltd., upper roll: metal/lower roll: aramid, surface length: 300 mm, temperature: room temperature, pressure: 1.5 ton/300 mm), to obtain a thin-layer cellulose microfiber sheet S1.

Sheet Production Example 2

After mixing 50 parts by weight of the cellulose microfiber slurry of Slurry Production Example 2 and 50 parts by weight of the aramid microfiber slurry of Slurry Production Example 4, the mixture was diluted to a solid concentration of 0.2 wt %. It was then stirred for 3 minutes with a household mixer to prepare 312.5 g of a paper-making slurry. Next, paper-making, drying and smoothing steps were carried out by the same methods as Sheet Production Example 1, to obtain an opalescent cellulose microfiber sheet S2 containing aramid microfibers.

Sheet Production Example 3

After adding 1.2 wt % (3.9 g) and 0.012 wt % (0.039 g) of 1-hexanol and hydroxypropyl methyl cellulose (trade name: "60SH-4000", product of Shin-Etsu Chemical Co., Ltd.), respectively, to the slurry of Slurry Production Example 3 (312.5 g), the mixture was emulsified and dispersed for 4 minutes with a household mixer. Paper-making, drying and smoothing were subsequently carried out by the same method as Example 1, to obtain a cellulose microfiber sheet S3.

Sheet Production Example 4

After mixing 70 parts by weight of the cellulose microfiber slurry of Slurry Production Example 2 and 30 parts by weight of the aramid microfiber slurry of Slurry Production Example 4, the mixture was diluted to a solid concentration of 0.2 wt %. It was then stirred for 3 minutes with a household mixer to prepare 312.5 g of a paper-making slurry. While stirring 312.5 g of paper-making slurry with a Three-one motor, 1.9 g of a cationic blocked polyisocyanate (trade name: "MEIKANATE WEB", product of Meisei Chemical Works, Ltd., diluted to a solid concentration of 1.0 wt %) was added dropwise, and the mixture was then stirred for 3 minutes to obtain a paper-making slurry (total: 314.4 g). The weight ratio of the added cationic blocked polyisocyanate was 3 wt % with respect to the solid weight of the cellulose microfibers and aramid microfibers. A sheet was formed using the same methods for paper-making and drying as in Sheet Production Example 1. Next, after the smoothing step, the sheet was sandwiched between two SUS metal frames (25 cm×25 cm), anchored with a clip, and subjected to heat treatment in an oven at 160° C. for 2 minutes, to obtain an opalescent cellulose microfiber sheet S4 containing aramid microfibers crosslinked with a blocked polyisocyanate.

Sheet Production Example 5

Using the same method as Sheet Production Example 1, paper-making was carried out with a cupra long filament nonwoven fabric (trade name: BEMLIESE SN140 by Asahi Kasei Fibers Corp., basis weight: 14 g/m$^2$, film thickness: 70 μm, density: 0.2 g/cm$^3$, average monofilament size: 0.2 dtex) layered over a PET/nylon mixed spun plain weave fabric, to prepare a fiber sheet S5 having a cellulose microfiber sheet layered on a cupra long filament nonwoven fabric. No smoothing step was carried out.

Sheet Production Example 6

After mixing 50 parts by weight of the cellulose microfiber slurry of Slurry Production Example 5 and 50 parts by weight of the aramid microfiber slurry of Slurry Production Example 6, the mixture was diluted to a solid concentration of 0.2 wt %. It was then stirred for 3 minutes with a household mixer to prepare 312.5 g of a paper-making slurry. Next, paper-making, drying and smoothing steps were carried out by the same methods as Sheet Production Example 1, to obtain an opalescent cellulose microfiber sheet S6 containing aramid microfibers.

Sheet Production Example 7

While stirring 468.8 g of the cellulose microfiber slurry of Slurry Production Example 7 with a Three-one motor, 2.85 g of a cationic blocked polyisocyanate (trade name: "MEI-KANATE WEB", product of Meisei Chemical Works, Ltd., diluted to a solid concentration of 1.0 wt %) was added dropwise, and the mixture was then stirred for 3 minutes to obtain a paper-making slurry (total: 471.65 g). The weight ratio of the added cationic blocked polyisocyanate was 3.0 wt % with respect to the solid weight of the cellulose microfibers. A sheet was formed using the same methods for paper-making, drying and smoothing as in Sheet Production Example 4. Next, the dry sheet was sandwiched between two SUS metal frames (25 cm×25 cm), anchored with a clip, and subjected to heat treatment in an oven at 160° C. for 2 minutes, to obtain a white cellulose microfiber sheet S7 containing cellulose microfibers crosslinked with a blocked polyisocyanate.

Sheet Production Comparative Example 1

A sheet was produced with reference to Example 4 of Japanese Unexamined Patent Publication No. 2006-316253. The slurry with a cellulose concentration of 1.0 wt % produced in Slurry Production Comparative Example 1 was diluted with water to a cellulose concentration of 0.40 wt % and again subjected to dispersion treatment for 5 minutes with a household mixer, and the obtained dispersion was used as a paper-making dispersion. The obtained wet web was further covered with the same filter cloth and dewatered with metal rollers, to adjust the cellulose concentration to 12 to 13 wt %. First, without detaching the PET fabric, the obtained wet web was immersed in acetone and subjected to exchange treatment for about 10 minutes while occasionally gently rinsing the entire web, after which it was immersed in a mixed solution of toluene/acetone=50/50 (g/g) and subjected to exchange treatment for about 10 minutes while occasionally gently rinsing the entire web. Immediately following this, the wet web sandwiched between filter cloths was placed on a metal sheet, a deadweight was set on it for drying to a fixed length, and it was set in a drying oven and dried at 100° C. for 50 minutes. After drying, the nonwoven fabric was detached from the filter cloth to obtain a white cellulose sheet RS1.

The starting materials, production methods and physical properties for Sheet Production Examples 1 to 7 and Sheet Production Comparative Example 1 are shown in Table 10 below.

Varnish Production Examples

Varnish Production Example 1

A varnish (V1) with a solid content of 70 wt % was prepared using methyl ethyl ketone as the solvent and the following compounds, mixed with a kneader.
Brominated bisphenol A-type epoxy resin 1121N-80M (Dainippon Ink & Chemicals, Inc.), 78.9 parts by weight
Phenol-novolac-type epoxy resin N680-75M (Dainippon Ink & Chemicals, Inc.), 14.0 parts by weight
Dicyandiamide (Dainippon Ink & Chemicals, Inc.), 2.0 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight
Spherical silica SO25R (Admatechs Co., Ltd., weight-average particle diameter: 0.5 μm), 32 parts by weight Varnish Production Example 2

Varnish V2 was produced by the same method as Varnish Production Example 1, except for adding 98 parts by weight of spherical silica SO25R (Admatechs Co., Ltd., weight-average particle diameter: 0.5 μm).

Varnish Production Example 3

A varnish (V3) with a solid content of 70 wt % was prepared using methyl ethyl ketone as the solvent and the following compounds, mixed with a kneader.
Cresol-novolac-type epoxy N-660 (Dainippon Ink & Chemicals, Inc.), 48.7 parts by weight
Triazine-containing phenol-novolac-type epoxy LA-7054 (Dainippon Ink & Chemicals, Inc.), 46.3 parts by weight
2-Ethyl-4-methylimidazole (Shikoku Chemicals Corp.), 0.1 part by weight
Phenoxy resin YL7553BH30 (Mitsubishi Chemical Corp.), 5.0 parts by weight Varnish Production Example 4

A varnish (V4) with a solid content of 70 wt % was prepared using methyl ethyl ketone as the solvent and the following compounds, mixed with a kneader.
Biphenylaralkyl-type epoxy resin NC-3000 (Dainippon Ink & Chemicals, Inc.), 31.5 parts
Cresol-novolac-type epoxy resin N-690 (Dainippon Ink & Chemicals, Inc.), 31.5 parts Biphenylaralkyl-type phenol MEH-7851H (Meiwa Plastic Industries, Ltd.), 30.0 parts Dicyandiamide (Dainippon Ink & Chemicals, Inc.), 1.9 parts 2-Ethyl-4-methylimidazole (Shikoku Chemicals Corp.), 0.1 part by weight Phenoxy resin YL7553BH30 (Mitsubishi Chemical Corp.), 5.0 parts Aluminum hydroxide H-43S (Showa Denko K.K., mean particle diameter: 0.7 µm), 61.0 parts by weight Crosslinked fine particle rubber XER-91 (JSR), 2.5 parts by weight Varnish Production Example 5

A varnish (V5) with a solid content of 70 wt % was prepared using methyl ethyl ketone as the solvent and the following compounds, mixed with a kneader.

Bisphenol A-type epoxy resin 828EL (Mitsubishi Chemical Corp.), 22.3 parts

Naphthalene-type tetrafunctional epoxy resin HP-4710 (Dainippon Ink & Chemicals, Inc.), 27.9 parts Triazine-containing phenol-novolac resin LA-7054 (Dainippon Ink & Chemicals, Inc.), 16.6 parts Naphthol-based curing agent SN-485 (TOHTO Chemical Industry Co., Ltd.), 16.6 parts Naphthol-based curing agent EXB-9500 (Dainippon Ink & Chemicals, Inc.), 16.6 parts 2-Ethyl-4-methylimidazole (Shikoku Chemicals Corp.), 0.1 part by weight Varnish Production Example 6

A varnish (V6) with a solid content of 70 wt % was prepared using methyl ethyl ketone as the solvent and the following compounds, mixed with a kneader.

Brominated bisphenol A-type epoxy resin 1121N-80M (Dainippon Ink & Chemicals, Inc.), 83.1 parts by weight Phenol-novolac-type epoxy resin N680-75M (Dainippon Ink & Chemicals, Inc.), 14.7 parts by weight Dicyandiamide (Dainippon Ink & Chemicals, Inc.), 2.2 parts by weight 2-Ethyl-4-methylimidazole (Shikoku Chemicals Corp.), 0.1 part by weight Silica SO25R (Admatechs Co., Ltd., weight-average particle diameter: 0.5 µm), 60.6 parts by weight Varnish Production Comparative Example 1

A varnish was produced with reference to Example 4 of Japanese Unexamined Patent Publication No. 2006-316253. The following compounds were heated to 120° C. and mixed with a kneader to prepare a varnish (RV1) with a solid content of 100 wt %.

Bisphenol A-type epoxy resin (Asahi Kasei Epoxy Co., Ltd., AER-250), 100 parts by weight m-Xylylenediamine, 18 parts by weight The compositions and solid contents of Varnish Production Examples 1 to 6 and Varnish Production Comparative Example 1 are shown in Table 11 below. The numerical values for each of the components in Table 11 are parts by weight.

<Fabrication of Resin Composite Films>

Example 1

(Fabrication of Prepreg)

Varnish V1 was coated to 0.3 g onto the release surface of a 20 cm-square polyethylene terephthalate support film (thickness: 16 µm) using a film applicator, and then the cellulose microfiber sheet (Si) cut to 10 cm-square was placed on it, and the varnish V1 was recoated to 0.3 g on the cellulose microfiber sheet using an applicator. The obtained film was heated to 100° C. for 4 minutes to remove the solvent and obtain a semi-cured prepreg.

(Fabrication of Resin Composite Film)

After covering the prepreg with another polyethylene terephthalate support film (thickness: 16 µm) with the release surface in contact, it was cured with a vacuum heat press machine (heating temperature: 220° C., pressure: 6.0 MPa, time: 160 min). The support film was removed from the obtained cured film to obtain a resin composite film. The physical properties of the obtained resin composite film (F1) are shown in Table 12.

An AFM elastic modulus image of the obtained resin composite film is shown in FIG. 1(a), an elastic modulus histogram is shown in FIG. 1(b), and a binarized image is shown in FIG. 1(c). In FIG. 1(c), the shaded area corresponds to the fibers constituting the cellulose microfiber sheet.

Also, FIG. 2 shows a processed image where the cellulose microfiber layer is defined as the region obtained by calculating the area due to the inorganic filler and the area due to the silica filler in the cellulose microfiber layer from modulus mapping of the resin composite film cross-section in FIG. 1(a), using the image editing software "image)", selecting at least 10 points at the edge of the cellulose microfiber sheet near the film outer surface, and connecting them with a line.

(Fabrication of Copper-Clad Laminate)

A prescribed number of sheets of the prepreg were stacked for a final cured thickness in the range of 0.7 mm to 0.9 mm, an electrolytic copper foil F2-WS (Furukawa Circuit Foil Co., Ltd., thickness: 18 µm, treated side Rz=2.3 µm) was situated above and below, and the stack was pressed for 60 minutes at a pressure of 2.5 MPa and a temperature of 240° C., to obtain a copper-clad laminate.

(Fabrication of Thick Resin Composite Film)

The copper-clad laminate was immersed in a copper etching solution to remove the copper foil, to fabricate a thick resin composite film for evaluation.

Example 2

Different resin composite films F2 (prepreg, resin composite film, copper-clad laminate, thick resin composite film) were fabricated by the same method as Example 1, except that the cellulose microfiber sheet was S2.

Example 3

Different resin composite films F3 (prepreg, resin composite film, copper-clad laminate, thick resin composite film) were fabricated by the same method as Example 1, except that the varnish was V2, and the coating amount was 0.9 g.

Example 4

Different resin composite films F4 (prepreg, resin composite film) were fabricated by the same method as Example 1, except that the cellulose microfiber sheet was S3, the varnish was V3, and the coating amount of the varnish was 0.1 g. The total light transmittance of the resin composite film was measured to be 82%.

Example 5

Different resin composite films F5 (prepreg, resin composite film, copper-clad laminate, thick resin composite film) were fabricated by the same method as Example 1, except that the cellulose microfiber sheet was S4, the varnish was V4, and the coating amount of the varnish was 0.1 g.

Example 6

A varnish (V5) was coated to 0.8 g onto the release surface of a 20 cm-square polyethylene terephthalate support film (thickness: 16 μm) using a film applicator, and then the cellulose microfiber layered sheet (S5) cut to 10 cm-square was placed on it with the cellulose microfiber side in contact, and the varnish (V5) was recoated to 8.0 g on the cellulose microfiber sheet using an applicator. Different resin composite films F6 (prepreg, resin composite film, copper-clad laminate, thick resin composite film) were otherwise fabricated by the same method as Example 1.

Example 7

Different resin composite films F7 (prepreg, resin composite film, copper-clad laminate, thick resin composite film) were fabricated by the same method as Example 2, except that the cellulose microfiber sheet was S6 and the varnish was V6.

Example 8

Different resin composite films F8 (prepreg, resin composite film, copper-clad laminate, thick resin composite film) were fabricated by the same method as Example 1, except that the cellulose microfiber sheet was S7 and the varnish was V1.

Comparative Example 1

A resin composite film was produced with reference to Example 4 of Japanese Unexamined Patent Publication No. 2006-316253. One sheet of the varnish RV1 obtained in Varnish Production Comparative Example 1 impregnated in the cellulose nonwoven fabric RS1 obtained in Sheet Production Comparative Example 1 (impregnation time: minutes) was thermoset in a hot press machine at a temperature of 100° C. and a pressure of 9.81 MPa (curing time: 1 hour), to fabricate resin composite film RF1. Also, copper-clad laminate and thick resin composite film fabrication were carried out by the same methods as Example 1.

The physical properties and evaluation results for the resin composite films obtained in Examples 1 to 8 and Comparative Example 1 are shown in Table 12 below.

TABLE 10

| | | | Sheet Prod. Example 1 S1 | Sheet Prod. Example 2 S2 | Sheet Prod. Example 3 S3 | Sheet Prod. Example 4 S4 | Sheet Prod. Example 5 S5 | Sheet Prod. Example 6 S6 | Sheet Prod. Example 7 S7 | Sheet Prod. Comp. Example 1 RS1 |
|---|---|---|---|---|---|---|---|---|---|---|
| Starting materials | Slurry Prod. Example 1 | pts by wt | 100 | | | | 100 | | | |
| | Slurry Prod. Example 2 | pts by wt | | 50 | | 70 | | | | |
| | Slurry Prod. Example 3 | pts by wt | | | 100 | | | | | |
| | Slurry Prod. Example 4 | pts by wt | | 50 | | 30 | | | | |
| | Slurry Prod. Example 5 | pts by wt | | | | | | 50 | | |
| | Slurry Prod. Example 6 | pts by wt | | | | | | 50 | | |
| | Slurry Prod. Example 7 | pts by wt | | | | | | | 100 | |
| | Slurry Prod. Comparative Example 1 | pts by wt | | | | | | | | 100 |
| Production method | Single-layer | | G | G | G | G | | G | G | G |
| | Nonwoven fabric layering | | | | | | G | | | |
| | Calendering treatment | | G | G | G | G | | G | | |
| | Cellulose microfiber basis weight (charging) | g/m$^2$ | 10 | 10 | 5 | 10 | 18 | 10 | 10 | 38 |
| Physical properties | Fiber sheet basis weight (measured) | g/m$^2$ | 10 | 10 | 5 | 10 | 32 | 10 | 10 | 38 |
| | Fiber sheet thickness | μm | 17 | 17 | 5 | 17 | 135 | 10 | 55 | 100 |
| | Air permeability resistance | sec/100 ml | 10 | 900 | 100 | 2000 | 6 | 1200 | 6 | 300 |
| | Void percentage | % | 61 | 50 | 43 | 61 | 86 | 45 | 81 | 75 |
| | Number average fiber diameter of micro cellulose fiber layer | nm | 397 | 120 | 35 | 130 | 380 | 108 | 1502 | 65 |
| | Maximum fiber diameter of micro cellulose fiber layer | μm | 11 | 13 | 6 | 1.2 | 10 | 0.9 | 13 | 0.26 |

TABLE 11

|  |  |  | Varnish Prod. Example 1 V1 | Varnish Prod. Example 2 V2 | Varnish Prod. Example 3 V3 | Varnish Prod. Example 4 V4 | Varnish Prod. Example 5 V5 | Varnish Prod. Example 6 V6 | Varnish Prod. Comp. Example 1 RV1 |
|---|---|---|---|---|---|---|---|---|---|
| Epoxy resin | Brominated bisphenol A-type | 1121N-80 M | 78.9 | 78.9 |  |  |  | 83.1 |  |
|  | Cresol-type | N-660 |  |  | 48.7 |  |  |  |  |
|  | Cresol-type | N-690 |  |  |  | 31.5 |  |  |  |
|  | Biphenylaralkyl-type | NC-3000 |  |  |  | 31.5 |  |  |  |
|  | Naphthalene-type | HP-4710 |  |  |  |  | 27.9 |  |  |
|  | Bisphenol A-type | 828EL |  |  |  |  | 22.3 |  |  |
|  | Bisphenol A-type | AER-250 |  |  |  |  |  |  | 85 |
| Curing agent | Phenol-novolac-type | N680-75 M | 14.0 | 14.0 |  |  |  | 14.7 |  |
|  | Triazine-containing phenol-novolac-type | LA-7052 |  |  | 46.3 |  |  |  |  |
|  | Phenylaralkyl-type phenol | MEH-7851H |  |  |  | 30.0 |  |  |  |
|  | Triazine-containing phenol-novolac-type | LA-7054 |  |  |  |  | 16.6 |  |  |
|  | Naphthol-type | SN-485 |  |  |  |  | 16.6 |  |  |
|  | Naphthol-type | EXB-9500 |  |  |  |  | 16.6 |  |  |
|  | m-Xylylenediamine |  |  |  |  |  |  |  | 15.0 |
|  | Dicyandiamide |  | 2.0 | 2.0 |  | 1.9 |  | 2.2 |  |
| Curing accelerator | 2-Ethyl-4-methylimidazole |  | 0.1 | 0.1 | 0.1 | 0.1 | 0.1 | 0.1 |  |
| Additive | Phenoxy resin | YL7553BH30 | 5.0 | 5.0 | 5.0 | 5.0 |  |  |  |
|  | Rubber | XER-91 |  |  |  |  | 2.5 |  |  |
|  | Aluminum hydroxide | H-43S |  |  |  | 61.0 |  |  |  |
|  | Silica | SO25R | 32.0 | 98.0 |  |  |  | 60.6 |  |
|  | Solid content ratio (%) |  | 70 | 70 | 70 | 70 | 70 | 70 | 100 |

TABLE 12

|  |  |  | Example 1 | Example 2 | Example 3 | Example 4 | Example 5 |
|---|---|---|---|---|---|---|---|
|  |  |  | F1 | F2 | F3 | F4 | F5 |
|  | Cellulose microfiber sheet | Sheet used | S1 | S2 | S1 | S3 | S4 |
|  |  | Num. | 1 | 1 | 1 | 1 | 1 |
|  | Varnish | Varnish used | V1 | V1 | V2 | V3 | V4 |
| Prepreg | Prepreg thickness | μm | 23.3 | 24.2 | 70.7 | 7.2 | 35.6 |
| Resin composite film | Filling factor of fiber sheet calculated from AFM modulus mapping | % | 30 | 30 | 10 | 50 | 20 |
|  | Average fiber diameter of cellulose microfiber layer calculated from AFM modulus mapping | nm | 408 | 125 | 392 | 34 | 122 |
|  | Maximum fiber diameter of cellulose microfiber layer calculated from AFM modulus mapping | μm | 12 | 12 | 10 | 5 | 1.3 |
|  | Void percentage of cellulose microfiber layer calculated from AFM modulus mapping | % | 59 | 48 | 60 | 42 | 59 |
|  | CTE150 | ppm/° C. | 30 | 20 | 40 | 25 | 30 |
|  | CTE200 | ppm/° C. | 40 | 15 | 70 | 20 | 45 |
|  | |CTE200 − CTE150| | ppm/° C. | 10 | 5 | 30 | 5 | 15 |
|  | Resin composite film thickness | μm | 22.2 | 22.2 | 66.7 | 6.7 | 33.3 |
|  | Overcoat resin layer thickness (front) | μm | 2.8 | 2.9 | 26.3 | 0.9 | 8.0 |
|  | Overcoat resin layer thickness (back) | μm | 2.4 | 2.3 | 23.3 | 0.7 | 8.4 |
|  | Inorganic filler filling factor | % | 10.5 | 10.5 | 31.5 | 0 | 20 |
|  | Proportion of inorganic filler included in cellulose microfiber layer | % | 2 | 2 | 2 | — | 2 |
|  | Moisture absorption ratio | % | 0.9 | 0.9 | 0.7 | 1.1 | 0.8 |
| Copper-clad laminate | Insulating reliability | % | 100 | 100 | 100 | 100 | 100 |
| Thick film resin composite film | Relative dielectric constant (1 GHz) | — | 3.8 | 3.8 | 3.6 | 3.9 | 3.7 |
|  | Dielectric loss tangent (1 GHz) | — | 0.010 | 0.010 | 0.008 | 0.011 | 0.009 |
|  | Warping | — | G | G | G | G | G |

|  |  |  | Example 6 | Example 7 | Example 8 | Comp. Example 1 |
|---|---|---|---|---|---|---|
|  |  |  | F6 | F7 | F8 | RF1 |
|  | Cellulose microfiber sheet | Sheet used | S5 | S6 | S7 | RS1 |
|  |  | Num. | 1 | 1 | 1 | 1 |
|  | Varnish | Varnish used | V5 | V6 | V1 | RV1 |
| Prepreg | Prepreg thickness | μm | 158 | 24.9 | 102.0 | 115 |
| Resin composite film | Filling factor of fiber sheet calculated from AFM modulus mapping | % | 8 | 29 | 9 | 25 |
|  | Average fiber diameter of cellulose microfiber layer calculated from AFM modulus mapping | nm | 370 | 101 | 1589 | 65 |

TABLE 12-continued

|  |  |  | | | | |
|---|---|---|---|---|---|---|
| | Maximum fiber diameter of cellulose microfiber layer calculated from AFM modulus mapping | μm | 9 | 0.8 | 13 | 0.26 |
| | Void percentage of cellulose microfiber layer calculated from AFM modulus mapping | % | 85 | 44 | 60 | 73 |
| | CTE150 | ppm/° C. | 45 | 18 | 42 | 50 |
| | CTE200 | ppm/° C. | 80 | 36 | 76 | 110 |
| | \|CTE200 − CTE150\| | ppm/° C. | 35 | 18 | 34 | 60 |
| | Resin composite film thickness | μm | 150 | 23.0 | 99.1 | 100 |
| | Overcoat resin layer thickness (front) | μm | 6.9 | 6.1 | 21.6 | 0 |
| | Overcoat resin layer thickness (back) | μm | 7.3 | 6.9 | 23.9 | 0 |
| | Inorganic filler filling factor | % | 0 | 17.8 | 0 | 0 |
| | Proportion of inorganic filler included in cellulose microfiber layer | % | — | 2 | — | — |
| | Moisture absorption ratio | % | 0.6 | 0.9 | 0.9 | 3.1 |
| Copper-clad laminate | Insulating reliability | % | 100 | 100 | 100 | 20 |
| Thick film resin composite film | Relative dielectric constant (1 GHz) | — | 3.6 | 3.8 | 3.8 | 4.6 |
| | Dielectric loss tangent (1 GHz) | — | 0.008 | 0.010 | 0.010 | 0.014 |
| | Warping | — | F | G | F | P |

The invention claimed is:

1. A resin composite film comprising a cellulose microfiber sheet and a resin, wherein the resin composite film satisfies the following conditions:
   (1) in modulus mapping obtained by AFM measurement of a cross-section in the thickness direction, the fibers constituting the cellulose microfiber sheet have an average fiber diameter of 0.01 μm to 2.0 μm and a maximum fiber diameter of 15 μm or smaller, as calculated from image analysis;
   (2) the average thickness of an overcoat resin layer on at least one side of the resin composite film, as observed by modulus mapping, is 0.3 μm to 100 μm;
   (3) the average thickness of the overcoat resin layer on at least one side of the resin composite film, as calculated by the modulus mapping, is 0.3 μm to 30 μm;
   (4) the coefficient of linear thermal expansion on the X-Y plane at 200° C. (CTE200) is 100 ppm/° C. or smaller; and
   (5) the absolute value of the difference between the coefficient of linear thermal expansion on the X-Y plane at 150° C. (CTE150) and the coefficient of linear thermal expansion on the X-Y plane at 200° C. (CTE200) is 40 or smaller;
   wherein the resin is selected from the group consisting of phenoxy resin, cresol-novolac type epoxy resin, triazine-containing phenol-novolac type epoxy resin, biphenylaralkyl type epoxy resin, bisphenol A type epoxy resin, brominated bisphenol A type epoxy resin and naphthalene type tetrafunctional epoxy resin.

2. The resin composite film according to claim 1, wherein in image analysis of the modulus mapping, the fibers constituting the cellulose microfiber sheet occupy an area ratio of 5% to 60% of the entire cross-section of the resin composite film.

3. The resin composite film according to claim 1, wherein the resin composite film includes an inorganic filler, and in image analysis of the modulus mapping, the inorganic filler occupies an area ratio of 5% to 50% of the entire cross-section of the resin composite film.

4. The resin composite film according to claim 3, wherein in image analysis of the modulus mapping, no more than 20% of the inorganic filler is included in the cellulose microfiber layer.

5. The resin composite film according to claim 1, wherein the cellulose microfiber sheet includes microfibers composed of an organic polymer other than cellulose, and the microfibers composed of an organic polymer other than cellulose are aramid microfibers and/or polyacrylonitrile microfibers.

6. The resin composite film according to claim 1, which has a thickness of 5 μm to 1500 μm.

7. A resin laminate film, wherein the resin composite film according to claim 1 is laminated on a substrate.

8. A resin composite film comprising cellulose microfibers in a matrix resin, wherein the resin composite film satisfies the following conditions:
   (1) in modulus mapping obtained by atomic force microscope (AFM) measurement of a cross-section of the resin composite film in the thickness direction, the cellulose microfibers have an average fiber diameter of 0.01 μm to 2.0 μm and a maximum fiber diameter of 15 μm or smaller, as calculated from image analysis;
   (2) the resin composite film either has a glass transition temperature (Tg) of 80° C. or higher, or has none;
   (3) the storage elastic modulus of the resin composite film at 200° C. (E'200) is 0.5 GPa or greater;
   (4) the ratio (E'150/E'200) of the storage elastic modulus of the resin composite film at 150° C. (E'150) with respect to the storage elastic modulus at 200° C. (E'200) is 1 to 4.5;
   (5) the coefficient of linear thermal expansion on the X-Y plane at 200° C. (CTE200) is 100 ppm/° C. or smaller; and
   (6) the absolute value of the difference between the coefficient of linear thermal expansion on the X-Y plane at 150° C. (CTE150) and the coefficient of linear thermal expansion on the X-Y plane at 200° C. (CTE200) is 40 or smaller;
   wherein the matrix resin is selected from the group consisting of phenoxy resin, cresol-novolac type epoxy resin, triazine-containing phenol-novolac type epoxy resin, biphenylaralkyl type epoxy resin, bisphenol A type epoxy resin, brominated bisphenol A type epoxy resin and naphthalene type tetrafunctional epoxy resin.

9. The resin composite film according to claim 8, wherein the area ratio of the cellulose microfibers with respect to the entire cross-section of the resin composite film is 5% to 60%, as calculated from image analysis in the modulus mapping.

10. The resin composite film according to claim 8, wherein the average thickness of the overcoat resin layer of the resin composite film on at least one side of the resin composite film is 0.3 μm to 30 μm, as calculated by the modulus mapping.

11. The resin composite film according to claim 10, wherein the resin composite film includes an inorganic filler, and in scanning electron microscope (SEM) observation of a cross-section of the resin composite film in the thickness direction, the area ratio of the inorganic filler with respect to the entire cross-section of the resin composite film is 5% to 50%.

12. The resin composite film according to claim 11, wherein in image analysis of the modulus mapping, no more than 20% of the inorganic filler is included in the cellulose microfiber layer.

13. The resin composite film according to claim 8, wherein the resin composite film includes microfibers composed of an organic polymer other than cellulose, and the microfibers composed of an organic polymer are aramid microfibers and/or polyacrylonitrile microfibers.

14. The resin composite film according to claim 8, which has a thickness of 5 μm to 1500 μm.

15. The resin composite film according to claim 8, which has a dielectric constant of 4.5 or lower.

16. A resin laminate film, wherein the resin composite film according to claim 8 is laminated on a substrate.

* * * * *